United States Patent
Tajitsu et al.

(10) Patent No.: US 11,575,082 B2
(45) Date of Patent: Feb. 7, 2023

(54) STRUCTURE FOR USE IN PIEZOELECTRIC ELEMENT, BRAIDED PIEZOELECTRIC ELEMENT, FABRIC-LIKE PIEZOELECTRIC ELEMENT USING BRAIDED PIEZOELECTRIC ELEMENT, AND DEVICE USING THESE

(71) Applicants: TEIJIN LIMITED, Osaka (JP); KANSAI UNIVERSITY, Suita (JP)

(72) Inventors: Yoshiro Tajitsu, Suita (JP); Shunsuke Kanematsu, Osaka (JP); Yuhei Ono, Osaka (JP)

(73) Assignees: TEIJIN LIMITED, Osaka (JP); KANSAI UNIVERSITY, Suita (JP)

( * ) Notice: Subject to any disclaimer, the term of this patent is extended or adjusted under 35 U.S.C. 154(b) by 881 days.

(21) Appl. No.: 16/345,402

(22) PCT Filed: Oct. 27, 2017

(86) PCT No.: PCT/JP2017/038988
§ 371 (c)(1),
(2) Date: Apr. 26, 2019

(87) PCT Pub. No.: WO2018/079741
PCT Pub. Date: May 3, 2018

(65) Prior Publication Data
US 2019/0273199 A1 Sep. 5, 2019

(30) Foreign Application Priority Data

Oct. 28, 2016 (JP) .............................. JP2016-212243
Oct. 28, 2016 (JP) .............................. JP2016-212247
Oct. 28, 2016 (JP) .............................. JP2016-212258

(51) Int. Cl.
*D04B 1/16* (2006.01)
*H01L 41/08* (2006.01)
(Continued)

(52) U.S. Cl.
CPC .............. *H01L 41/193* (2013.01); *D04B 1/16* (2013.01); *D04B 1/22* (2013.01); *D04B 21/16* (2013.01);
(Continued)

(58) Field of Classification Search
CPC ... H01L 41/193; H01L 41/082; H01L 41/087; H01L 41/1132; H01L 41/113;
(Continued)

(56) References Cited

U.S. PATENT DOCUMENTS 10,347,815 B1 * 7/2019 Sleator .................. B25J 13/084
10,950,779 B2 * 3/2021 Tajitsu ..................... G01L 1/16
(Continued)

FOREIGN PATENT DOCUMENTS

EP  0 562 681 A2  9/1993
JP  2000-144545 A  5/2000
(Continued)

OTHER PUBLICATIONS

S. Ito et al., "Sensing Using Piezoelectric Chiral Polymer Fiber", Japanese Journal of Applied Physics, vol. 51. No. 9, pp. 09LD16-1 to 09LD16-5, 2012, 7 pages total.
(Continued)

*Primary Examiner* — David Vu
*Assistant Examiner* — Brandon C Fox
(74) *Attorney, Agent, or Firm* — Sughrue Mion, PLLC

(57) ABSTRACT

A structure includes an oriented piezoelectric polymer arranged in a circular tubular or circular columnar shape, wherein the orientation angle of the piezoelectric polymer with respect to the central axis of the structure is 15° to 75°, the piezoelectric polymer includes a crystalline polymer having an absolute value of 0.1 to 1000 pC/N for the piezoelectric constant d14 when the orientation axis is the third axis, and the piezoelectric polymer includes a P-body containing a crystalline polymer with a positive piezoelectric constant d14 value and an N-body containing a crystalline polymer with a negative value, wherein for the portion of the central axis of the structure having a length of 1 cm, the value of T1/T2 is 0 to 0.8, T1 being the smaller and T2

(Continued)

being the larger of (ZP+SN) and (SP+ZN), where ZP, SP, ZN, and SN are particularly defined masses.

31 Claims, 22 Drawing Sheets

(51) Int. Cl.

| | | |
|---|---|---|
| *H01L 41/193* | (2006.01) | |
| *D04B 1/22* | (2006.01) | |
| *D04B 21/16* | (2006.01) | |
| *D04B 21/20* | (2006.01) | |
| *D04C 1/02* | (2006.01) | |
| *D04C 1/12* | (2006.01) | |
| *G01B 7/16* | (2006.01) | |
| *H01L 41/04* | (2006.01) | |
| *H01L 41/053* | (2006.01) | |
| *H01L 41/113* | (2006.01) | |
| *H01L 41/087* | (2006.01) | |

(52) U.S. Cl.
CPC ............. *D04B 21/20* (2013.01); *D04C 1/02* (2013.01); *D04C 1/12* (2013.01); *G01B 7/16* (2013.01); *H01L 41/042* (2013.01); *H01L 41/0533* (2013.01); *H01L 41/082* (2013.01); *H01L 41/087* (2013.01); *H01L 41/1132* (2013.01); *D10B 2401/18* (2013.01); *H01L 41/113* (2013.01)

(58) Field of Classification Search
CPC . D04B 1/16; D04B 1/22; D04B 21/16; D10B 2401/18; D03D 15/283; D03D 15/292; D03D 15/41; D03D 15/47
See application file for complete search history.

(56) References Cited

U.S. PATENT DOCUMENTS

| | | | |
|---|---|---|---|
| 2009/0021117 A1 | 1/2009 | Ueda et al. | |
| 2012/0025674 A1 | 2/2012 | Yoshida et al. | |
| 2013/0057499 A1 | 3/2013 | Ando et al. | |
| 2014/0049137 A1 | 2/2014 | Ando et al. | |
| 2015/0274176 A1* | 10/2015 | Mino | B60K 37/06 |
| | | | 701/36 |
| 2015/0280102 A1 | 10/2015 | Tajitsu et al. | |
| 2017/0153105 A1 | 6/2017 | Chang et al. | |
| 2019/0038787 A1* | 2/2019 | Ando | D02G 3/449 |

FOREIGN PATENT DOCUMENTS

| | | |
|---|---|---|
| JP | 2002-102186 A | 4/2002 |
| JP | 2002203996 A | 7/2002 |
| JP | 2011-253517 A | 12/2011 |
| JP | 2013188278 A | 9/2013 |
| JP | 2014-240842 A | 12/2014 |
| JP | 2017-120885 A | 7/2017 |
| WO | 00/67539 A1 | 11/2000 |
| WO | 02/103294 A1 | 12/2002 |
| WO | 2010/104196 A1 | 9/2010 |
| WO | 2014/058077 A1 | 4/2014 |
| WO | 2016/060427 A1 | 4/2016 |

OTHER PUBLICATIONS

International Search Report dated Jan. 23, 2018 issued by the International Searching Authority in PCT/JP2017/038988 (translation).

Written Opinion dated Jan. 23, 2018 issued by the International Searching Authority in PCT/JP2017/038988 (translation).

\* cited by examiner

MINIMUM CIRCLE OUTSIDE OF PSA AND NOT OVERLAPPING WITH PSA

MAXIMUM CIRCLE NOT FALLING OUTSIDE OF PSA (POSSIBLY FALLING WITHIN CA)

MINIMUM CIRCLE OUTSIDE OF CA AND NOT OVERLAPPING WITH CA

MAXIMUM CIRCLE NOT FALLING OUTSIDE OF CA

STRUCTURE FOR USE IN PIEZOELECTRIC ELEMENT, BRAIDED PIEZOELECTRIC ELEMENT, FABRIC-LIKE PIEZOELECTRIC ELEMENT USING BRAIDED PIEZOELECTRIC ELEMENT, AND DEVICE USING THESE

CROSS REFERENCE TO RELATED APPLICATIONS

This application is a National Stage of International Application No. PCT/JP2017/038988, filed on Oct. 27, 2017, which claims priority from Japanese Patent Application No. 2016-212243, filed on Oct. 28, 2016, Japanese Patent Application No. 2016-212247, filed on Oct. 28, 2016, and Japanese Patent Application No. 2016-212258, filed on Oct. 28, 2016.

FIELD

The present invention relates to a structure used for a piezoelectric element, to a braided piezoelectric element comprising a braid using piezoelectric fibers and a conductive layer for covering the braid, to a fabric-like piezoelectric element using the braided piezoelectric element, and to a device using the foregoing.

BACKGROUND

Several techniques have been developed in the prior art for elements using piezoelectric substances. PTL 1, for example, discloses an element comprising conductive fibers covered with a piezoelectric polymer, which exhibits an excellent electrical response to rubbing. NPL 1 discloses an element comprising a piezoelectric polymer wound into a coil, as an example of producing an electrical response to stretching in the axial direction of the coil and twisting deformation around the axis of the coil. Also, PTL 2 discloses a fiber-like substance comprising a piezoelectric polymer, and describes that the fiber-like substance produces a large piezoelectric effect when force (movement) acts either parallel or perpendicular to the fiber axis.

The piezoelectric sheet of PTL 3 can output an electrical signal by stretching deformation (stress) of the piezoelectric sheet. However, because it is still in a sheet form, it has poor flexibility and cannot be used to allow free bending in the manner of fibers or a fabric.

In all of these prior art documents, even though a piezoelectric signal is efficiently generated in response to stretching movement, nothing is disclosed regarding a specific construction for avoiding generation of a piezoelectric signal in response to movement other than stretching movement. Moreover, nothing is disclosed in regard to a specific construction for generating electrical charges of mutually opposite polarity (i.e. reverse sign charges) on the central axis and outside of the structure, in order to increase the utilization efficiency of the piezoelectric signal. Their performance as piezoelectric elements for use as sensors or adsorbents has therefore been inadequate.

In recent years there has been increasing interest in "wearable sensors", which have made their debut as products in the form of eyeglasses or wristwatches. However, such devices produce the sensation of being worn, and are more desirably in the form of fabrics, i.e., clothing, which are the ultimate wearable form. Piezoelectric elements that utilize the piezoelectric effect of piezoelectric fibers are known as such types of sensors. For example, PTL 1 discloses a piezoelectric element comprising two conductive fibers and one piezoelectric fiber, with points of contact between them, while including a piezoelectric unit disposed on essentially the same plane. Also, PTL 2 discloses a piezoelectric material which is a fiber substance or molded article made of a piezoelectric polymer wherein, in order to generate piezoelectricity by tensile force applied in the axial direction, the construction includes added twists in a direction different from the direction of the tensile force that is to be applied.

Recent years have also seen a drastic increase in input devices employing touch panel systems, i.e., "touch input devices". With the development of thin display technology for bank ATMs and station ticket-vending machines, as well as smartphones, cellular phones, portable gaming devices, portable music players and the like, there has been a massive increase in devices employing touch panel systems as the input interface. Known means for realizing such touch panel systems include systems using piezoelectric sheets or piezoelectric fibers. For example, PTL 4 discloses a touch panel employing a piezoelectric sheet made of L-polylactic acid having a stretching axis oriented in a prescribed direction.

In such wearable sensors or touch panel system sensors, it is desirable to extract a high electrical signal even by small amounts of stress produced in the piezoelectric material by small deformation applied to the piezoelectric material. For example, it is desirable to stably extract a high electrical signal even by a relatively small amount of stress produced in the piezoelectric material by the movement of stretching out the finger, or the action of rubbing the surface with the finger, etc.

The piezoelectric fiber of PTL 1 is an excellent material that can be applied for various purposes, but it cannot always output a high electrical signal in response to stress produced by relatively small amounts of deformation, nor does this publication disclose technology for obtaining a high electrical signal. In addition, since the piezoelectric element described in PTL 1 has the conductive fibers of the signal wire exposed, it is susceptible to noise effects and tends to suffer material degradation or damage under external stress. Furthermore, no construction is disclosed for allowing the piezoelectric element to be conveniently incorporated into a base material such as another fabric, and therefore the piezoelectric element described in PTL 1 still has room for improvement in terms of practical application.

The piezoelectric fibers described in PTL 2 can output an electrical signal in response to tension or compression on the piezoelectric fibers, by having the piezoelectric fibers pre-twisted via special production methods. However, PTL 2 does not disclose any technology for producing an adequate electrical signal in response to bending or stretching of the piezoelectric fibers, or shearing stress due to rubbing of the surfaces of the piezoelectric fibers. Therefore, when such piezoelectric fibers are used, it is difficult to extract a sufficient electrical signal simply by stress produced by relatively small amounts of deformation such as rubbing of the surface.

The piezoelectric sheet of PTL 4 can output an electrical signal by deformation (stress) of the piezoelectric sheet. However, because it is still in a sheet form, it has poor flexibility and cannot be used to allow free bending in the manner of a fabric.

CITATION LIST

Patent Literature

[PTL 1] WO 2014/058077
[PTL 2] JP 2000-144545

[PTL 3] JP 2014-240842
[PTL 4] JP 2011-253517

Non Patent Literature

[NPL 1] Japanese Journal of Applied Physics Vol. 51, p. 09LD16

SUMMARY

Technical Problem

The present invention has been accomplished in light of the background described above, and it is a first object thereof to provide a circular tubular or circular columnar piezoelectric structure that can selectively respond to stretching deformation (stress) and efficiently produce utilizable electric polarization.

It is a second object of the invention to provide a fiber-like piezoelectric element that is capable of extracting a large electrical signal even by stress produced by relatively small deformation, that is capable of controlling noise signals, and that is resistant to external damage.

Moreover, it is a third object of the invention to provide a fabric-like piezoelectric element that employs a fiber-like piezoelectric element capable of extracting a large electrical signal even by stress produced by relatively small deformation and capable of controlling noise signals, and that can be conveniently incorporated into a base material such as another fabric.

Solution to Problem

As a result of ardent research with the aim of achieving the first object, the present inventors have devised this invention upon finding that by aligning an oriented piezoelectric polymer having a high piezoelectric constant d14, in a specific orientation to form a circular tubular or circular columnar structure, it is possible to efficiently generate electrical charges of opposite polarity on the central axis side and on the outside of a circular tubular or circular columnar shape in response to stretching deformation.

As a result of ardent research with the aim of achieving the second object, the present inventors have further devised the invention upon finding that an electrical signal can be efficiently extracted and noise signals can be suppressed, by a braided piezoelectric element as a combination of a conductive fiber and piezoelectric fibers, wherein the surface of the conductive fiber serving as the core is covered with the braided piezoelectric fibers, and a conductive layer is also provided around the periphery, and that the element is made resistant to external damage by specifying the range for the relationship between the thicknesses of the core and the piezoelectric fibers.

Moreover, as a result of ardent research with the aim of achieving the third object, the present inventors have still further devised the invention upon finding that an electrical signal can be efficiently extracted and noise signals can be suppressed, by a braided piezoelectric element as a combination of a conductive fiber and piezoelectric fibers, wherein the surface of the conductive fiber serving as the core is covered with the braided piezoelectric fibers, and a conductive layer is also provided around the periphery, and that by anchoring it to a fabric in a specific form, the element is made resistant to external damage and can be conveniently incorporated into a base material such as another fabric.

In other words, the invention provides the following (1) to (12) as means for achieving the first object (the first invention), the following (13) to (20) as means for achieving the second object (the second invention), and the following (21) to (31) as means for achieving the third object (third invention).

(1) A structure comprising an oriented piezoelectric polymer arranged in a circular tubular or circular columnar shape, wherein the orientation angle of the piezoelectric polymer with respect to the direction of the central axis of the circular tubular or circular columnar shape in which the piezoelectric polymer is arranged is between 15° and 75°, the piezoelectric polymer includes as the main component a crystalline polymer having an absolute value of between 0.1 pC/N and 1000 pC/N for the piezoelectric constant d14, when the orientation axis is the third axis, and the piezoelectric polymer includes a P-body containing a crystalline polymer with a positive piezoelectric constant d14 value as the main component and an N-body containing a crystalline polymer with a negative value as the main component, wherein for the portion of the central axis of the structure having a length of 1 cm, the value of T1/T2 is between 0 and 0.8, T1 being the smaller and T2 being the larger of (ZP+SN) and (SP+ZN), where ZP is the mass of the P-body having the orientation axis wrapped in a helical fashion around the Z-twisting direction, SP is the mass of the P-body having the orientation axis wrapped in a helical fashion around the S-twisting direction, ZN is the mass of the N-body having the orientation axis wrapped in a helical fashion around the Z-twisting direction, and SN is the mass of the N-body having the orientation axis wrapped in a helical fashion around the S-twisting direction.

(2) The structure according to (1), wherein the piezoelectric polymer includes poly-L-lactic acid or poly-D-lactic acid as the main component.

(3) The structure according to (2), wherein the piezoelectric polymer includes a P-body including poly-D-lactic acid as the main component, and an N-body including poly-L-lactic acid as the main component.

(4) The structure according to any one of (1) to (3), wherein when stretching deformation is applied in the direction of the central axis of the circular tubular or circular columnar shape in which the piezoelectric polymer is arranged, electrical charges of opposite polarity are generated on the central axis side and the outside of the circular tubular or circular columnar shape.

(5) The structure according to any one of (1) to (4), wherein the piezoelectric polymer comprises a fiber-like, filament-like or tape-like form composed in a braided, twisted-string, covering-thread or aligned thread-like manner.

(6) The structure according to any one of (1) to (4), wherein the piezoelectric polymer is composed only of a single closed region in the cross-section perpendicular to the central axis of the circular tubular or circular columnar shape.

(7) An element comprising a structure according to any one of (1) to (6), and a conductor disposed adjacent to the structure.

(8) The element according to (7), wherein the piezoelectric polymer is arranged in a circular tubular shape, and the conductor is disposed at a location on the central axis of the circular tubular shape.

(9) The element according to (8), wherein the conductor is made of conductive fiber, and the piezoelectric polymer is arranged in a manner braided around the conductive fiber, as piezoelectric fibers.

(10) The element according to (7), wherein the conductor is disposed on the outside of the circular tubular or circular columnar shape in which the piezoelectric polymer is arranged.

(11) The element according to (10), wherein the conductor is made of conductive fiber, and the conductive fiber is arranged in a manner braided around the circular tubular or circular columnar shape in which the piezoelectric polymer is arranged.

(12) A sensor comprising:
an element according to any one of (7) to (11),
an output terminal through which an electrical signal generated by the conductor is outputted corresponding to the electrical charge generated when stretching deformation is applied in the direction of the central axis of the circular tubular or circular columnar shape in which the piezoelectric polymer is arranged, and
an electrical circuit that detects the electrical signal outputted through the output terminal.

(13) A braided piezoelectric element comprising:
an element according to (9) provided with a core formed of a conductive fiber and a sheath formed of braided piezoelectric fibers covering the core, and
a conductive layer provided around the periphery of the sheath,
wherein the ratio d/Rc of the thickness d of the layer composed of the piezoelectric fibers with respect to the radius Rc of the core is 1.0 or greater.

(14) The braided piezoelectric element according to (13), wherein the coverage factor of the sheath by the conductive layer is 25% or greater.

(15) The braided piezoelectric element according to (13) or (14), wherein the conductive layer is formed of fibers.

(16) A fabric-like piezoelectric element including a braided piezoelectric element according to any one of (13) to (15).

(17) The fabric-like piezoelectric element according to (16), wherein the fabric further includes conductive fibers that cross and contact with at least part of the braided piezoelectric element.

(18) The fabric-like piezoelectric element according to (17), wherein among the fibers forming the fabric and crossing the braided piezoelectric element, at least 30% are conductive fibers.

(19) A device comprising:
a braided piezoelectric element according to any one of (13) to (15),
amplification means that amplifies an electrical signal outputted from the braided piezoelectric element in response to applied pressure, and
output means that outputs the electrical signal amplified by the amplification means.

(20) A device comprising:
a fabric-like piezoelectric element according to (17) or (18),
amplification means that amplifies an electrical signal outputted from the fabric-like piezoelectric element in response to applied pressure, and
output means that outputs the electrical signal amplified by the amplification means.

(21) A fabric-like piezoelectric element comprising a fabric and a braided piezoelectric element anchored to the fabric, wherein the braided piezoelectric element comprises:
an element according to (9) provided with a core formed of a conductive fiber and a sheath formed of braided piezoelectric fibers covering the core, and
a conductive layer provided around the periphery of the sheath,
wherein the pull-out strength per 5 cm of the braided piezoelectric element with respect to the fabric is 0.1 N or greater.

(22) The fabric-like piezoelectric element according to (21), wherein the coverage factor of the braided piezoelectric element by the fibers composing the fabric is greater than 30% on both sides of the fabric.

(23) The fabric-like piezoelectric element according to (21) or (22), wherein the braided piezoelectric element is anchored to the fabric in a woven state or a knitted state.

(24) The fabric-like piezoelectric element according to (21) or (22), wherein the braided piezoelectric element is inserted between the layers of a double-woven fabric or double-knitted fabric.

(25) The fabric-like piezoelectric element according to any one of (21) to (24), wherein the braided piezoelectric element is partially exposed through the fabric, and the conductive fibers and/or conductive layer of the braided piezoelectric element are electrically connected with another member at the exposed sections.

(26) The fabric-like piezoelectric element according to any one of (21) to (25), wherein the coverage factor of the sheath by the conductive layer is 25% or greater.

(27) The fabric-like piezoelectric element according to any one of (21) to (26), wherein the conductive layer is formed of fibers.

(28) The fabric-like piezoelectric element according to any one of (21) to (27), wherein the total fineness of the piezoelectric fibers is at least 1 and no greater than 20 times the total fineness of the conductive fibers.

(29) The fabric-like piezoelectric element according to any one of (21) to (28), wherein the fineness per piezoelectric fiber is at least $1/20$ and no greater than 2 times the total fineness of the conductive fibers.

(30) The fabric-like piezoelectric element according to any one of (21) to (29), wherein the fabric further includes conductive fibers that cross and contact with at least part of the braided piezoelectric element.

(31) A device comprising:
a fabric-like piezoelectric element according to any one of (21) to (30), and
an electrical circuit that detects the electrical signal outputted from the conductive fibers in the fabric-like piezoelectric element in response to applied pressure.

Advantageous Effects of Invention

According to the first invention, it is possible to provide a circular tubular or circular columnar piezoelectric structure that can selectively respond to stretching deformation (stress) and efficiently produce utilizable electric polarization.

According to the second invention, it is possible to provide a fiber-like piezoelectric element that is capable of extracting a large electrical signal even by stress produced by relatively small deformation, and is able to suppress noise signals.

According to the third invention, it is possible to provide a fabric-like piezoelectric element that employs a fiber-like piezoelectric element that is capable of extracting a large electrical signal even by stress produced by relatively small deformation and is capable of controlling noise signals, and that can be conveniently incorporated into a base material such as another fabric. Also, according to the third invention, when the coverage factor of the braided piezoelectric element by the fibers composing the fabric is a prescribed value such as greater than 50% on both sides of the fabric, it can be rendered less susceptible to damage by external rubbing or by heat or light.

BRIEF DESCRIPTION OF DRAWINGS

FIGS. 11-1 and 11-2 are photomicrographs of a cross-section of a braided piezoelectric element according to an embodiment of the second invention.

DESCRIPTION OF EMBODIMENTS

The first invention will now be explained in detail.
(Circular Tubular or Circular Columnar Piezoelectric Structure)

Figure 1A:
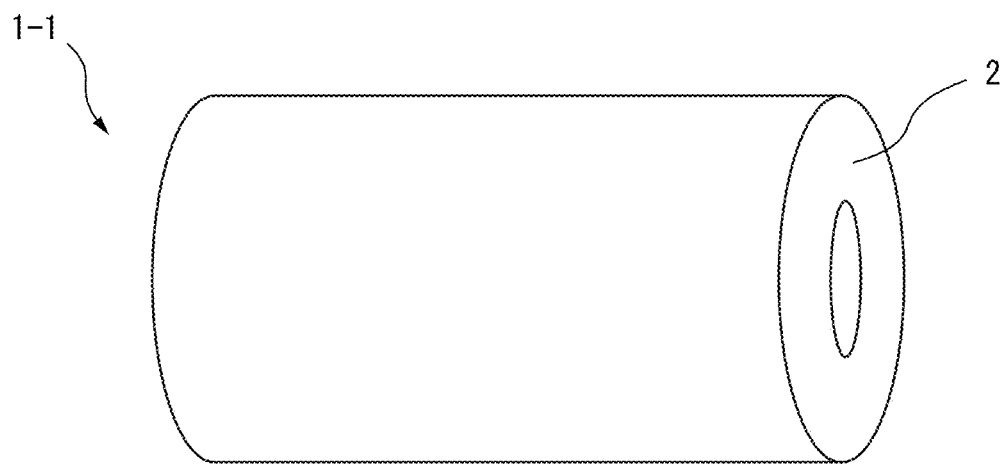
FIG. 1A is a schematic diagram showing a circular tubular piezoelectric structure according to an embodiment of the first invention.
Figure 1B:
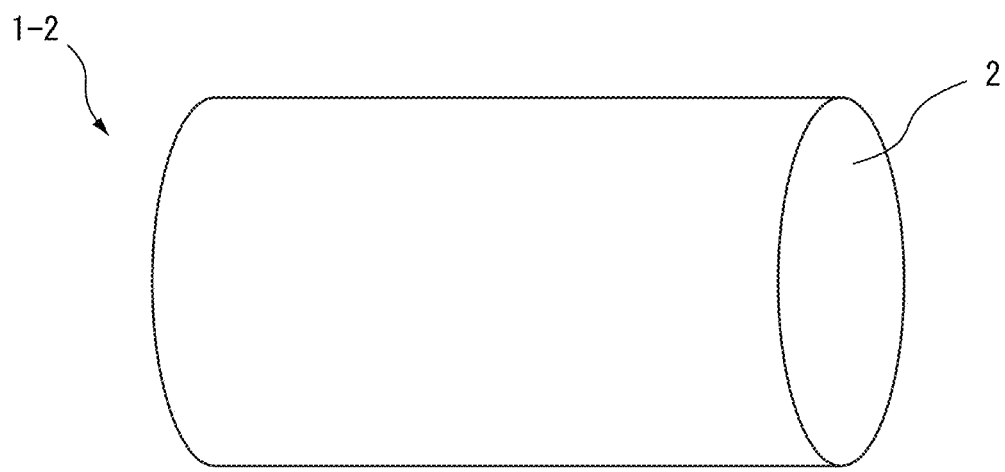
FIG. 1B is a schematic diagram showing a circular columnar piezoelectric structure according to an embodiment of the first invention.

The structure (piezoelectric structure) of the invention includes an oriented piezoelectric polymer, the oriented piezoelectric polymer being arranged in a circular tubular or circular columnar shape. FIG. 1A is a schematic diagram showing a circular tubular piezoelectric structure 1-1 according to an embodiment, and FIG. 1B is a schematic diagram showing a circular columnar piezoelectric structure 1-2 according to an embodiment. The shapes of the outer edge and inner edge of the bottom face of the circular cylindrical or circular columnar shape in which the piezoelectric polymer is arranged is most preferably perfectly circular, but it may instead be elliptical or flattened circular.
(Piezoelectric Polymer)

The piezoelectric polymer in the piezoelectric structure of the invention is a molded article of a uniaxially oriented polymer, and it includes, as a main component, a crystalline polymer having an absolute value of between 0.1 pC/N and 1000 pC/N for the piezoelectric constant d14, when the orientation axis is the third axis. According to the invention, "includes as the main component" means that the constituent component constitutes 50 mass % or greater. For the purpose of the invention, a crystalline polymer is a polymer comprising a crystalline portion at 1 mass % or greater, and also comprising an amorphous portion in addition to the crystalline portion, where the mass of the crystalline polymer is its total mass including the crystalline portion and the amorphous portion.

Examples of crystalline polymers having absolute values of between 0.1 pC/N and 1000 pC/N for the piezoelectric constant d14 when the orientation axis is the third axis, which may be suitably used as crystalline polymers in the piezoelectric polymer of this embodiment, include cellulose, collagen, keratin, fibrin, poly-L-alanine, poly-γ-methyl-L-glutamate, poly-γ-benzyl-L-glutamate and poly-L-lactic acid, as listed in "Piezoelectricity of biopolymers" (Fukuda, E., Biorheology, Vol. 3, No. 6, pp. 593). The signs of d14 are expected to be reversed for poly-D-alanine, poly-γ-methyl-D-glutamate, poly-γ-benzyl-D-glutamate and poly-D-lactic acid, which are optical isomers of these polymers, but the values are the same in terms of the absolute value of d14. Although different values are obtained for d14 depending on the molding conditions, purity and measuring atmosphere, for the purpose of achieving the object of the present invention, it is sufficient if, based on measurement of the degree of crystallinity and crystal orientation of the crystalline polymer measured for the piezoelectric polymer that is actually used, the absolute value of d14 for the film is between 0.1 pC/N and 1000 pC/N at the temperature of actual use, when a uniaxially stretched film having the same degree of crystallinity and crystal orientation is fabricated using the crystalline polymer, and the crystalline polymer in the piezoelectric polymer of this embodiment is not limited to the specific crystalline polymers mentioned above. Measurement of d14 for a film sample may be made by known various methods, and for example, a sample having metal vapor deposited electrodes on both sides of the film sample may be cut out into a 4-sided rectangular shape in a direction inclined 45° from the stretching direction, and the electrical charge generated at the electrodes on both sides may be measured under a tensile load in the longitudinal direction, to measure the d14 value.

It is most preferred to use poly-L-lactic acid and poly-D-lactic acid for this embodiment. Poly-L-lactic acid and poly-D-lactic acid can be easily oriented and crystallized by uniaxial stretching after melting and film formation, for example, and they exhibit piezoelectricity with an absolute value of >10 pC/N for d14. On the other hand, while polarized polyvinylidene fluoride molded products, as typical piezoelectric polymers, have a high d33 piezoelectric constant, they also have a very low absolute value for d14 and therefore cannot be used as crystalline polymers for the invention.

Since poly-L-lactic acid and poly-D-lactic acid have opposite polarization in response to the same stress, when used for the invention they adopt specific arrangements as described below, thus allowing molding into more desirable structures.

The piezoelectric polymer may also be used as an alloy with another polymer that does not exhibit piezoelectricity, in which case if polylactic acid is to be used as the main piezoelectric polymer, the amount of the polylactic acid is preferably at least 60 mass % or greater, more preferably 70 mass % or greater and most preferably 90 mass % or greater, based on the total weight of the alloy.

In the case of an alloy, suitable examples of polymers other than polylactic acid include polybutylene terephthalate, polyethylene terephthalate, polyethylene naphthalate copolymer and polymethacrylate, etc., with no limitation to these.

(Orientation Angle of Piezoelectric Polymer)

In the structure of the invention having a piezoelectric polymer arranged in a circular cylindrical or circular columnar shape, the orientation angle θ of the piezoelectric polymer with respect to the direction of the central axis of the circular cylindrical or circular columnar shape in which the piezoelectric polymer is arranged (hereunder referred to simply as "central axis") is between 15° and 75°. When this condition is satisfied, application of stretching deformation (tensile stress and compression stress) in the central axis direction with respect to the piezoelectric structure will allow efficient utilization of the piezoelectric effect corresponding to the piezoelectric constant d14 of the crystalline polymer in the piezoelectric polymer, and will allow electrical charges of opposite polarity to be efficiently generated on the central axis side and the outside of the piezoelectric structure. From this viewpoint, the orientation angle θ of the piezoelectric polymer with respect to the direction of the central axis is preferably between 25° and 65°, more preferably between 35° and 55° and even more preferably between 40° and 50°. Such an arrangement of the piezoelectric polymer will cause the orientation direction of the piezoelectric polymer to manifest as a helix.

Such an arrangement of the piezoelectric polymer will also result in a piezoelectric structure that avoids generating large electrical charge on the central axis side and the outside of the piezoelectric structure in response to shear deformation which rubs against the surface of the piezoelectric structure, or to bending deformation which bends the central axis, or to twisting deformation around the central axis, or in other words, a structure that selectively generates a large electrical charge in response to stretching in the central axis direction.

Figure 2:
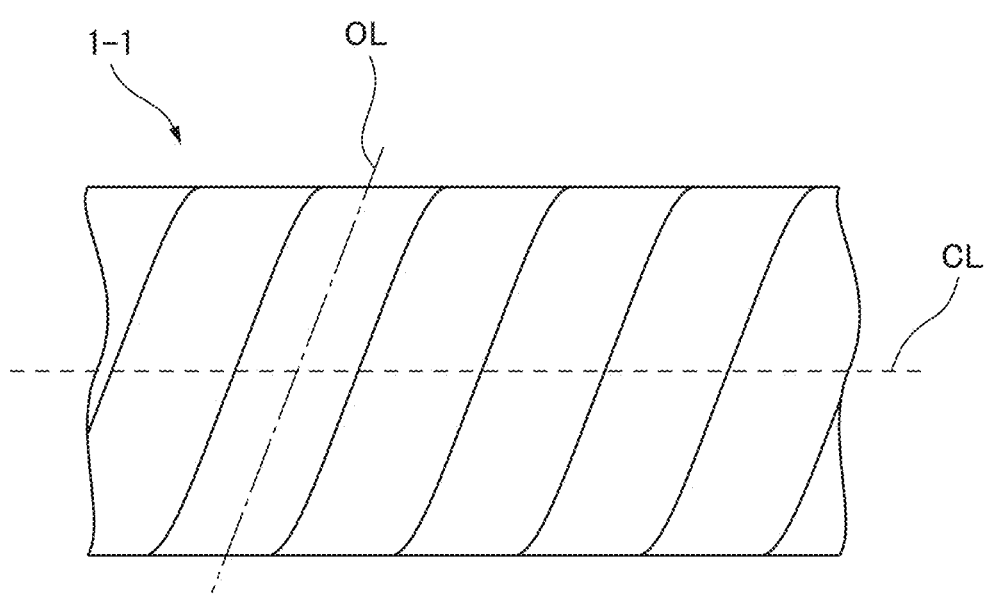
FIG. 2 is a side view of a circular tubular piezoelectric structure according to an embodiment of the first invention.

The orientation angle θ of the piezoelectric polymer with respect to the direction of the central axis is the angle formed between the central axis direction and the direction of orientation of the piezoelectric polymer at the front part that overlaps with the central axis, in a parallel projection of the circular cylindrical or circular columnar shape in which the piezoelectric polymer is arranged, as viewed from the side. FIG. 2, for example, shows the circular tubular piezoelectric structure 1 of this embodiment as seen from the side. The example in FIG. 2 is of a piezoelectric structure wherein oriented piezoelectric polymer tape, having orientation in the longitudinal direction, is wound in a helical form. A straight line showing the orientation direction of the tape at the front part that overlaps with the central axis CL is labeled as OL, and the angle θ formed between CL and OL (which is between 0° and 90°), is the orientation angle of the piezoelectric polymer with respect to the direction of the central axis.

Since a thin piezoelectric polymer such as tape is used in FIG. 2, the direction of orientation of the piezoelectric polymer generally matches the orientation direction of the tape surface as viewed from the side, but when a thicker piezoelectric polymer is used to form a circular tubular piezoelectric structure, or in the case of a circular columnar piezoelectric structure, the orientation direction on the inner side as it approaches the central axis will be closer to the central axis direction than the orientation direction of the surface that can be seen from the side, and therefore a difference will be created between the orientation direction on the surface and the orientation direction on the inner side. Furthermore, since the orientation direction on the tape surface has an S-shape or reverse S-shape, accurate observation requires a high degree of magnification.

Figure 3:
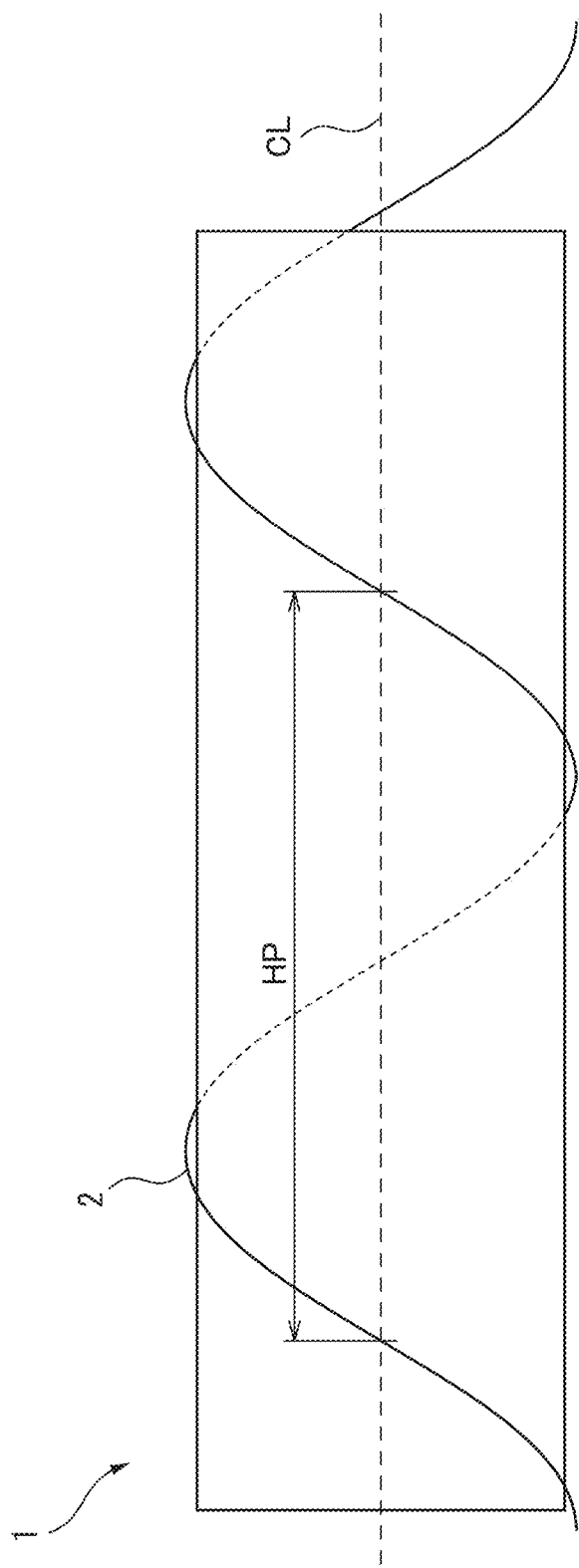
FIG. 3 is a schematic diagram illustrating a method of calculating the orientation angle θ.

From this viewpoint then, in the case of a structure with a longitudinally oriented fiber, filament or tape wound in a helical form (for example, a twisted thread, covering thread or braid), the orientation angle θ of the piezoelectric polymer with respect to the direction of the central axis is measured by the following method whenever possible. A side photograph of the piezoelectric structure is taken, and the helical pitch HP of the piezoelectric polymer 2 is measured. As shown in FIG. 3, the helical pitch HP is the linear distance in the central axis direction that is required for one piezoelectric polymer 2 to extend from the front side around the back side and returning again to the front side. After the structure has been anchored with an adhesive if necessary, a cross-section is cut out perpendicular to the central axis of the piezoelectric structure and photographed, and the outer radius Ro and inner radius Ri are measured at the portion occupied by the piezoelectric structure. When the outer edge and inner edge of the cross-section are elliptical or flattened circular, Ro and Ri are the average values of the long diameter and short diameter, respectively. When the piezoelectric structure is circular columnar, Ri=0. The orientation angle θ of the piezoelectric polymer with respect to the direction of the central axis is calculated by the following formula.

$$\theta = \arctan(2\pi Rm/HP)(0° \leq \theta \leq 90°)$$

Here, $Rm=2(Ro^3-Ri^3)/3(Ro^2-Ri^2)$, i.e., the radius of the piezoelectric structure as a weighted average based on the cross-sectional area.

When the piezoelectric polymer has a uniform surface in a side photograph of the piezoelectric structure, such that the helical pitch of the piezoelectric polymer cannot be distinguished, the piezoelectric structure anchored with the adhesive is cross-cut on a plane running through the central axis, and wide-angle X-ray diffraction analysis is performed with X-ray transmission in the direction perpendicular to the cross-cut surface, in a sufficiently narrow range running through the central axis, determining the orientation direction and measuring its angle with the central axis as θ.

In the case of a piezoelectric structure wherein the helix manifesting along the direction of orientation of the piezoelectric polymer consists of two or more simultaneously present helices with different helical directions (S-twisting direction or Z-twisting direction) or helical pitches, as with a braid or multi-covering, each piezoelectric polymer having a different helical direction and helical pitch is measured, and the piezoelectric polymer with one helical direction and helical pitch must satisfy the aforementioned condition.

However, since the charge polarities (signs) generated at the central axis side and the outside in response to stretching deformation in the central axis direction of the piezoelectric structure will be opposite polarities when the direction of orientation of a given piezoelectric polymer is aligned along an S-twisted helix and when the direction of orientation of the same piezoelectric polymer is aligned along a Z-twisted helix, then if the direction of orientation of the given piezoelectric polymer is aligned along an S-twisted helix while simultaneously being aligned along a Z-twisted helix (for example, if a braid is formed using a given piezoelectric polymer for both S-twisted thread and Z-twisted thread), the charges generated in response to stretching deformation will cancel each other out in the S-twisting direction and Z-twisting direction, which is undesirable as it will prevent efficient utilization. Therefore, as one embodiment of the invention, the piezoelectric polymer includes a P-body containing a crystalline polymer with a positive piezoelectric constant d14 value as the main component and an N-body containing a crystalline polymer with a negative value as the main component, wherein for the portion of the central axis of the piezoelectric structure having a length of 1 cm, the value of T1/T2 is between 0 and 0.8 and preferably 0 to 0.5, T1 being the smaller and T2 being the larger of (ZP+SN) and (SP+ZN), where ZP is the mass of the P-body having the orientation axis wrapped in a helical fashion around the Z-twisting direction, SP is the mass of the P-body having the orientation axis wrapped in a helical fashion around the S-twisting direction, ZN is the mass of the N-body having the orientation axis wrapped in a helical fashion around the Z-twisting direction, and SN is the mass of the N-body having the orientation axis wrapped in a helical fashion around the S-twisting direction. In particular, the piezoelectric polymer includes a P-body containing poly-D-lactic acid as the main component and an N-body containing a crystalline polymer with poly-L-lactic acid as the main component, wherein for the portion of the central axis of the piezoelectric structure having a length of 1 cm, the value of T1/T2 is between 0 and 0.8 and preferably 0 to 0.5, T1 being the smaller and T2 being the larger of (ZP+SN) and (SP+ZN), where ZP is the mass of the P-body having the orientation axis wrapped in a helical fashion around the Z-twisting direction, SP is the mass of the P-body having the orientation axis wrapped in a helical fashion around the S-twisting direction. ZN is the mass of the N-body having the orientation axis wrapped in a helical fashion around the Z-twisting direction, and SN is the mass of the N-body having the orientation axis wrapped in a helical fashion around the S-twisting direction.

If a piezoelectric polymer including crystalline polymers with mutually different signs for d14, such as poly-L-lactic acid and poly-D-lactic acid, is arranged in a mixed manner along a helix with either S-twisting or Z-twisting, then the charges generated in response to stretching deformation will cancel each other out, which is undesirable as it will prevent effective utilization.

(Construction of Piezoelectric Structure)

In the piezoelectric structure of the invention, as mentioned above, the arrangement is such that the direction of orientation of the piezoelectric polymer manifests as a helix. A particularly preferred mode of a piezoelectric structure with such an arrangement is a twisted thread, covering thread or a braid using a fiber, filament or tape in which the piezoelectric polymer is oriented in the longitudinal direction. When tape is to be used, it may be tape oriented in a direction other than the longitudinal direction of the tape, and wound in a helical form, or molded into a cylinder with the longitudinal direction parallel to the central axis direction. From the viewpoint of improving productivity and the degree of orientation, it is more preferred to use twisted thread, covering thread or a braid using a fiber, filament or tape oriented in the longitudinal direction by stretching, while a braid is most preferred from the viewpoint of structural stability.

The piezoelectric structure of the invention generates electrical charges of opposite polarity on the central axis side and the outside when stretching deformation has been applied in the central axis direction. There are no particular restrictions on the manner of usage, which may utilize substance adsorption/desorption, operation by attraction/repulsion, electromagnetic wave generation, or electrical stimulation of a living body, but a more preferred mode is one in which a conductor is placed on the central axis side and/or outside in order to efficiently extract the electrical charge as a signal or energy. When the conductor is placed on the outside, it is more preferably placed so as to cover the entire circular columnar side surface or circular tubular side surface of the piezoelectric structure, for charge utilization efficiency and to allow its use as a shield, but the conductor may instead be placed only in a partial manner.

From the viewpoint of productivity, bending durability and structural stability, the braided piezoelectric structure described below is most preferred.

(Braided Piezoelectric Element)

Figure 4:
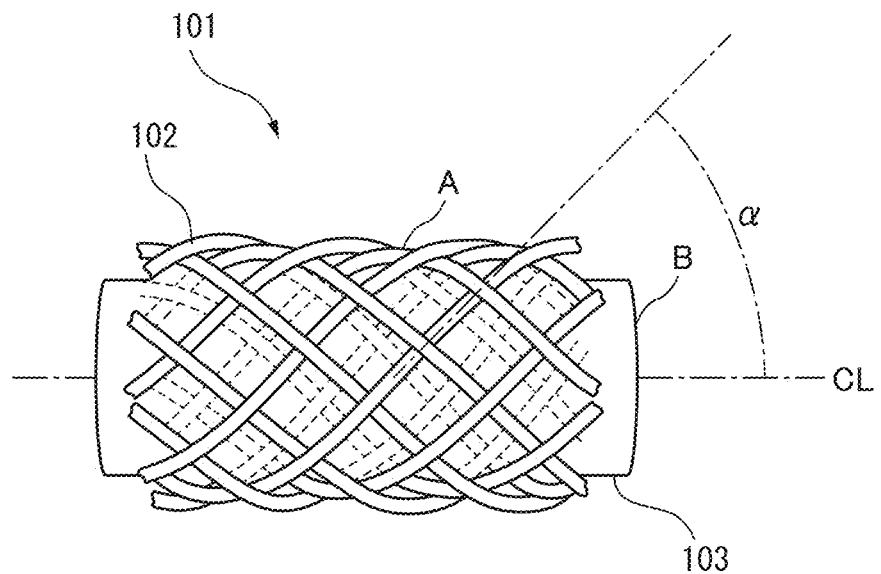
FIG. 4 is a schematic diagram showing an example of the construction of a braided piezoelectric element according to an embodiment of the first invention.

FIG. 4 is a schematic diagram showing an example of the construction of a braided piezoelectric structure according to an embodiment (hereunder referred to as "braided piezoelectric element").

The braided piezoelectric element 101 comprises a core 103 formed of a conductive fiber B and a sheath 102 formed of braided piezoelectric fibers A covering the core 103, the sheath 102 being a circular tubular piezoelectric structure according to the invention. The piezoelectric fibers A may include polylactic acid as the main component.

In the braided piezoelectric element 101, a plurality of piezoelectric fibers A are closely coiled around the outer peripheral surface of at least one conductive fiber B. It is surmised that when deformation is produced in the braided piezoelectric element 101, stress is produced in each of the piezoelectric fibers A by the deformation, producing an electric field in each of the piezoelectric fibers A (piezoelectric effect), and as a result a voltage change takes place in the conductive fiber B, superimposed on the electric field of the plurality of piezoelectric fibers A coiled around the conductive fiber B. That is, the electrical signal from the conductive fiber B is augmented compared to when the braided sheath 102 of piezoelectric fibers A is not used. This allows a large electrical signal to be extracted with the braided piezoelectric element 101, even in response to stress produced by relatively small deformation. Incidentally, the conductive fiber B may also consist of a plurality of fibers.

It is of course important in this case for the signal strength detected via the conductive fiber B as the core, to not change its state of contact with the piezoelectric fibers A as the sheath, but preferably it is even more strongly restrained. For example, the tension may be increased when the piezoelectric fibers are braided with a braiding machine, to obtain a more strongly restrained braid. Polylactic acid (PLA) fibers have low strength and high abrasion, and therefore the fibers may suffer monofilament cutting in the yarn path of the braider, making it impossible to obtain a clean braid. That is, since the fiber undergoes repeated instantaneous stretching or relaxation by the bobbin accumulator when braided during the braiding step, due to the path of movement on the board by the carrier holding the bobbin on which the fiber is wound, PLA fiber is usually difficult to braid at high tension. This difficulty, however, has been found to be improved by subjecting the PLA fiber to twisting. Specifically, it is preferred to add twisting to the PLA fiber at 10 to 5000 T/m. The effect of twisting will not be obtained at less than 10 T/m, while twisting at greater than 5000 T/m can result in trouble during processing due to greater twisting tendency of the fiber. This may also result in an improper angle in the direction of the orientation axis of the PLA with respect to deformation in the axial direction of the braid during braiding, potentially reducing the signal strength. Twisting at 30 T/m or greater is more preferred, and 50 T/m or greater is even more preferred. The upper limit for twisting is preferably 3000 T/m and even more preferably 1500 T/m. The twisting method is not particularly restricted, and any publicly known twisting method may be applied. The twisted fiber is also preferably subjected to heat treatment as heat treatment will fix the twisted state, thus tending to facilitate handling of the fiber. The method of heat treatment is also not particularly restricted, and the treatment may generally be carried out at a temperature of from the Tg to the Tm of the fiber, optionally in a humid environment.

The piezoelectric fibers A preferably include polylactic acid as the main component. The percentage of lactic acid units in the polylactic acid is preferably 90 mol % or greater, more preferably 95 mol % or greater and even more preferably 98 mol % or greater.

As long as the object of the invention is achieved by the braided piezoelectric element 101, combined filaments may be prepared in combination with fibers other than the piezoelectric fibers A for the sheath 102, and combined filaments may be prepared in combination with fibers other than the conductive fiber B for the core 103.

There are no particular restrictions on the length of the braided piezoelectric element composed of the core 103 of the conductive fiber B and the sheath 102 of the braided piezoelectric fibers A. For example, the braided piezoelectric element may be produced in a continuous manner during production, and cut to the necessary length afterwards for use. The length of the braided piezoelectric element is 1 mm to 10 m, preferably 5 mm to 2 m and more preferably 1 cm to 1 m. If the length is too short the convenience of a fiber shape may be lost, and if the length is too long it may become necessary to consider the resistance value of the conductive fiber B.

Each of the structural aspects will now be explained in greater detail.

(Conductive Fiber)

The conductive fiber B used may be any publicly known one that exhibits conductivity. Examples for the conductive fiber B include metal fibers, fibers made of conductive polymers, carbon fibers, fibers made of polymers dispersing fibrous or granular conductive fillers, or fibers forming a layer with conductivity on the surface of a fibrous substance. The method of forming a layer with conductivity on the surface of a fibrous substance may be metal coating, conductive polymer coating or conductive fiber coiling. Metal coating is preferred among these from the viewpoint of conductivity, durability, flexibility and the like. The specific method of coating a metal may be vapor deposition, sputtering, electrolytic plating, electroless plating or the like, with plating being preferred from the viewpoint of productivity. Fibers metal-plated in this manner may be considered to be metal-plated fibers.

The base fiber coated with a metal may be a publicly known fiber, regardless of whether it has or lacks conductivity, examples of which include synthetic fibers such as polyester fiber, nylon fiber, acrylic fiber, polyethylene fiber, polypropylene fiber, vinyl chloride fiber, aramid fiber, polysulfone fiber, polyether fiber and polyurethane fiber, as well as natural fibers such as cotton, hemp and silk, semisynthetic fibers such as acetate, and regenerated fibers such as rayon and cupra. The base fiber is not limited to these, and any publicly known fiber may be used, or combinations of these fibers may be used.

The metal to be coated onto the base fiber may be any type that exhibits conductivity and exhibits the effect of the invention. Examples to be used include gold, silver, platinum, copper, nickel, tin, zinc, palladium, indium tin oxide, copper sulfide and the like, as well as their mixtures and alloys.

When an organic fiber coated with a metal with bending resistance is used as the conductive fiber B, the conductive fiber will be very highly unlikely to break and the durability and safety of a sensor using the piezoelectric element will be excellent.

The conductive fiber B may be a multifilament consisting of a bundle of multiple filaments, or a monofilament consisting of a single filament. A multifilament is preferred from the viewpoint of long-term stability of the electrical characteristics. In the case of a monofilament (including spun yarn), the monofilament diameter is 1 μm to 5000 μm and preferably 2 μm to 100 μm. It is more preferably 3 μm to 50 μm. In the case of a multifilament, the number of filaments is preferably from 1 to 100,000, more preferably 5 to 500 and even more preferably 10 to 100. The fineness and number of conductive fibers B is the fineness and number of cores 103 used to prepare the braid, and a multifilament formed of a plurality of single threads (monofilaments) is counted as one conductive fiber B. The core 103 is the overall amount, including fibers other than conductive fibers when they are used.

If the diameter of the fiber is small the strength will be reduced and handling may become difficult, while if the diameter is large there may be some sacrifice of flexibility. The cross-sectional shape of the conductive fiber B is preferably circular or elliptical from the viewpoint of design and production of the piezoelectric element, but this is not limitative.

A lower electrical resistance is also preferred for efficient extraction of electrical output from the piezoelectric polymer, the volume resistivity being preferably no greater than $10^{-1}$ $\Omega$·cm, more preferably no greater than $10^{-2}$ $\Omega$·cm and even more preferably no greater than $10^{-3}$ $\Omega$·cm. However, the resistivity of the conductive fiber B is not limited to this range so long as sufficient strength can be obtained for detection of the electrical signal.

For use according to the present invention, the conductive fiber B must be resistant to movements such as repeated bending and twisting. As one indicator of such a property, a large knot tenacity is preferred. The knot tenacity can be measured by the method of JIS L1013 8.6. The degree of knot tenacity suitable for the invention is preferably 0.5 cN/dtex or greater, more preferably 1.0 cN/dtex or greater, even more preferably 1.5 cN/dtex or greater and most preferably 2.0 cN/dtex or greater. As another indicator, low flexural rigidity is preferred. Flexural rigidity is generally measured with a measuring apparatus such as a KES-FB2 Pure Bending Tester by Kato Tech Corp. The degree of flexural rigidity suitable for the invention is preferably lower than that of the carbon fibers TENAX® HTS40-3K by Toho Tenax Co., Ltd. Specifically, the flexural rigidity of the conductive fiber is preferably no greater than $0.05 \times 10^{-4}$ N·m$^2$/m, more preferably no greater than $0.02 \times 10^{-4}$ N·m$^2$/m and even more preferably no greater than $0.01 \times 10^{-4}$ N·m$^2$/m.

The optical purity of the polylactic acid is preferably 99% or greater, more preferably 99.3% or greater and even more preferably 99.5% or greater. If the optical purity is less than 99% the piezoelectric modulus may be significantly lowered, potentially making it difficult to obtain a sufficient electrical signal by shape deformation of the piezoelectric fibers A. Most preferably, the piezoelectric fibers A include poly-L-lactic acid or poly-D-lactic acid as the main component, with an optical purity of 99% or greater.

Piezoelectric fibers A composed mainly of polylactic acid are stretched during production, and are uniaxially oriented in the fiber axis direction. Furthermore, preferably the piezoelectric fibers A are not only uniaxially oriented in the fiber axis direction but also include polylactic acid crystals, and more preferably they include uniaxially oriented polylactic acid crystals. This is because polylactic acid exhibits higher piezoelectricity and has a higher absolute value for d14 by having high crystallinity and being uniaxially oriented.

The crystallinity and uniaxial orientation are determined by the homo PLA crystallinity $X_{homo}$ (%) and crystal orientation Ao (%). The piezoelectric fibers A of the invention preferably have a homo PLA crystallinity $X_{homo}$ (%) and crystal orientation Ao (%) satisfying the following inequality (1).

$$X_{homo} \times Ao \times Ao \div 10^6 \geq 0.26 \quad (1)$$

If inequality (1) is not satisfied, the crystallinity and/or uniaxial orientation will be insufficient, the output value of the electrical signal for operation may be reduced and the sensitivity of the signal for operation in a specific direction may be reduced. The value of the left side of inequality (1) is more preferably 0.28 or greater, and even more preferably 0.3 or greater. Each of the values is determined in the following manner.

Homopolylactic Acid Crystallinity $X_{homo}$:

The homopolylactic acid crystallinity $X_{homo}$ is determined from crystal structure analysis by wide-angle X-ray diffraction (WAXD). In wide-angle X-ray diffraction (WAXD), an Ultrax18 X-ray diffraction apparatus by Rigaku Corp. is used in a transmission method, and the X-ray diffraction pattern of a sample is recorded on an imaging plate under the following conditions.

X-ray source: Cu-K$\alpha$ rays (confocal mirror)
Output: 45 kV×60 mA
Slits: 1st: 1 mm$\Phi$, 2nd: 0.8 mm$\Phi$
Camera length: 120 mm
Elapsed time: 10 minutes
Sample: 35 mg of polylactic acid fibers are aligned to form a 3 cm fiber bundle.

The total scattering intensity $I_{total}$ over the declination in the obtained X-ray diffraction pattern is determined, and the sum $\Sigma I_{HMi}$ of the integrated intensity for each diffraction peak attributed to homopolylactic acid crystals, appearing near 2$\theta$=16.5°, 18.50 and 24.3°, is calculated. Based on these values, the homopolylactic acid crystallinity $X_{homo}$ is calculated by the following formula (2).

$$\text{Homopolylactic acid crystallinity } X_{homo}(\%) = \Sigma I_{HMi} / I_{total} \times 100 \quad (2)$$

The value of $\Sigma I_{HMi}$ is calculated by subtracting the background and amorphous diffuse scattering from the total scattering intensity.

(2) Crystal Orientation Ao:

In the X-ray diffraction pattern obtained by the aforementioned wide-angle X-ray diffraction (WAXD), the crystal orientation Ao has an intensity distribution with respect to the declination (°) for the diffraction peaks attributable to homopolylactic acid crystals, appearing near 2$\theta$=16.5° in the radius vector direction, and it is calculated from the sum $\Sigma W_i$ (°) of the half-widths in the obtained distribution profile, using the following formula (3).

$$\text{Crystal orientation } Ao(\%) = (360 - \Sigma W_i) \div 360 \times 100 \quad (3)$$

Incidentally, since polylactic acid is a polyester with relatively rapid hydrolysis, a publicly known hydrolysis preventer such as an isocyanate compound, oxazoline compound, epoxy compound or carbodiimide compound may be added when resistance to moist heat is an issue. Also, if necessary, an antioxidant, plasticizer, photodegradation inhibitor or the like such as a phosphoric acid-based compound may be added to modify the physical properties.

The piezoelectric fibers A may be multifilaments consisting of bundles of multiple filaments, or a monofilament consisting of a single filament. In the case of monofilaments (including spun yarn), the monofilament diameter is 1 μm to 5 mm, preferably 5 μm to 2 mm and even more preferably 10 μm to 1 mm. In the case of multifilaments, the monofilament diameter is 0.1 μm to 5 mm, preferably 2 μm to 100 μm and even more preferably 3 μm to 50 μm. The number of filaments for a multifilament is preferably from 1 to 100,000, more preferably 50 to 50,000 and even more preferably 100 to 20,000. The fineness and number of piezoelectric fibers A is the fineness and number per carrier when preparing the braid, and a multifilament formed of a plurality of single threads (monofilaments) is counted as one piezoelectric fiber A. One carrier includes the overall amount, including fibers other than piezoelectric fibers when they are used.

In order to obtain piezoelectric fibers A from such a piezoelectric polymer, any publicly known method for forming fibers from a polymer may be employed so long as the effect of the invention is exhibited. For example, a method of forming fibers by extrusion molding of the piezoelectric polymer, a method of forming fibers by melt spinning of the piezoelectric polymer, a method of forming fibers by dry or wet spinning of the piezoelectric polymer, a method of forming fibers by electrostatic spinning of the piezoelectric polymer, or a method of forming a film and then finely cutting it, may be employed. The spinning conditions employed may be according to a publicly known process suitable for the piezoelectric polymer used, and for most cases a melt spinning process may be employed, which will facilitate industrial production. After formation of the fibers, the formed fibers may also be stretched. This will form piezoelectric fibers A that are uniaxially stretched and oriented, include crystals, and exhibit high piezoelectricity.

In addition, the piezoelectric fibers A may be treated by dyeing, twisting, doubling, heat treatment or the like, before braiding of the fibers prepared as described above.

In addition, since the piezoelectric fibers A will sometimes become twisted together or broken, or produce fluff, during formation of the braid, their strength and abrasion resistance is preferably high, the strength being preferably 1.5 cN/dtex or greater, more preferably 2.0 cN/dtex or greater, even more preferably 2.5 cN/dtex or greater and most preferably 3.0 cN/dtex or greater. The abrasion resistance can be evaluated by JIS L1095 9.10.2, Method B, with an abrasion pass count of preferably 100 or greater, more preferably 1000 or greater, even more preferably 5000 or greater and most preferably 10,000 or greater. The method of increasing the abrasion resistance is not particularly restricted, and any publicly known method may be used, such as increasing the degree of crystallinity, adding fine particles, or surface processing. Abrasion can also be reduced by coating the fibers with a lubricating agent during processing of the braid.

Also, the difference in the shrinkage factor of the piezoelectric fibers is preferably small compared to the shrinkage factor of the conductive fiber mentioned above. If the difference in shrinkage factors is large, the braid may bend or the fabric may lose flatness in the post-treatment steps after formation of the braid or after formation of the fabric, or when subjected to heat or with passage of time during actual use, often resulting in a weaker piezoelectric signal.

When the shrinkage factor is quantified by the boiling water shrinkage ratio as described below, the boiling water shrinkage ratio of the piezoelectric fibers S(p) and the boiling water shrinkage ratio of the conductive fiber S(c) preferably satisfy the following inequality (4).

$$|S(p)-S(c)|\leq 10 \qquad (4)$$

The left side of inequality (4) is more preferably ≤5 and even more preferably ≤3.

The difference in the shrinkage factor of the piezoelectric fibers is also preferably small compared to the shrinkage factor of the fibers other than the conductive fiber, such as the insulating fibers. If the difference in shrinkage factors is large, the braid may bend or the fabric may lose flatness in the post-treatment steps after formation of the braid or after formation of the fabric, or when subjected to heat or with passage of time during actual use, often resulting in a weaker piezoelectric signal. When the shrinkage factor is quantified by the boiling water shrinkage ratio, the boiling water shrinkage ratio of the piezoelectric fibers S(p) and the boiling water shrinkage ratio of the insulating fibers S(i) preferably satisfy the following inequality (5).

$$|S(p)-S(i)|\leq 10 \qquad (5)$$

The left side of inequality (5) is more preferably ≤5 and even more preferably ≤3. The shrinkage factor of the piezoelectric fibers is also preferably small. For example, when the shrinkage factor is quantified by the boiling water shrinkage ratio, the shrinkage factor of the piezoelectric fibers is preferably no greater than 15%, more preferably no greater than 10%, even more preferably no greater than 5% and most preferably no greater than 3%. The means used to lower the shrinkage factor may be any publicly known method, and for example, the shrinkage factor can be lowered by heat treatment to relax the orientation of the amorphous sections or to increase the degree of crystallinity, without any particular restrictions on the timing of heat treatment which may be after stretching, after twisting, after braiding or after fabric formation. The boiling water shrinkage ratio described above was measured by the following method. A reel with 20 coils was prepared using a sizing reel having a frame circumference of 1.125 m, a 0.022 cN/dtex load was applied, it was suspended from a scale board, and the initial reel length L0 was measured. The reel was then treated for 30 minutes in a boiling water bath at 100° C. and allowed to cool, a load was again applied, it was suspended from the scale board, and the contracted reel length L was measured. The measured L0 and L values were used to calculate the boiling water shrinkage ratio by the following formula (6).

$$\text{Boiling water shrinkage ratio}=(L0-L)/L0\times 100(\%) \qquad (6)$$

(Covering)

The conductive fiber B, i.e., the core 103, has its surface covered by the piezoelectric fibers A, i.e., the braided sheath 102. The thickness of the sheath 102 covering the conductive fiber B is preferably 1 μm to 10 mm, more preferably 5 μm to 5 mm, even more preferably 10 μm to 3 mm and most preferably 20 μm to 1 mm. If it is too thin, problems may result in terms of strength, and if it is too thick, the braided piezoelectric element 101 may become hard and more resistant to deformation. The "sheath 102" referred to here is the layer adjacent to the core 103.

In the braided piezoelectric element 101, the total fineness of the piezoelectric fibers A of the sheath 102 is preferably at least ½ and no greater than 20 times, more preferably at least 1 and no greater than 15 times, and even more preferably at least 2 and no greater than 10 times, the total fineness of the conductive fiber B of the core 103. If the total fineness of the piezoelectric fibers A is too small with respect to the total fineness of the conductive fiber B, there will be too few piezoelectric fibers A surrounding the conductive fiber B and the conductive fiber B will not be able to sufficiently output an electrical signal, while the conductive fiber B may potentially contact with other adjacent conductive fibers. If the total fineness of the piezoelectric fibers A is too large with respect to the total fineness of the conductive fiber B, there will be too many piezoelectric fibers A surrounding the conductive fiber B, and the braided piezoelectric element 101 will become too hard and resistant to deformation. In other words, the braided piezoelectric element 101 will fail to adequately function as a sensor in both cases.

The total fineness referred to here is the sum of all of the finenesses of the piezoelectric fibers A composing the sheath 102, and in the case of a common 8-strand braid, for example, it is the sum of the finenesses of the 8 strands.

Also, in the braided piezoelectric element 101, the fineness per piezoelectric fiber A of the sheath 102 is preferably at least 1/20 times and no greater than 2 times, more preferably at least 1/15 times and no greater than 1.5 times, and even more preferably at least 1/10 times and no greater than 1 time, the total fineness of the conductive fiber B. If the fineness per piezoelectric fiber A is too small with respect to the total fineness of the conductive fiber B, there will be too few piezoelectric fibers A and the conductive fiber B will not be able to sufficiently output an electrical signal, while the piezoelectric fibers A may potentially undergo breakage. If the fineness per piezoelectric fiber A is too large with respect to the total fineness of the conductive fiber B, the piezoelectric fibers A will be too thick and the braided piezoelectric element 101 will become too hard and resistant to deformation. In other words, the braided piezoelectric element 101 will fail to adequately function as a sensor in both cases.

Incidentally, when metal fiber is used for the conductive fiber B or when metal fiber is combined with the conductive fiber A or piezoelectric fibers B, the fineness proportion is not limited to that mentioned above. This is because according to the invention, the proportion is important from the standpoint of the contact area and coverage factor, i.e., the area and volume. For example, if the specific gravity of each of the fibers exceeds 2, the proportion of the mean cross-sectional area of the fibers is preferably the same as the fineness proportion.

It is preferred for the piezoelectric fibers A and the conductive fiber B to be as closely bonded as possible, but for improved adhesiveness, an anchor layer or adhesive layer may be provided between the conductive fiber B and the piezoelectric fibers A.

The covering method employed is a method of using the conductive fiber B as the core thread and coiling the piezoelectric fibers A in a braided fashion around it. The form of the braid of the piezoelectric fibers A, however, is not particularly restricted so long as an electrical signal can be outputted in response to stress produced by an applied load, but it is preferably an 8-strand braid or a 16-strand braid with the core 103.

The form of the conductive fiber B and the piezoelectric fibers A is not particularly restricted, but they are preferably as nearly concentric as possible. When a multifilament is used as the conductive fiber B, the piezoelectric fibers A need only be covering in a manner so that at least a portion of the surface of the multifilament of the conductive fiber B (the peripheral surface of the fiber) is contacting, and the piezoelectric fibers A may cover either all, or less than all, of the filament surfaces (peripheral surfaces of the fibers) of the multifilament. The covering state of the piezoelectric fibers A on each filament in the interior forming the multifilament of the conductive fiber B may be set as appropriate, in consideration of performance and handleability of the piezoelectric element.

Since the braided piezoelectric element 101 of the invention has no need for electrodes on its surface, there is no need to further cover the braided piezoelectric element 101 itself, and this also has the advantage of making it less likely to malfunction.

(Production Method)

The braided piezoelectric element 101 of the invention has the surface of at least one conductive fiber B covered by the braided piezoelectric fibers A, and the method for its production may be the following, for example. That is, it may be a method of preparing the conductive fiber B and the piezoelectric fibers A in separate steps, and coiling the piezoelectric fibers A in braided form around the conductive fiber B to cover it. In this case, the covering is preferably carried out as nearly concentrically as possible.

The preferred spinning and stretching conditions, when using polylactic acid as the piezoelectric polymer forming the piezoelectric fibers A, is a melt spinning temperature of preferably 150° C. to 250° C. a stretching temperature of preferably 40° C. to 150° C. a draw ratio of preferably 1.1 to 5.0 and a crystallization temperature of preferably 80° C. to 170° C.

The piezoelectric fibers A to be used by coiling around the conductive fiber B may be multifilaments consisting of bundles of multiple filaments, or monofilaments (including spun yarn). The conductive fiber B around which the piezoelectric fibers A are to be coiled may also be a multifilament consisting of bundles of multiple filaments, or a monofilament (including spun yarn). The conductive fiber B may also be twisted.

The preferred manner of covering is to use the conductive fiber B as the core thread and braid the piezoelectric fibers A around its periphery in a braided form to prepare a tubular braid to cover it. More specifically, this may be an 8-strand braid or 16-strand braid with the core 103. Twisted fibers are preferably used as the piezoelectric fibers A, with all of the piezoelectric fibers optionally being twisted, or only some of them being twisted. The twisting direction of the piezoelectric fibers A does not need to be the same for all of the piezoelectric fibers A used. For example, during braiding, S-twisted fibers may be used for the fibers around the clockwise direction while Z-twisted fibers may be used as the fibers around the counter-clockwise direction. In the case of an 8-strand braid, for example, all 8 strands do not need to be piezoelectric fibers, as different fibers may be used so long as the target signal strength is obtained. The conductive fibers of the core and the conductive fibers that are to serve as a shield layer may be twisted, of course. However, the piezoelectric fibers A may be in the form of a braided tube, for example, with the conductive fiber B as the core inserted in the braided tube to cover it.

The braided piezoelectric element 101 having the surface of the conductive fiber B covered with the braided piezoelectric fibers A can be obtained by the production method described above.

The braided piezoelectric element 101 of the invention does not require formation of an electrical signal-detecting electrode on the surface, and it can therefore be produced in a relatively simple manner.

(Protective Layer)

A protective layer may also be provided on the outer surface of the braided piezoelectric element 101 of the invention. The protective layer preferably has an insulating property, and from the viewpoint of flexibility it is more preferably composed of a polymer. When the protective layer is given an insulating property, naturally the protective layer will also be deformed and the protective layer will be rubbed, and there are no particular restrictions so long as the external force reaches the piezoelectric fibers A and can induce polarization. The protective layer is not limited to being formed by coating of the polymer or the like, and it may instead be a coiled film, fabric, fiber or the like, or a combination of these.

The thickness of the protective layer is as small as possible to facilitate transmission of shearing stress to the piezoelectric fibers A, but if it is too small, problems may be caused such as breakdown of the protective layer itself, and it is therefore preferably 10 nm to 200 µm, more preferably 50 nm to 50 µm, even more preferably 70 nm to 30 µm and most preferably 100 nm to 10 µm. The shape of the piezoelectric element may also be created by the protective layer.

In addition, an electromagnetic shield layer may be incorporated into the braid structure in order to reduce noise. The electromagnetic shield layer is not particularly restricted, but a conductive substance may be coated, or a conductive film, fabric, fiber or the like may be coiled. The volume resistivity of the electromagnetic shield layer is preferably no greater than $10^{-1}$ Ω·cm, more preferably no greater than $10^{-2}$ Ω·cm and even more preferably no greater than $10^{-3}$ Ω·cm. However, the resistivity is not limited to this range so long as the effect of the electromagnetic shield layer can be obtained. The electromagnetic shield layer may be provided on the surface of the piezoelectric fibers A of the sheath, or it may be provided on the outer side of the aforementioned protective layer. Naturally, multiple layers of the electromagnetic shield layer and protective layer may be overlaid, their order being suitably determined according to the purpose.

In addition, a plurality of layers made of piezoelectric fibers may be provided, or a plurality of layers made of conductive fibers for signal extraction may be provided. Naturally, the number and order of the protective layer, the electromagnetic shield layer, the layer made of piezoelectric fibers and the layer made of conductive fibers, may be determined as appropriate according to the purpose. The coiling method may be a method of additionally forming a braid structure over the outer layer of the sheath 102, or a method of forming a cover ring.

When a conductor is thus placed on the central axis side and outside of the piezoelectric structure, it may be considered to be a condenser-type piezoelectric element having a piezoelectric polymer (dielectric material) sandwiched between the conductor on the central axis side and the conductor on the outside as the two electrodes. In order to effectively extract the electrical signal induced by polarization generated in the piezoelectric structure by deformation, the value of the insulation resistance between the electrodes is preferably 1 MΩ or greater, more preferably 10 MΩ or greater and even more preferably 100 MΩ or greater, when measured with a direct-current voltage of 3 V. The equivalent serial resistance value Rs and the equivalent serial capacity value Cs, obtained by analyzing the response upon application of an alternating current voltage of 1 MHz between the electrodes, are also preferably within specific ranges, in order to effectively extract the electrical signal induced by polarization generated in the piezoelectric structure by deformation, and to improve responsiveness. In other words, the Rs value is preferably between 1 µΩ and 100 kΩ, more preferably between 1 mΩ and 10 kΩ and even more preferably between 1 mΩ and 1 kΩ, and the Cs value is preferably between 0.1 pF and 1000 pF, more preferably between 0.2 pF and 100 pF and even more preferably between 0.4 pF and 10 pF, as the value divided by the length (cm) in the central axis direction of the piezoelectric structure.

As mentioned above, when the element comprising the piezoelectric structure and electrodes is operatable in the preferred state, the equivalent serial resistance value Rs and the equivalent serial capacity value Cs, obtained by analyzing the response upon application of an alternating current voltage of 1 MHz between the electrodes, are preferably within the prescribed ranges, and these values are preferably used for examination of the piezoelectric structure. The piezoelectric structure can also be examined by not only the Rs and Cs values obtained by analysis with an alternating current voltage, but also by analyzing the transient response to other electrical stimulation.

(Function)

The braided piezoelectric element 101 of the invention can efficiently output a large electrical signal when stretching deformation (stress) is applied in the central axis direction of the circular tubular piezoelectric structure formed from the sheath 102, i.e., the direction parallel to the conductive fiber B. However, it does not output a large electrical signal in response to twisting deformation or bending, or rubbing deformation.

Such "stretching deformation" applied to the braided piezoelectric element 101 is preferably in a range that does not qualify as deformation that would initiate plastic deformation of the fibers in the element. This amount of deformation will depend on the physical properties of the fibers used. However, this may not apply for purposes where repeated use is not envisioned.

(Fabric-Like Piezoelectric Element)

Figure 5:
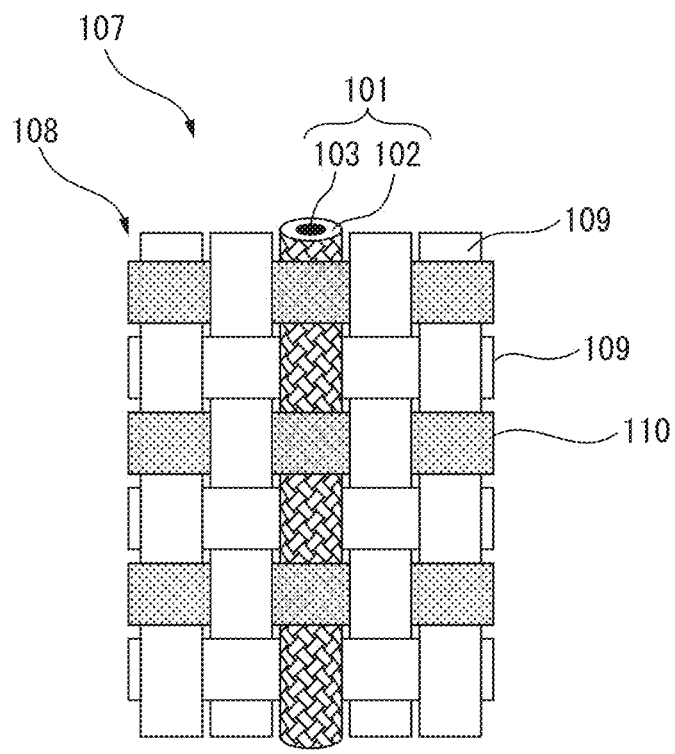
FIG. 5 is a schematic diagram showing an example of the construction of a fabric-like piezoelectric element according to an embodiment of the first invention.

FIG. 5 is a schematic diagram showing an example of the construction of a fabric-like piezoelectric element using a braided piezoelectric element according to an embodiment.

The fabric-like piezoelectric element 107 comprises a fabric 108 including at least one braided piezoelectric element 101. The fabric 108 may be any type of woven or knitted fabric wherein at least one of the fibers (including braids) composing the fabric is a braided piezoelectric element 101, with no particular limitation so long as the braided piezoelectric element 101 can exhibit the function of a piezoelectric element. For a fabric, union weaving, mixed knitting or the like may be carried out with other fibers (including braids), so long as the object of the invention is achieved. Naturally, the braided piezoelectric element 101 may be used as a portion of fibers composing a fabric (for example, warp thread or weft thread), or the braided piezoelectric element 101 may be embroidered or bonded with a fabric. In the example shown in FIG. 5, the fabric-like piezoelectric element 107 is a plain weave fabric having at least one braided piezoelectric element 101 and insulating fibers 109 arranged as warp thread and the conductive fibers 110 and insulating fibers 109 alternately arranged as weft thread. The conductive fibers 110 may be of the same type as the conductive fiber B or a different type of conductive fiber, and the insulating fibers 109 are as described below. All or some of the insulating fibers 109 and/or conductive fibers 110 may also be in braided form.

When the fabric-like piezoelectric element 107 has deformed by bending or the like, the braided piezoelectric element 101 also deforms in a manner following that deformation, and the deformation of the fabric-like piezoelectric element 107 can be detected by the electrical signal outputted from the braided piezoelectric element 101. Furthermore, since the fabric-like piezoelectric element 107 can be used as a fabric (woven or knitted fabric), it can be applied as a wearable sensor in the form of clothing, for example.

In addition, in the fabric-like piezoelectric element 107 shown in FIG. 5, the conductive fibers 110 are in crossing contact with the braided piezoelectric element 101. Therefore, the conductive fibers 110 are in crossing contact with at least portions of the braided piezoelectric element 101, covering it, thereby blocking at least some of the electromagnetic waves directed toward the braided piezoelectric element 101 from the exterior. The conductive fibers 110 are grounded (earthed) so as to have a function of reducing the effects of electromagnetic waves on the braided piezoelectric element 101. That is, the conductive fibers 110 can function as an electromagnetic shield for the braided piezoelectric element 101. Thus, it is possible to significantly increase the S/N ratio of the fabric-like piezoelectric element 107 even without layering a conductive fabric as an electromagnetic shield above and below the fabric-like piezoelectric element 107, for example. In this case, the proportion of conductive fibers 110 in the weft thread crossing with the braided piezoelectric element 101 (in the case of FIG. 5) is preferably higher from the viewpoint of electromagnetic shielding. Specifically, at least 30%, more preferably at least 40% and even more preferably at least 50% of the fibers forming the fabric 108 and crossing with the braided piezoelectric element 101, are conductive fibers. In this type of fabric-like piezoelectric element 107, conductive fibers may be inserted for at least some of the fibers composing the fabric, to allow an electromagnetic wave shield-bearing fabric-like piezoelectric element 107 to be obtained.

Examples for the woven texture of the woven fabric include the three foundational types of weaves: plain weave, twill weave and satin weave, half-double weaves such as derivative weave, warp backed weave and weft backed weave, and warp velvet weaves. The type of knitted fabric may be a circular knit fabric (weft knitted fabric) or a warp knitted fabric. Examples of preferred textures of circular knit fabrics (weft knitted fabrics) include plain stitch, rib stitch, interlock stitch, purl stitch, tuck stitch, float stitch, rib-and-tuck stitch, lace stitch and plating stitch. Examples of warp braid stitches include single denbigh stitch, single atlas stitch, double cord stitch, half-tricot stitch, lined stitch and jacquard stitch. It may consist of a single layer, or a multilayer with two or more layers. Alternatively, it may be a plush weave or plush stitch, composed of nap sections and ground weave sections comprising cut piles and/or loop piles.

(Multiple Piezoelectric Elements)

Multiple braided piezoelectric elements 101 may also be used in an arrangement in the fabric-like piezoelectric element 107. The manner of arrangement may be, for example, using the braided piezoelectric element 101 for all of the warp thread or weft thread, or the braided piezoelectric elements 101 may be used for several groups or sections thereof. Also, braided piezoelectric elements 101 may be used as warp threads at certain sections and braided piezoelectric elements 101 used as weft threads at other sections.

When a plurality of braided piezoelectric elements 101 are arranged to form the fabric-like piezoelectric element 107, an advantage is afforded as the manner of arrangement and manner of knitting may be selected within a wide range, since the braided piezoelectric elements 101 lack electrodes on the surface.

When a plurality of braided piezoelectric elements 101 are arranged, electrical signals can be efficiently extracted because the distance between the conductive fibers B is short.

(Insulating Fiber)

In the fabric-like piezoelectric element 107, insulating fibers may also be used at sections other than the braided piezoelectric element 101 (and conductive fibers 110). In this case, the insulating fibers used may be fibers of a material and shape that are stretchable, in order to improve the flexibility of the fabric-like piezoelectric element 107.

By situating insulating fibers in this manner at sections other than the braided piezoelectric element 101 (and conductive fibers 110), it is possible to increase the operativity of the fabric-like piezoelectric element 107 (for example, the ease of movement for a wearable sensor).

Such insulating fibers that are used need only have a volume resistivity of $10^6$ Ω·cm or greater, but it is more preferably $10^8$ Ω·cm or greater and even more preferably 1010 Ω·cm or greater.

Examples of insulating fibers to be used include synthetic fibers such as polyester fiber, nylon fiber, acrylic fiber, polyethylene fiber, polypropylene fiber, vinyl chloride fiber, aramid fiber, polysulfone fiber, polyether fiber and polyurethane fiber, as well as natural fibers such as cotton, hemp and silk, semisynthetic fibers such as acetate, and regenerated fibers such as rayon and cupra. There is no restriction to these, however, and any publicly known insulating fibers may be used as desired. These insulating fibers may also be used in combination, or combined with fibers having no insulating property to form fibers with an overall insulating property.

Fibers with various publicly known cross-sectional shapes may also be used.

(Technology for Use of Piezoelectric Element)

The piezoelectric element of the invention in any desired form, such as the braided piezoelectric element 101 or fabric-like piezoelectric element 107, can output stretching deformation (stress) in the central axis direction of the braided piezoelectric element as an electrical signal, and therefore it can be utilized as a sensor (device) that detects the size of stress and/or the location of stress applied to the piezoelectric element. Depending on the method of placement of the braided piezoelectric element in the fabric-like piezoelectric element, the braided piezoelectric element may undergo stretching deformation when the fabric-like piezoelectric element is subjected to deformation or stress such as bending, twisting and compression, and can therefore output an electrical signal in response to the deformation or stress such as bending, twisting or compression of the fabric-like piezoelectric element. In addition, the electrical signal can be used as a power generating element, to serve as an electric power source to drive another device, or for storage. Specifically, this may include electric power generation by use at movable parts that autonomously move, such as those of a human, animal, robot or machine, electric power generation on the surface of a structure subjected to pressure from a shoe sole, mat or exterior, and electric power generation by shape deformation in a fluid. For generation of an electrical signal by shape deformation in a fluid, an electrostatic substance in a fluid may be adsorbed, or its adhesion inhibited.

Figure 6:
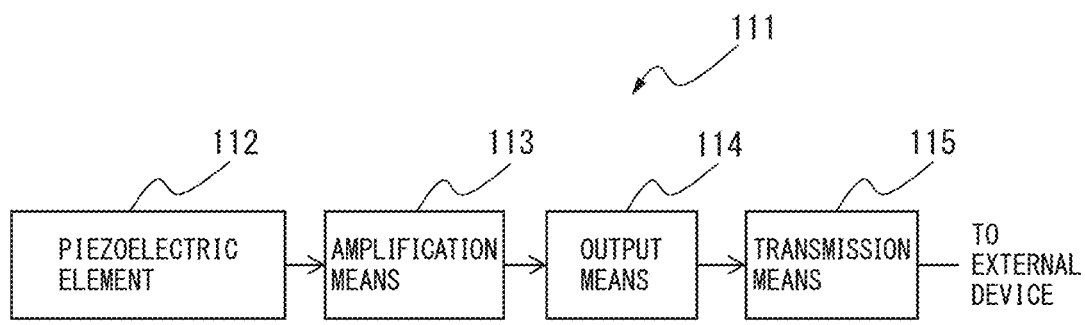
FIG. 6 is a block diagram showing a device comprising a piezoelectric element according to an embodiment of the first invention to third invention.

FIG. 6 is a block diagram showing a device 111 comprising a piezoelectric element 112 of the invention. The device 111 comprises a piezoelectric element 112 (e.g. a braided piezoelectric element 101 or fabric-like piezoelectric element 107), and optionally also an electrical circuit having amplification means 113 that amplifies an electrical signal outputted from the output terminal of the piezoelectric element 112 in response to applied pressure, output means 114 that outputs the electrical signal amplified at the optional amplification means 113, and transmission means 115 that transmits the electrical signal outputted from the output means 114 to an external device (not shown). By using the device 111, it is possible to detect the size and/or applied location of stretching deformation (stress) in the central axis direction of the braided piezoelectric element applied to the piezoelectric element, by computation processing at an external device (not shown), based on an electrical signal outputted by contact, pressure or shape deformation on the surface of a piezoelectric element 112.

The optional amplification means 113, output means 114 and transmission means 115 may consist of a software program, for example, or they may consist of a combination of different electronic circuits and a software program. For example, a software program may be installed in a computation processing device (not shown), and the computation processing device operated according to the software program to carry out the various functions. Alternatively, the optional amplification means 113, output means 114 and transmission means 115 may be semiconductor integrated circuits having software programs written in them for the various functions. Incidentally, the transmission system using transmission means 115 may be either wireless or wired, determined as appropriate depending on the sensor to be constructed.

Alternatively, computing means (not shown) may be provided in the device 111, that computes the size and/or applied location of stress applied to the piezoelectric element 112, based on the electrical signal outputted from the output means 114. Instead of the amplification means alone, it may also be used in combination with publicly known signal processing means, such as noise-canceling means or means for combined processing with other signals. The order of connection of such means may be modified as appropriate depending on the purpose. Naturally, the electrical signal outputted from the piezoelectric element 112 may be subjected to signal processing after being directly transmitted to an external device.

Figure 7:
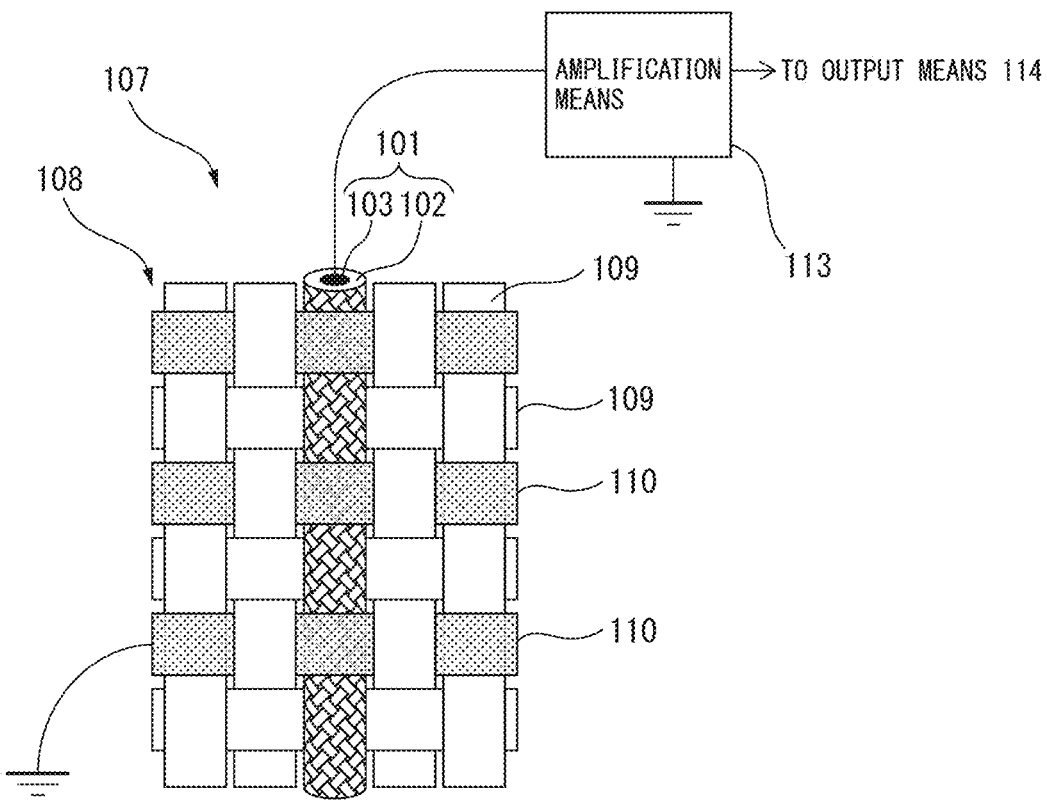
FIG. 7 is a schematic diagram showing an example of the construction of a device comprising a fabric-like piezoelectric element according to an embodiment of the first invention.
Figure 8:
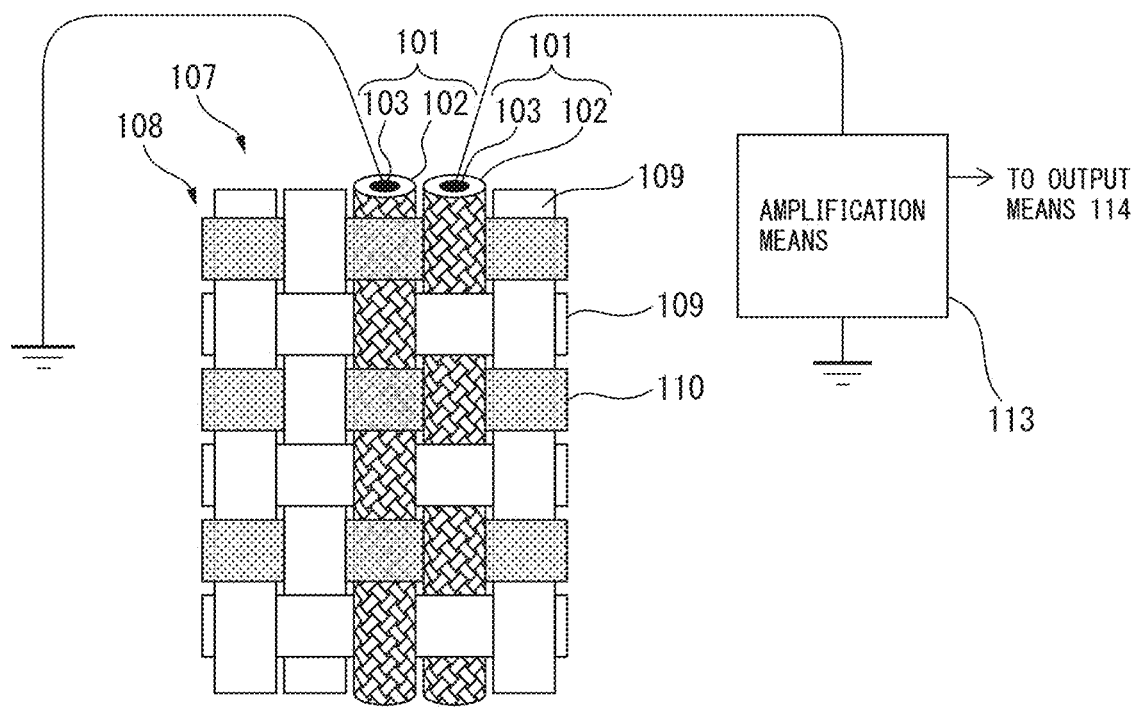
FIG. 8 is a schematic diagram showing another example of the construction of a device comprising a fabric-like piezoelectric element according to an embodiment of the first invention.

FIG. 7 and FIG. 8 are schematic diagrams showing examples of the construction of a device comprising a braid fabric-like piezoelectric element according to an embodiment. The amplification means 113 of FIG. 7 and FIG. 8 correspond to the one explained with reference to FIG. 6, although the illustrations in FIG. 7 and FIG. 8 omit the output means 114 and transmission means 115 shown in FIG. 6. When a device is constructed comprising a fabric-like piezoelectric element 107, a lead wire is connected from the output terminal of the core 103 of the braided piezoelectric element 101 (formed of the conductive fiber B) to an input terminal of the amplification means 113, while a braided piezoelectric element separate from the braided piezoelectric element 101 that is connected to the input terminal of the amplification means 113, or the conductive fiber 110, is connected to a ground (earth) terminal. For example, as shown in FIG. 7, in the fabric-like piezoelectric element 107, a lead wire from the core 103 of the braided piezoelectric element 101 is connected to the input terminal of the amplification means 113, and the conductive fibers 110 contacting with the braided piezoelectric element 101 in a crossing manner are grounded (earthed). Alternatively, when multiple braided piezoelectric elements 101 are arranged in the fabric-like piezoelectric element 107 as shown in FIG. 8, for example, one lead wire from the core 103 of one braided piezoelectric element 101 is connected to the input terminal of the amplification means 113, while a lead wire from the core 103 of another braided piezoelectric element 101 alongside the braided piezoelectric element 101 is grounded (earthed).

When stretching deformation is produced in the central axis direction of the braided piezoelectric element 101, the piezoelectric fibers A deform, generating polarization. As the positive and negative electrical charges generated by polarization of the piezoelectric fibers A become aligned, electrical charge migration takes place on the lead wire from the output terminal of the conductive fiber B that forms the core 103 of the braided piezoelectric element 101. The electrical charge migration on the lead wire from the conductive fiber B appears as a minute electrical signal (current or difference in potential). In other words, an electrical signal is outputted from the output terminal in response to the electrical charge generated when stretching deformation is applied in the central axis direction of the braided piezoelectric element 101 (the central axis direction of the circular tubular shape in which the piezoelectric polymer is arranged). The amplification means 113 amplifies the electrical signal, the output means 114 outputs the electrical signal amplified by the amplification means 113, and the transmission means 115 transmits the electrical signal outputted from the output means 114 to an external device (not shown).

Since the device 111 of the invention is flexible and may be used in any form such as braided or fabric-like, it has a very wide range of potential uses. Specific examples for the device 111 of the invention may be clothing that includes caps, gloves and socks, touch panels in the form of supporters or handkerchiefs, and surface pressure-sensitive sensors for humans or animals, such as sensors that detect bending, twisting or stretching of the joint sections of gloves or bands or supporters, for example. When used for a human, for example, it may be used as an interface for detection of contact or movement and collection of data regarding movement of a joint being used for medical purposes, or for amusement, or for movement of lost tissue or a robot. In addition, it may be used as a surface pressure-sensitive sensor in a stuffed doll simulating an animal or human form, or a robot, or as a sensor for sensing of bending, twisting or stretching of joints. It may still further be used as a surface pressure-sensitive sensor or shape deformation sensor in beddings such as sheets or pillows, shoe soles, gloves, chairs, mats, bags, flags or the like.

In addition, since the device 111 of the invention is in braided or fabric form and is flexible, it may be used as a surface pressure-sensitive sensor or shape deformation sensor by attachment or covering on the surface of all or portions of various structures.

Furthermore, since the device 111 of the invention can generate a sufficient electrical signal simply by rubbing the surface of the braided piezoelectric element 101, it can be used in touch input devices such as touch sensors, or in pointing devices. Moreover, since positional information and shape information in the height direction of an object to be measured can be obtained by rubbing the surface of the object to be measured with the braided piezoelectric element 101, it can be used in surface form measurement and the like.

The second invention will now be explained in detail.
(Braided Piezoelectric Element)

In the braided piezoelectric element of the second invention, the piezoelectric polymer in the structure of the first invention is arranged in a circular tubular manner, and is used as an element wherein a conductor composed of conductive fiber is disposed at a location on the central axis of the circular tubular shape, with the piezoelectric polymer being arranged in a manner braided around the conductive fiber, as piezoelectric fibers. The braided piezoelectric element of the second invention will now be described in detail.

Figure 10:
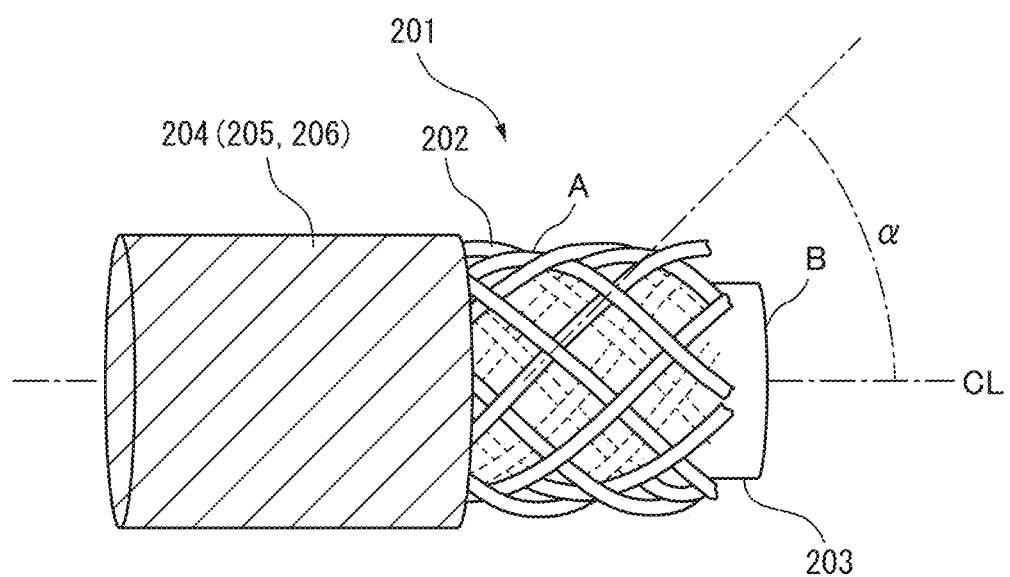
FIG. 10 is a schematic diagram showing an example of the construction of a braided piezoelectric element according to an embodiment of the second and third invention.

FIG. 10 is a schematic diagram showing an example of the construction of a braided piezoelectric element according to an embodiment.

The braided piezoelectric element 201 comprises a core 203 formed of a conductive fiber B, a sheath 202 formed of braided piezoelectric fibers A covering the core 203, and a conductive layer 204 covering the sheath 202. The conductive layer 204 simultaneously has a function as an electrode serving as the counter electrode for the conductive fiber of the core 203, and a function as a shield to block the conductive fiber of the core 203 from external electromagnetic waves and minimize noise signals generated in the conductive fiber of the core 203.

The coverage factor of the sheath 202 by the conductive layer 204 is preferably 25% or greater. The coverage factor referred to here is the ratio of the area of the conductive substance 205 in the conductive layer 204 when the conductive layer 204 is projected onto the sheath 202, and the surface area of the sheath 202, the value being preferably 25% or greater, more preferably 50% or greater and even more preferably 75% or greater. If the coverage factor of the conductive layer 204 is less than 25%, the noise signal reducing effect may not be adequately exhibited. When the conductive substance 205 is not exposed on the surface of the conductive layer 204, such as when fibers encapsulating the conductive substance 205 are used as the conductive layer 204 to cover the sheath 202, the ratio of the area of the fibers projected onto the sheath 202 and the surface area of the sheath 202 may be used as the coverage factor.

The conductive substance 205 is the conductive substance in the conductive layer 204, and any publicly known substance qualifies.

In the braided piezoelectric element 201, a plurality of piezoelectric fibers A are closely coiled around the outer peripheral surface of at least one conductive fiber B. It is surmised that when deformation is produced in the braided piezoelectric element 201, stress is produced in each of the piezoelectric fibers A by the deformation, producing an electric field in each of the piezoelectric fibers A (piezoelectric effect), and as a result a voltage change takes place in the conductive fiber B, superimposed on the electric field of the plurality of piezoelectric fibers A coiled around the conductive fiber B. That is, the electrical signal from the conductive fiber B is augmented compared to when the braided sheath 202 of piezoelectric fibers A is not used. This allows a large electrical signal to be extracted with the braided piezoelectric element 201, even with stress produced by relatively small deformation. Incidentally, the conductive fiber B may also consist of a plurality of fibers.

From the viewpoint of achieving the object of the second invention, the braided piezoelectric element 201 is not particularly restricted so long as it has the construction shown in FIG. 10, other than the feature of the ratio d Rc of the thickness d of the layer composed of the piezoelectric fibers with respect to the radius Rc of the core 203 (explained below), but it preferably has the following construction from the viewpoint of selectively outputting a large electrical signal in response to stretching deformation in the central axis direction.

The braided piezoelectric element 201 that selectively outputs a large electrical signal in response to stretching deformation in the central axis direction may be a structure that has an oriented piezoelectric polymer arranged in a circular tubular shape as piezoelectric fibers A, and that includes, as a main component, a crystalline polymer wherein the orientation angle of the piezoelectric polymer is between 15° and 75°, preferably between 25° and 65°, more preferably between 35° and 55° and even more preferably between 40° and 50° with respect to the direction of the central axis of the circular tubular shape in which the piezoelectric polymer is arranged, and the piezoelectric polymer has an absolute value of between 0.1 pC/N and 1000 pC/N for the piezoelectric constant d14 when the orientation axis is the third axis. The piezoelectric polymer is also a structure that includes a P-body containing a crystalline polymer with a positive piezoelectric constant d14 value as the main component and an N-body containing a crystalline polymer with a negative value as the main component, wherein for the portion of the central axis of the structure having a length of 1 cm, the value of T1/T2 is between 0 and 0.8 and preferably 0 to 0.5, T1 being the smaller and T2 being the larger of (ZP+SN) and (SP+ZN), where ZP is the mass of the P-body having the orientation axis wrapped in a helical fashion around the Z-twisting direction. SP is the mass of the P-body having the orientation axis wrapped in a helical fashion around the S-twisting direction, ZN is the mass of the N-body having the orientation axis wrapped in a helical fashion around the Z-twisting direction, and SN is the mass of the N-body having the orientation axis wrapped in a helical fashion around the S-twisting direction.

In the fabric-like piezoelectric element described below, it is possible to use the braided piezoelectric element 201 that selectively outputs a large electrical signal in response to stretching deformation in the central axis direction, together with a braided piezoelectric element that selectively outputs a large electrical signal in response to twisting deformation with the central axis as the axis. The braided piezoelectric element that selectively outputs a large electrical signal in response to twisting deformation with the central axis as the axis is preferably, for example, a structure that has an oriented piezoelectric polymer arranged in a circular tubular shape as piezoelectric fibers A, and that includes, as a main component, a crystalline polymer wherein the orientation angle of the piezoelectric polymer is between 0° and 400 or between 50° and 90° with respect to the direction of the central axis of the circular tubular shape in which the piezoelectric polymer is arranged, and the piezoelectric polymer has an absolute value of between 0.1 pC/N and 1000 pC/N for the piezoelectric constant d14 when the orientation axis is the third axis. Such a piezoelectric polymer is more preferably a structure that includes a P-body containing a crystalline polymer with a positive piezoelectric constant d14 value as the main component and an N-body containing a crystalline polymer with a negative value as the main component, wherein for the portion of the central axis of the structure having a length of 1 cm, the value of T1/T2 is greater than 0.8 and no greater than 1.0, T1 being the smaller and T2 being the larger of (ZP+SN) and (SP+ZN), where ZP is the mass of the P-body having the orientation axis wrapped in a helical fashion around the Z-twisting direction, SP is the mass of the P-body having the orientation axis wrapped in a helical fashion around the S-twisting direction, ZN is the mass of the N-body having the orientation axis wrapped in a helical fashion around the Z-twisting direction, and SN is the mass of the N-body having the orientation axis wrapped in a helical fashion around the S-twisting direction.

Incidentally, while different values are obtained for d14 depending on the molding conditions, purity and measuring atmosphere, according to the present invention it is sufficient if, based on measurement of the degree of crystallinity and crystal orientation of the crystalline polymer measured for the piezoelectric polymer that is actually used, the absolute value of d14 for the film is between 0.1 pC/N and 1000 pC/N at the temperature of actual use, when a uniaxially stretched film having the same degree of crystallinity and crystal orientation is fabricated using the crystalline polymer, and the crystalline polymer in the piezoelectric polymer of this embodiment is not limited to specific crystalline polymers such as those mentioned below. Measurement of d14 for a film sample may be made by a publicly known method, and for example, a sample having metal vapor deposited electrodes on both sides of the film sample may be cut out into a 4-sided rectangular shape in a direction inclined 45° from the stretching direction, and the electrical charge generated at the electrodes on both sides may be measured under a tensile load in the longitudinal direction, to measure the d14 value.

When fibers including polylactic acid are used as the main component for the piezoelectric fibers of the invention, the polylactic acid contains the lactic acid unit in a proportion of preferably at least 90 mol %, more preferably at least 95 mol % and even more preferably at least 98 mol %.

As long as the object of the invention is achieved by the braided piezoelectric element 201, combined filaments may be prepared in combination with fibers other than the piezoelectric fibers A for the sheath 202, and combined filaments may be prepared in combination with fibers other than the conductive fiber B for the core 203.

There are no particular restrictions on the length of the braided piezoelectric element composed of the core 203 of the conductive fiber B, the sheath 202 of braided piezoelectric fibers A, and the conductive layer 204 covering the sheath 202. For example, the braided piezoelectric element may be produced in a continuous manner during production, and cut to the necessary length afterwards for use. The length of the braided piezoelectric element is 1 mm to 10 m, preferably 5 mm to 2 m and more preferably 1 cm to 1 m. If the length is too short the convenience of the fiber shape may be lost, and if the length is too long it may become necessary to consider the resistance value of the conductive fiber B.

Each of the structural aspects will now be explained in greater detail.
(Conductive Fiber)

The conductive fiber B used may be any publicly known one that exhibits conductivity. Examples for the conductive fiber B include metal fibers, fibers made of conductive polymers, carbon fibers, fibers made of polymers dispersing fibrous or granular conductive fillers, or fibers forming a layer with conductivity on the surface of a fibrous substance. The method of forming a layer with conductivity on the surface of a fibrous substance may be metal coating, conductive polymer coating or conductive fiber coiling. Metal coating is preferred among these from the viewpoint of conductivity, durability, flexibility and the like. The specific method of coating a metal may be vapor deposition, sputtering, electrolytic plating, electroless plating or the like, with plating being preferred from the viewpoint of productivity. Fibers metal-plated in this manner may be considered to be metal-plated fibers.

The base fiber coated with a metal may be a publicly known fiber, regardless of the presence or absence of conductivity, examples of which include synthetic fibers such as polyester fiber, nylon fiber, acrylic fiber, polyethylene fiber, polypropylene fiber, vinyl chloride fiber, aramid fiber, polysulfone fiber, polyether fiber and polyurethane fiber, as well as natural fibers such as cotton, hemp and silk, semisynthetic fibers such as acetate, and regenerated fibers such as rayon and cupra. The base fiber is not limited to these, and any publicly known fiber may be used or combinations of these fibers may be used.

The metal to be coated onto the base fiber may be any type that exhibits conductivity and exhibits the effect of the invention. Examples to be used include gold, silver, platinum, copper, nickel, tin, zinc, palladium, indium tin oxide, copper sulfide and the like, as well as their mixtures and alloys.

When an organic fiber coated with a metal with bending resistance is used as the conductive fiber B, the conductive fiber will be very highly unlikely to break and the durability and safety of a sensor using the piezoelectric element will be excellent.

The conductive fiber B may be a multifilament consisting of a bundle of multiple filaments, or a monofilament consisting of a single filament. A multifilament is preferred from the viewpoint of long-term stability of the electrical characteristics. In the case of a monofilament (including spun yarn), the monofilament diameter is 1 µm to 5000 µm and preferably 2 µm to 100 µm. It is more preferably 3 µm to 50 µm. In the case of a multifilament, the number of filaments is preferably from 1 to 100,000, more preferably 5 to 500 and even more preferably 10 to 100. The fineness and number of conductive fibers B is the fineness and number of cores 203 used to prepare the braid, and a multifilament formed of a plurality of single threads (monofilaments) is counted as one conductive fiber B. The core 203 is the overall amount, including fibers other than conductive fibers when the) are used.

If the diameter of the fiber is small the strength will be reduced and handling may become difficult, while if the diameter is large there may be some sacrifice of flexibility. The cross-sectional shape of the conductive fiber B is preferably circular or elliptical from the viewpoint of design and production of the piezoelectric element, but this is not limitative.

A lower electrical resistance is preferred for efficient extraction of electrical output from the piezoelectric polymer, the volume resistivity being preferably no greater than $10^{-1}$ Ω·cm, more preferably no greater than $10^{-2}$ Ω·cm and even more preferably no greater than $10^{-3}$ Ω·cm. However, the resistivity of the conductive fiber B is not limited to this range so long as sufficient strength can be obtained for detection of the electrical signal.

For use according to the present invention, the conductive fiber B must be resistant to movements such as repeated bending and twisting. As one indicator of such a property, a larger knot tenacity is preferred. The knot tenacity can be measured by the method of JIS L1013 8.6. The degree of knot tenacity suitable for the invention is preferably 0.5 cN/dtex or greater, more preferably 1.0 cN/dtex or greater, even more preferably 1.5 cN/dtex or greater and most preferably 2.0 cN/dtex or greater. As another indicator, low flexural rigidity is preferred. Flexural rigidity is generally measured with a measuring apparatus such as a KES-FB2 Pure Bending Tester by Kato Tech Corp. The degree of flexural rigidity suitable for the invention is preferably lower than that of the carbon fibers TENAX® HTS40-3K by Toho Tenax Co., Ltd. Specifically, the flexural rigidity of the conductive fiber is preferably no greater than $0.05 \times 10^{-4}$ N·m²/m, more preferably no greater than $0.02 \times 10^{-4}$ N·m²/m and even more preferably no greater than $0.01 \times 10^{-4}$ N·m²/m.
(Piezoelectric Fibers)

The piezoelectric polymer used as the material for the piezoelectric fibers A may be a polymer exhibiting piezoelectricity such as polyvinylidene fluoride or polylactic acid, but the piezoelectric fibers A described above for this embodiment preferably include a crystalline polymer with a high absolute value for the piezoelectric constant d14 when the orientation axis is the third axis, and especially polylactic acid, as the main component. Polylactic acid is readily oriented and exhibits piezoelectricity by stretching after melt spinning, for example, and has excellent productivity since it does not require electric field orientation treatment as is necessary with polyvinylidene fluoride and the like. However, this is not intended to exclude the use of polyvinylidene fluoride and other piezoelectric materials for carrying out the present invention.

Polylactic acid includes poly-L-lactic acid obtained by polymerization of L-lactic acid and L-lactide, poly-D-lactic acid obtained by polymerization of D-lactic acid and D-lactide, and stereocomplex polylactic acid comprising a hybrid structure of these, depending on the crystal structure, and any of these may be used so long as they exhibit piezoelectricity. Poly-L-lactic acid and poly-D-lactic acid are preferred from the viewpoint of a high piezoelectric modulus. Since poly-L-lactic acid and poly-D-lactic acid exhibit opposite polarization in response to the same stress, they may be used in combination depending on the purpose.

The optical purity of the polylactic acid is preferably 99% or greater, more preferably 99.3% or higher and even more preferably 99.5% or higher. If the optical purity is less than 99% the piezoelectric modulus may be significantly lowered, potentially making it difficult to obtain a sufficient electrical signal by shape deformation of the piezoelectric fibers A. Most preferably, the piezoelectric fibers A include poly-L-lactic acid or poly-D-lactic acid as the main component, with an optical purity of 99% or greater.

Piezoelectric fibers A composed mainly of polylactic acid are stretched during production, and are uniaxially oriented in their fiber axis direction. Furthermore, preferably the piezoelectric fibers A are not only uniaxially oriented in the fiber axis direction but also include polylactic acid crystals, and more preferably they include uniaxially oriented polylactic acid crystals. This is because polylactic acid exhibits higher piezoelectricity and has a higher absolute value for d14 by having high crystallinity and being uniaxially oriented.

The crystallinity and uniaxial orientation are determined by the homo PLA crystallinity $X_{homo}$ (%) and crystal orientation Ao (%). The piezoelectric fibers A of the invention preferably have a homo PLA crystallinity $X_{homo}$ (%) and crystal orientation Ao (%) satisfying the following inequality (1).

$$X_{homo} \times Ao \times Ao \div 10^6 \geq 0.26 \quad (1)$$

If inequality (1) is not satisfied, the crystallinity and/or uniaxial orientation will be insufficient, the output value of the electrical signal for operation may be reduced and the sensitivity of the signal for operation in a specific direction may be reduced. The value of the left side of inequality (1) is more preferably 0.28 or greater, and even more preferably 0.3 or greater. Each of the values is determined in the following manner.

Homopolylactic Acid Crystallinity $X_{homo}$:

The homopolylactic acid crystallinity $X_{homo}$ is determined from crystal structure analysis by wide-angle X-ray diffraction (WAXD). In wide-angle X-ray diffraction (WAXD), an Ultrax18 X-ray diffraction apparatus by Rigaku Corp. is used in a transmission method, and the X-ray diffraction pattern of a sample is recorded on an imaging plate under the following conditions.

X-ray source: Cu-Kα rays (confocal mirror)
Output: 45 kV×60 mA
Slits: 1st: 1 mmΦ, 2nd: 0.8 mmΦ
Camera length: 120 mm
Elapsed time: 10 minutes
Sample: 35 mg of polylactic acid fibers are aligned to form a 3 cm fiber bundle.

The total scattering intensity $I_{total}$ over the declination in the obtained X-ray diffraction pattern is determined, and the sum $\Sigma I_{HMi}$ of the integrated intensity for each diffraction peak attributed to homopolylactic acid crystals, appearing near 2θ=16.5°, 18.5° and 24.3°, is calculated. Based on these values, the homopolylactic acid crystallinity $X_{homo}$ is calculated by the following formula (2).

$$\text{Homopolylactic acid crystallinity } X_{homo}(\%) = \Sigma I_{HMi} / I_{total} \times 100 \quad (2)$$

The value of $\Sigma I_{HMi}$ is calculated by subtracting the background and amorphous diffuse scattering from the total scattering intensity.

(2) Crystal Orientation Ao:

In the X-ray diffraction pattern obtained by the aforementioned wide-angle X-ray diffraction (WAXD), the crystal orientation Ao has an intensity distribution with respect to the declination (°) for the diffraction peaks attributable to homopolylactic acid crystals, appearing near 2θ=16.5° in the radius vector direction, and it is calculated from the sum $\Sigma Wi$ (°) of the half-widths in the obtained distribution profile, using the following formula (3).

$$\text{Crystal orientation } Ao(\%) = (360 - \Sigma W_i) \div 360 \times 100 \quad (3)$$

Incidentally, since polylactic acid is a polyester with relatively rapid hydrolysis, a publicly known hydrolysis preventer such as an isocyanate compound, oxazoline compound, epoxy compound or carbodiimide compound may be added when resistance to moist heat is an issue. Also, if necessary, an antioxidant, plasticizer, photodegradation inhibitor or the like such as a phosphoric acid-based compound may be added to modify the physical properties.

The piezoelectric fibers A may be multifilaments consisting of bundles of multiple filaments, or a monofilament consisting of a single filament. In the case of monofilaments (including spun yarn), the monofilament diameter is 1 μm to 5 mm, preferably 5 μm to 2 mm and even more preferably 10 μm to 1 mm. In the case of multifilaments, the monofilament diameter is 0.1 μm to 5 mm, preferably 2 μm to 100 μm and even more preferably 3 μm to 50 μm. The number of filaments for a multifilament is preferably from 1 to 100,000, more preferably 50 to 50.000 and even more preferably 100 to 20,000. The fineness and number of piezoelectric fibers A is the fineness and number per carrier when preparing the braid, and a multifilament formed of a plurality of single threads (monofilaments) is counted as one piezoelectric fiber A. One carrier includes the overall amount, including fibers other than piezoelectric fibers when they are used.

In order to obtain piezoelectric fibers A from such a piezoelectric polymer, any publicly known method for forming fibers from a polymer may be employed so long as the effect of the invention is exhibited. For example, a method of forming fibers by extrusion molding of the piezoelectric polymer, a method of forming fibers by melt spinning of the piezoelectric polymer, a method of forming fibers by dry or wet spinning of the piezoelectric polymer, a method of forming fibers by electrostatic spinning of the piezoelectric polymer, or a method of forming a film and then finely cutting it, may be employed. The spinning conditions employed may be according to a publicly known process suitable for the piezoelectric polymer used, and for most cases a melt spinning process may be employed, which will facilitate industrial production. After formation of the fibers, the formed fibers may also be stretched. This will form piezoelectric fibers A that are uniaxially stretched and oriented, include crystals, and exhibit high piezoelectricity.

In addition, the piezoelectric fibers A may be treated by dyeing, twisting, doubling, heat treatment or the like, before braiding of the fibers prepared as described above.

In addition, since the piezoelectric fibers A will sometimes become twisted together or broken, or produce fluff, during formation of the braid, their strength and abrasion resistance is preferably high, the strength being preferably 1.5 cN/dtex or greater, more preferably 2.0 cN/dtex or greater, even more preferably 2.5 cN/dtex or greater and most preferably 3.0 cN/dtex or greater. The abrasion resistance can be evaluated by JIS L1095 9.10.2, Method B, with an abrasion pass count of preferably 100 or greater, more preferably 1000 or greater, even more preferably 5000 or greater and most preferably 10,000 or greater. The method of increasing the abrasion resistance is not particularly restricted, and any publicly known method may be used, such as increasing the degree of crystallinity, adding fine particles, or surface processing. Abrasion can also be reduced by coating the fibers with a lubricating agent during processing of the braid.

Also, the difference in the shrinkage factor of the piezoelectric fibers is preferably small compared to the shrinkage factor of the conductive fiber mentioned above. If the difference in shrinkage factors is large, the braid may bend or the fabric may lose flatness in the post-treatment steps after formation of the braid or after formation of the fabric, or when subjected to heat or with passage of time during actual use, often resulting in a weaker piezoelectric signal. When the shrinkage factor is quantified by the boiling water shrinkage ratio as described below, the boiling water shrinkage ratio of the piezoelectric fibers S(p) and the boiling water shrinkage ratio of the conductive fiber S(c) preferably satisfy the following inequality (4).

$$|S(p)-S(c)| \leq 10 \quad (4)$$

The left side of inequality (4) is more preferably ≤5 and even more preferably ≤3.

The difference in the shrinkage factor of the piezoelectric fibers is also preferably small compared to the shrinkage factor of fibers other than the conductive fiber, such as insulating fibers. If the difference in shrinkage factors is large, the braid may bend or the fabric may lose flatness in the post-treatment steps after formation of the braid or after formation of the fabric, or when subjected to heat or with passage of time during actual use, often resulting in a weaker piezoelectric signal. When the shrinkage factor is quantified by the boiling water shrinkage ratio, the boiling water shrinkage ratio of the piezoelectric fibers S(p) and the boiling water shrinkage ratio of the insulating fibers S(i) preferably satisfy the following inequality (5).

$$|S(p)-S(i)| \leq 10 \quad (5)$$

The left side of inequality (5) is more preferably ≤5 and even more preferably ≤3.

The shrinkage factor of the piezoelectric fibers is also preferably small. For example, when the shrinkage factor is quantified by the boiling water shrinkage ratio, the shrinkage factor of the piezoelectric fibers is preferably no greater than 15%, more preferably no greater than 10%, even more preferably no greater than 5% and most preferably no greater than 3%. The means used to lower the shrinkage factor may be any publicly known method, and for example, the shrinkage factor can be lowered by heat treatment to relax the orientation of the amorphous sections or to increase the degree of crystallinity, without any particular restrictions on the timing of heat treatment, which may be after stretching, after twisting, after braiding or after fabric formation. The boiling water shrinkage ratio described above was measured by the following method. A reel with 20 coils was prepared using a sizing reel having a frame circumference of 1.125 m, a 0.022 cN/dtex load was applied, it was suspended from a scale board, and the initial reel length L0 was measured. The reel was then treated for 30 minutes in a boiling water bath at 100° C. and allowed to cool, a load was again applied, it was suspended from the scale board, and the contracted reel length L was measured. The measured L0 and L values were used to calculate the boiling water shrinkage ratio by the following formula (6).

$$\text{Boiling water shrinkage ratio}=(L0-L)/L0\times100(\%) \quad (6)$$

(Covering)

The conductive fiber B. i.e., the core 203, has its surface covered by the piezoelectric fibers A. i.e., the braided sheath 202. The thickness of the sheath 202 covering the conductive fiber B is preferably 1 µm to 10 mm, more preferably 5 µm to 5 mm, even more preferably 10 µm to 3 mm and most preferably 20 µm to 1 mm. If it is too thin, problems may result in terms of strength, and if it is too thick, the braided piezoelectric element 201 may become hard and more resistant to deformation. The "sheath 202" referred to here is the layer adjacent to the core 203.

In the braided piezoelectric element 201, the total fineness of the piezoelectric fibers A of the sheath 202 is preferably at least ½ and no greater than 20 times, more preferably at least 1 and no greater than 15 times, and even more preferably at least 2 and no greater than 10 times, the total fineness of the conductive fiber B of the core 203. If the total fineness of the piezoelectric fibers A is too small with respect to the total fineness of the conductive fiber B, there will be too few piezoelectric fibers A surrounding the conductive fiber B and the conductive fiber B will not be able to sufficiently output an electrical signal, while the conductive fiber B may potentially contact with other adjacent conductive fibers. If the total fineness of the piezoelectric fibers A is too large with respect to the total fineness of the conductive fiber B, there will be too many piezoelectric fibers A surrounding the conductive fiber B, and the braided piezoelectric element 201 will become too hard and resistant to deformation. In other words, the braided piezoelectric element 201 will fail to adequately function as a sensor in both cases.

The total fineness referred to here is the sum of all of the finenesses of the piezoelectric fibers A composing the sheath 202, and in the case of a common 8-strand braid, for example, it is the sum of the finenesses of the 8 strands.

Also, in the braided piezoelectric element 201, the fineness per piezoelectric fiber A of the sheath 202 is preferably at least ½0 times and no greater than 2 times, more preferably at least ⅟15 and no greater than 1.5 times, and even more preferably at least ⅟10 and no greater than 1 time, the total fineness of the conductive fiber B. If the fineness per piezoelectric fiber A is too small with respect to the total fineness of the conductive fiber B, there will be too few piezoelectric fibers A and the conductive fiber B will not be able to sufficiently output an electrical signal, while the piezoelectric fibers A may potentially undergo breakage. If the fineness per the piezoelectric fiber A is too large with respect to the total fineness of the conductive fiber B, the piezoelectric fibers A will be too thick and the braided piezoelectric element 201 will become too hard and resistant to deformation. In other words, the braided piezoelectric element 201 will fail to adequately function as a sensor in both cases.

Incidentally, when metal fiber is used for the conductive fiber B or when metal fiber is combined with the conductive fiber B or piezoelectric fibers A, the fineness proportion is not limited to that mentioned above. This is because according to the invention, the proportion is important from the standpoint of the contact area and coverage factor, i.e., the area and volume. For example, if the specific gravity of each of the fibers exceeds 2, the proportion of the mean cross-sectional area of the fibers is preferably the same as the fineness proportion.

It is preferred for the piezoelectric fibers A and the conductive fiber B to be as closely bonded as possible, but for improved adhesiveness, an anchor layer or adhesive layer may be provided between the conductive fiber B and the piezoelectric fibers A.

The covering method employed is a method of using the conductive fiber B as the core thread and coiling the piezoelectric fibers A in a braided fashion around it. The form of the braid of the piezoelectric fibers A, however, is not particularly restricted so long as an electrical signal can be outputted in response to stress produced by an applied load, but it is preferably an 8-strand braid or a 16-strand braid with the core 203.

The form of the conductive fiber B and the piezoelectric fibers A is not particularly restricted, but they are preferably as nearly concentric as possible. When a multifilament is used as the conductive fiber B, the piezoelectric fibers A need only be covering in a manner so that at least a portion of the surface of the multifilament of the conductive fiber B (the peripheral surface of the fiber) is contacting, and the piezoelectric fibers A may cover either all, or less than all, of the filament surfaces (peripheral surfaces of the fibers) of the multifilament. The covering state of the piezoelectric fibers A on each filament in the interior forming the multifilament of the conductive fiber B may be set as appropriate, in consideration of performance and handleability of the piezoelectric element.

(Conductive Layer)

The conductive layer 204 can simultaneously exhibit a function as an electrode serving as the counter electrode for the conductive fiber of the core 203, and a function as a shield to block the conductive fiber of the core 203 from external electromagnetic waves and minimize noise signals generated in the conductive fiber of the core 203. Since the conductive layer 204 is to function as a shield, it is preferably grounded (connected to the earth or a grounded electronic circuit). Thus, it is possible to significantly increase the S/N ratio (signal-to-noise ratio) of the fabric-like piezoelectric element 207 even without layering a conductive fabric as an electromagnetic shield above and below the fabric-like piezoelectric element 207, for example. The state of the conductive layer 204 may be a coating, or a film, fabric or fiber coil, or even a combination of these.

A coating used to form the conductive layer 204 need only include a substance that exhibits conductivity, and various publicly known substances may be used. Examples include metals, conductive polymers or polymers dispersing conductive fillers.

When the conductive layer 204 is to be formed by coiling a film, the film used is obtained by forming a film of a conductive polymer and a polymer dispersing a conductive filler, or the film used may have a conductive layer formed on the surface.

When the conductive layer 204 is to be formed by coiling a fabric, the fabric used has the conductive fiber 206 described below as the constituent component.

When the conductive layer 204 is to be formed by coiling a fiber, the method of coiling may be as a cover ring, knitted fabric, braid or the like. The fiber used is a conductive fiber 206, and the conductive fiber 206 may be of the same type as the conductive fiber B mentioned above or a different type of conductive fiber. Examples for the conductive fiber 206 include metal fibers, fibers made of conductive polymers, carbon fibers, fibers made of polymers dispersing fibrous or granular conductive fillers, or fibers forming a layer with conductivity on the surface of a fibrous substance. The method of forming a layer with conductivity on the surface of a fibrous substance may be metal coating, conductive polymer coating or conductive fiber coiling. Metal coating is preferred among these from the viewpoint of conductivity, durability, flexibility and the like. The specific method of coating a metal may be vapor deposition, sputtering, electrolytic plating, electroless plating or the like, with plating being preferred from the viewpoint of productivity. Fibers metal-plated in this manner may be considered to be metal-plated fibers.

The base fiber coated with a metal may be a publicly known fiber, regardless of whether it has or lacks conductivity, examples of which include synthetic fibers such as polyester fiber, nylon fiber, acrylic fiber, polyethylene fiber, polypropylene fiber, vinyl chloride fiber, aramid fiber, polysulfone fiber, polyether fiber and polyurethane fiber, as well as natural fibers such as cotton, hemp and silk, semisynthetic fibers such as acetate, and regenerated fibers such as rayon and cupra. The base fiber is not limited to these, and any publicly known fiber may be used, or combinations of these fibers may be used.

The metal to be coated onto the base fiber may be any type that exhibits conductivity and exhibits the effect of the invention. Examples to be used include gold, silver, platinum, copper, nickel, tin, zinc, palladium, indium tin oxide, copper sulfide and the like, as well as their mixtures and alloys.

When an organic fiber coated with a metal with bending resistance is used as the conductive fiber 206, the conductive fiber is very highly unlikely to break, and the durability and safety of a sensor using the piezoelectric element will be excellent.

The conductive fiber 206 may be a multifilament consisting of a bundle of multiple filaments, or a monofilament consisting of a single filament. A multifilament is preferred from the viewpoint of long-term stability of the electrical characteristics. In the case of a monofilament (including spun yarn), the monofilament diameter is 1 μm to 5000 μm and preferably 2 μm to 100 μm. It is more preferably 3 μm to 50 μm. In the case of a multifilament, the number of filaments is preferably from 1 to 100,000, more preferably 5 to 500 and even more preferably 10 to 100.

If the diameter of the fiber is small the strength will be reduced and handling may become difficult, while if the diameter is large there may be some sacrifice of flexibility. The cross-sectional shape of the conductive fiber 206 is preferably circular or elliptical from the viewpoint of design and production of the piezoelectric element, but this is not limitative.

Moreover, lower electrical resistance is preferred for an increased effect of suppressing noise signals, the volume resistivity being preferably no greater than $10^{-1}$ Ω·cm, more preferably no greater than $10^{-2}$ Ω·cm and even more preferably no greater than $10^{-3}$ Ω·cm. However, the resistivity is not limited to this range so long as the effect of suppressing noise signals can be obtained.

For use according to the present invention, the conductive fiber 206 must be resistant to movements such as repeated bending and twisting. As one indicator of such a property, a larger knot tenacity is preferred. The knot tenacity can be measured by the method of JIS L1013 8.6. The degree of knot tenacity suitable for the invention is preferably 0.5 cN/dtex or greater, more preferably 1.0 cN/dtex or greater, even more preferably 1.5 cN/dtex or greater and most preferably 2.0 cN/dtex or greater. As another indicator, low flexural rigidity is preferred. Flexural rigidity is generally measured with a measuring apparatus such as a KES-FB2 Pure Bending Tester by Kato Tech Corp. The degree of flexural rigidity suitable for the invention is preferably lower than that of the carbon fibers TENAX® HTS40-3K by Toho Tenax Co., Ltd. Specifically, the flexural rigidity of the conductive fiber is preferably no greater than $0.05 \times 10^{-4}$ $N \cdot m^2/m$, more preferably no greater than $0.02 \times 10^{-4}$ $N \cdot m^2/m$ and even more preferably no greater than $0.01 \times 10^{-4}$ $N \cdot m^2/m$.

This may also be considered to be a condenser-type piezoelectric element, sandwiching a piezoelectric polymer (dielectric material) with the conductor of the core and the conductor of the electromagnetic shield layer as two electrodes. In order to effectively extract the polarization generated in the piezoelectric structure by deformation, the value of the insulation resistance between the electrodes is preferably 1 MΩ or greater, more preferably 10 MΩ or greater and even more preferably 100 MΩ or greater, when measured with a direct-current voltage of 3 V. The equivalent serial resistance value Rs and the equivalent serial capacity value Cs, obtained by analyzing the response upon application of an alternating current voltage of 1 MHz between the electrodes, are also preferably within specific ranges, in order to effectively extract the polarization generated in the piezoelectric structure by deformation, and to improve responsiveness. In other words, the Rs value is preferably between 1 μΩ and 100 kΩ, more preferably between 1 mΩ and 10 kΩ and even more preferably between 1 μΩ and 1 kΩ, and the Cs value is preferably between 0.1 pF and 1000 pF, more preferably between 0.2 pF and 100 pF and even more preferably between 0.4 pF and 10 pF, as the value divided by the length (cm) in the central axis direction of the piezoelectric structure.

As mentioned above, when the element comprising the piezoelectric fibers A and electrodes is operatable in the preferred state, the equivalent serial resistance value Rs and the equivalent serial capacity value Cs, obtained by analyzing the response upon application of an alternating current voltage of 1 MHz between the electrodes, are preferably within the prescribed ranges, and these values are preferably used for examination of the braided piezoelectric element. The piezoelectric structure can also be examined by not only the Rs and Cs values obtained by analysis with an alternating current voltage, but also by examining the braided piezoelectric element based on analysis of its transient response to voltage.

(Protective Layer)

A protective layer may also be provided on the outer surface of the braided piezoelectric element 201 of the invention. The protective layer preferably has an insulating property, and from the viewpoint of flexibility it is more preferably composed of a polymer. When the protective layer is given an insulating property, naturally the protective layer will also be deformed and the protective layer will be rubbed, and there are no particular restrictions so long as the external force reaches the piezoelectric fibers A and can induce polarization. The protective layer is not limited to being formed by coating of the polymer or the like, and it may instead be a coiled film, fabric, fiber or the like, or a combination of these.

The thickness of the protective layer is as small as possible to facilitate transmission of shearing stress to the piezoelectric fibers A, but if it is too small, problems may be caused such as breakdown of the protective layer itself, and it is therefore preferably 10 nm to 200 μm, more preferably 50 nm to 50 μm, even more preferably 70 nm to 30 μm and most preferably 100 nm to 10 μm. The shape of the piezoelectric element may also be created by the protective layer.

In addition, a plurality of layers made of piezoelectric fibers may be provided, or a plurality of layers made of conductive fibers for signal extraction may be provided. Naturally, the number and order of the protective layer, the layer made of piezoelectric fibers and the layer made of conductive fibers may be determined as appropriate according to the purpose. The coiling method may be a method of additionally forming a braid structure over the outer layer of the sheath 202, or a method of forming a cover ring.

The braided piezoelectric element 201 of the invention can detect deformation or stress utilizing the electrical signal output based on the piezoelectric effect described above, and by calculating the change in electrostatic capacitance between the conductive fiber B of the core of the braided piezoelectric element 201, and the conductive layer 204, it can detect deformation caused by pressure applied to the braided piezoelectric element 201. Furthermore, when multiple braided piezoelectric elements 201 are used in combination, the change in electrostatic capacitance between the conductive layers 204 of each of the braided piezoelectric elements 201 may be calculated to detect deformation caused by pressure applied to the braided piezoelectric element 201.

(Insulating Fibers)

In the fabric-like piezoelectric element 207, insulating fibers may also be used at sections other than the braided piezoelectric element 201 (and conductive fibers 210). In this case, the insulating fibers used may be fibers of a material and shape that are stretchable, in order to improve the flexibility of the fabric-like piezoelectric element 207.

By situating insulating fibers in this manner at sections other than the braided piezoelectric element 201 (and conductive fibers 210), it is possible to increase the operativity of the fabric-like piezoelectric element 207 (for example, the ease of movement for a wearable sensor).

Such insulating fibers that are used need only have a volume resistivity of $10^6$ Ω·cm or greater, but it is more preferably $10^8$ Ω·cm or greater and even more preferably 1010 Ω·cm or greater.

Examples of insulating fibers to be used include synthetic fibers such as polyester fiber, nylon fiber, acrylic fiber, polyethylene fiber, polypropylene fiber, vinyl chloride fiber, aramid fiber, polysulfone fiber, polyether fiber and polyurethane fiber, as well as natural fibers such as cotton, hemp and silk, semisynthetic fibers such as acetate, and regenerated fibers such as rayon and cupra. There is no restriction to these, however, and any publicly known insulating fibers may be used as desired. These insulating fibers may also be used in combination, or combined with fibers having no insulating property to form fibers with an overall insulating property.

Fibers with various publicly known cross-sectional shapes may also be used.

(Production Method)

The braided piezoelectric element 201 of the invention has the surface of at least one conductive fiber B covered by the braided piezoelectric fibers A. and the method for its production may be the following, for example. That is, it may be a method of preparing the conductive fiber B and the piezoelectric fibers A in separate steps, and coiling the piezoelectric fibers A in braided form around the conductive fiber B to cover it. In this case, the covering is preferably carried out as nearly concentrically as possible.

The preferred spinning and stretching conditions, when using polylactic acid as the piezoelectric polymer forming the piezoelectric fibers A, is a melt spinning temperature of preferably 150° C. to 250° C., a stretching temperature of preferably 40° C. to 150° C., a draw ratio of preferably 1.1 to 5.0 and a crystallization temperature of preferably 80° C. to 170° C.

The piezoelectric fibers A to be used by coiling around the conductive fiber B may be multifilaments consisting of bundles of multiple filaments, or monofilaments (including spun yarn). The conductive fiber B around which the piezoelectric fibers A are to be coiled may also be a multifilament consisting of bundles of multiple filaments, or a monofilament (including spun yarn).

The preferred manner of covering is to use the conductive fiber B as the core thread and braid the piezoelectric fibers A around its periphery in a braided form to prepare a tubular braid to cover it. More specifically, this may be an 8-strand braid or 16-strand braid with the core 203. However, the piezoelectric fibers A may be in the form of a braided tube, for example, with the conductive fiber B as the core inserted in the braided tube to cover it.

The conductive layer 204 is produced by coating or fiber coiling, but fiber coiling is preferred from the viewpoint of facilitating production. The method of fiber coiling may be a cover ring, knitted fabric or braid, and the production may employ any method.

By the production method described above it is possible to obtain a braided piezoelectric element 201 having the surface of the conductive fiber B covered with the braided piezoelectric fibers A, and further having the conductive layer 204 around its periphery.

The relationship between the diameter of the core and the thickness of the layer composed of the piezoelectric fibers (sheath) is extremely important for the braided piezoelectric element of the invention. The piezoelectric element of the invention is used directly in fiber form or woven or knitted into a fabric, but short circuiting can potentially occur between the core signal wire and the shield layer (conductive layer) during use or during processing. As a result of ardent research, the present inventors found that the radius Rc of the core and the thickness d of the layer composed of the piezoelectric fibers must be in the relationship: d/Rc≥1.0.

Assuming that when the braided piezoelectric element is bent at a curvature R, the center of the element bends along a reference line, the deformation rate of the core surface is represented as:

$$(R+Rc)/R.$$

For example, when the curvature radius R=2 mm and Rc=0.2 mm, the deformation rate is 1.1, elongating by 10% as outside bending and contracting by 10% as inside bending. When this takes place, the braided groups of the layer composed of the braided piezoelectric fibers may be disturbed and short circuiting may occur between the layer forming the shield layer and the signal wire of the core. In order to prevent short circuiting between the shield layer and the signal wire of the core even when the layer composed of the piezoelectric fibers is disturbed by deformation, it is necessary for the thickness of the layer composed of the piezoelectric fibers to satisfy the following condition in relation to the core.

Deformation of the core surface of the braided piezoelectric element is preferably limited to about 20% in practice, and therefore the curvature radius is also almost unambiguously determined, in practice, by the thickness of the core. Thus it may be said that the thickness of the layer composed of the piezoelectric fibers is also almost unambiguously determined, in order to avoid short circuiting in such cases. That is, preferably Rc>R/20, and more preferably Rc>R/10. In addition, d/Rc is preferably 1.0 or greater, more preferably 1.2 or greater and even more preferably 1.5 or greater.

The layer composed of the piezoelectric fibers may also have the piezoelectric fibers layered several times. Having several layers will tend to prevent short circuiting even with the same thickness, and with n layers, the value of d/Rc×n is preferably 0.8 or greater, more preferably 1.0 or greater and even more preferably 1.2 or greater.

While a larger thickness is preferred for the layer composed of the piezoelectric fibers from the viewpoint of short circuiting, a smaller thickness will result in better handleability of the braided piezoelectric element, and therefore the shield layer is preferably thin.

Figures 1, 11:
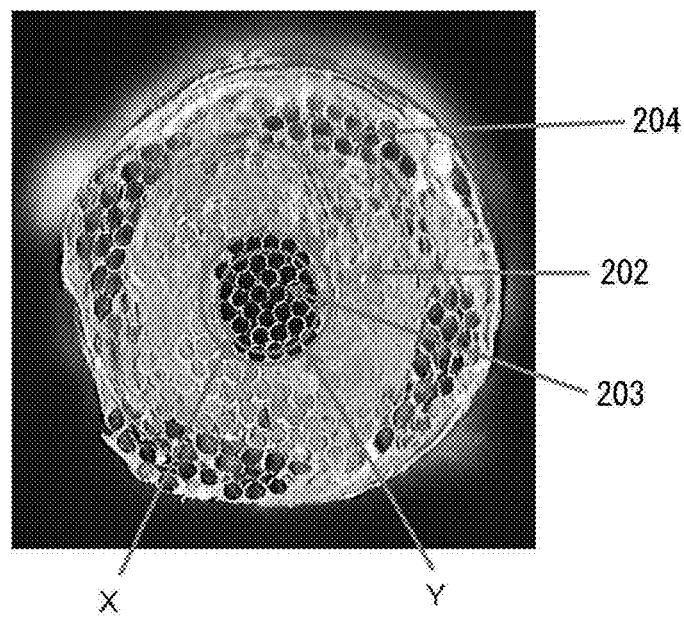
Figures 2, 11:
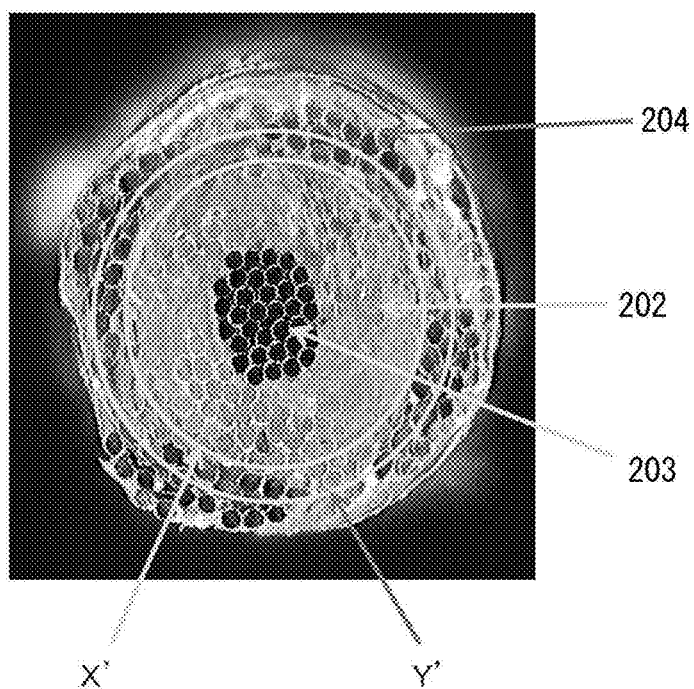

The radius Rc of the core of the braided piezoelectric element and the thickness d of the layer composed of the piezoelectric fibers are calculated in the following manner from a microscope photograph of a cross-section, as shown in FIG. 11. For observation of the cross-section, the braided piezoelectric element is impregnated with the low-viscosity rapid bonding adhesive "AronAlpha EXTRA2000" (ToaGosei Co., Ltd.) which is allowed to solidify, and then a cross-section is cut out perpendicular to the long axis of the braid and a cross-sectional photograph is taken. As shown in FIG. 11-1, the radius Rc of the core is the average value of the radius of the maximum circle X consisting of the core fiber bundle alone, and the radius of the minimum circle Y that completely encompasses the fiber bundle. As shown in FIG. 11-2, the thickness d of the layer composed of the piezoelectric fibers is the value obtained by subtracting the radius Rc of the core from the average value of the radius of the maximum circle X' consisting of only the fiber bundle of piezoelectric fibers that include the core, and the radius of the minimum circle Y' that completely encompasses the fiber bundle.

(Fabric-Like Piezoelectric Element)

Figure 12:
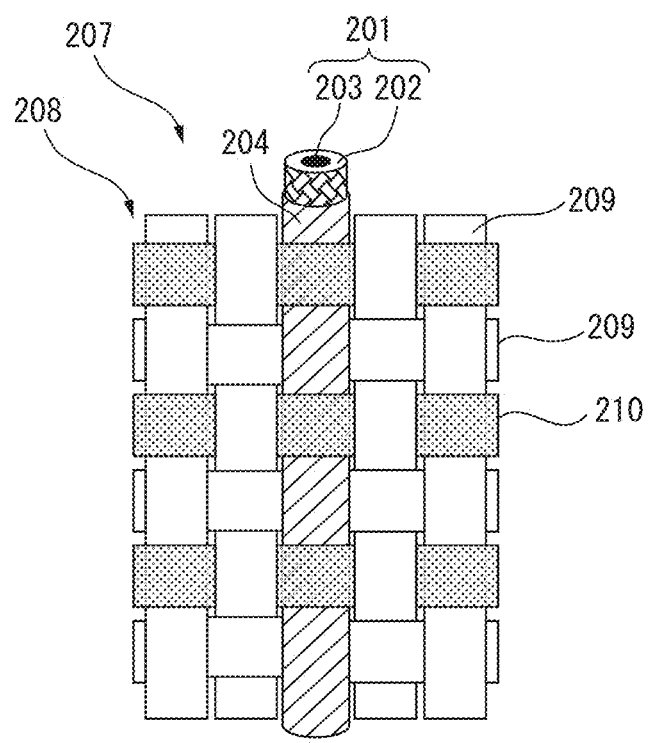
FIG. 12 is a schematic diagram showing an example of the construction of a fabric-like piezoelectric element according to an embodiment of the second invention.

FIG. 12 is a schematic diagram showing an example of the construction of a fabric-like piezoelectric element using a braided piezoelectric element according to an embodiment.

The fabric-like piezoelectric element 207 comprises a fabric 208 including at least one braided piezoelectric element 201. The fabric 208 may be any type of woven or knitted fabric wherein at least one of the fibers (including braids) composing the fabric is a braided piezoelectric element 201, with no particular limitation so long as the braided piezoelectric element 201 can exhibit the function of a piezoelectric element. For a fabric, union weaving, mixed knitting or the like may be carried out with other fibers (including braids), so long as the object of the invention is achieved. Naturally, the braided piezoelectric element 201 may be used as a portion of fibers composing a fabric (for example, warp thread or weft thread), or the braided piezoelectric element 201 may be embroidered or bonded with a fabric. In the example shown in FIG. 12, the fabric-like piezoelectric element 207 is a plain weave fabric having at least one braided piezoelectric element 201 and insulating fibers 209 arranged as warp thread and the conductive fibers 210 and insulating fibers 209 alternately arranged as weft thread. The conductive fibers 210 may be of the same type as the conductive fiber B or a different type of conductive fiber, and the insulating fibers 209 are as described below. All or some of the insulating fibers 209 and/or conductive fibers 210 may also be in braided form.

In this case, when the fabric-like piezoelectric element 207 has deformed by bending or the like, the braided piezoelectric element 201 also deforms in a manner following that deformation, and the deformation of the fabric-like piezoelectric element 207 can be detected by the electrical signal outputted from the braided piezoelectric element 201. Furthermore, since the fabric-like piezoelectric element 207 can be used as a fabric (woven or knitted fabric), it can be applied as a wearable sensor in the form of clothing, for example.

In addition, in the fabric-like piezoelectric element 207 shown in FIG. 12, the conductive fibers 210 are in crossing contact with the braided piezoelectric element 201. Therefore, the conductive fibers 210 are in crossing contact with at least portions of the braided piezoelectric element 201, covering it, thereby blocking at least some of the electromagnetic waves directed toward the braided piezoelectric element 201 from the exterior. The conductive fibers 210 are grounded (earthed) so as to have a function of reducing the effects of electromagnetic waves on the braided piezoelectric element 201. That is, the conductive fibers 210 can function as an electromagnetic shield for the braided piezoelectric element 201. Thus, it is possible to significantly increase the S/N ratio of the fabric-like piezoelectric element 207 even without layering a conductive fabric as an electromagnetic shield above and below the fabric-like piezoelectric element 207, for example. In this case, the proportion of conductive fibers 210 in the weft thread crossing with the braided piezoelectric element 201 (in the case of FIG. 12) is preferably higher from the viewpoint of electromagnetic shielding. Specifically, at least 30%, more preferably at least 40% and even more preferably at least 50% of the fibers forming the fabric 208 and crossing with the braided piezoelectric element 201, are conductive fibers. In this type of fabric-like piezoelectric element 207, conductive fibers may be inserted for at least some of the fibers composing the fabric, to allow an electromagnetic wave shield-bearing fabric-like piezoelectric element 207 to be obtained.

Examples for the woven texture of the woven fabric include the three foundational types of weaves: plain weave, twill weave and satin weave, half-double weaves such as derivative weave, warp backed weave and weft backed weave, and warp velvet weaves. The type of knitted fabric may be a circular knit fabric (weft knitted fabric) or a warp knitted fabric. Examples of preferred textures of circular knit fabrics (weft knitted fabrics) include plain stitch, rib stitch, interlock stitch, purl stitch, tuck stitch, float stitch, rib-and-tuck stitch, lace stitch and plating stitch. Examples of warp braid stitches include single denbigh stitch, single atlas stitch, double cord stitch, half-tricot stitch, lined stitch and jacquard stitch. It may consist of a single layer, or a multilayer with two or more layers. Alternatively, it may be a plush weave or plush stitch, composed of nap sections and ground weave sections comprising cut piles and/or loop piles.

(Multiple Piezoelectric Elements)

Multiple braided piezoelectric elements 201 may also be used in an arrangement in the fabric-like piezoelectric element 207. The manner of arrangement may be, for example, using the braided piezoelectric element 201 for all of the warp thread or weft thread, or the braided piezoelectric elements 201 may be used for several groups or sections thereof. Also, braided piezoelectric elements 201 may be used as warp threads at certain sections and braided piezoelectric elements 201 used as weft threads at other sections.

When a plurality of braided piezoelectric elements 201 are arranged to form the fabric-like piezoelectric element 207, an advantage is afforded as the manner of arrangement and manner of knitting may be selected within a wide range, since the braided piezoelectric elements 201 lack electrodes on the surface.

When a plurality of braided piezoelectric elements 201 are arranged, electrical signals can be efficiently extracted because the distance between the conductive fibers B is short.

(Technology for Use of Piezoelectric Element)

The piezoelectric element of the invention in any desired form, such as the braided piezoelectric element 201 or fabric-like piezoelectric element 207, can output contact, pressure and shape deformation on the surface as an electrical signal, and therefore it can be utilized as a sensor (device) that detects the size of stress and/or the location of stress applied to the piezoelectric element. In addition, the electrical signal can be used as a power generating element, to serve as an electric power source to drive another device, or for storage. Specifically, this may include electric power generation by use at movable parts that autonomously move, such as those of a human, animal, robot or machine, electric power generation on the surface of a structure subjected to pressure from a shoe sole, mat or exterior, and electric power generation by shape deformation in a fluid. For generation of an electrical signal by shape deformation in a fluid, an electrostatic substance in a fluid may be adsorbed, or its adhesion inhibited.

FIG. 6 is a block diagram showing a device 111 comprising a piezoelectric element 112 of the invention. The device 11 comprises a piezoelectric element 112 (e.g. a braided piezoelectric element 201 or fabric-like piezoelectric element 207), and optionally also an electrical circuit having amplification means 113 that amplifies an electrical signal outputted from the piezoelectric element 112 in response to applied pressure, output means 114 that outputs the electrical signal amplified at the optional amplification means 113, and transmission means 115 that transmits the electrical signal outputted from the output means 114 to an external device (not shown). By using the device 111, it is possible to detect the size and/or applied location of stress applied to a piezoelectric element, by computation processing at an external device (not shown), based on an electrical signal outputted by contact, pressure or shape deformation on the surface of a piezoelectric element 112.

The optional amplification means 113, output means 114 and transmission means 115 may consist of a software program, for example, or they may consist of a combination of different electronic circuits and a software program. For example, a software program may be installed in a computation processing device (not shown), and the computation processing device operated according to the software program to carry out the various functions. Alternatively, the optional amplification means 113, output means 114 and transmission means 115 may be semiconductor integrated circuits having software programs written in them for the various functions. Incidentally, the transmission system using transmission means 115 may be either wireless or wired, determined as appropriate depending on the sensor to be constructed. Alternatively, computing means (not shown) may be provided in the device 111, that computes the size and/or applied location of stress applied to the piezoelectric element 112, based on the electrical signal outputted from the output means 114.

Instead of the amplification means alone, it may also be used in combination with publicly known signal processing means, such as noise-canceling means or means for combined processing with other signals. The order of connection of such means may be modified as appropriate depending on the purpose. Naturally, the electrical signal outputted from the piezoelectric element 112 may be subjected to signal processing after being directly transmitted to an external device.

Figure 13:
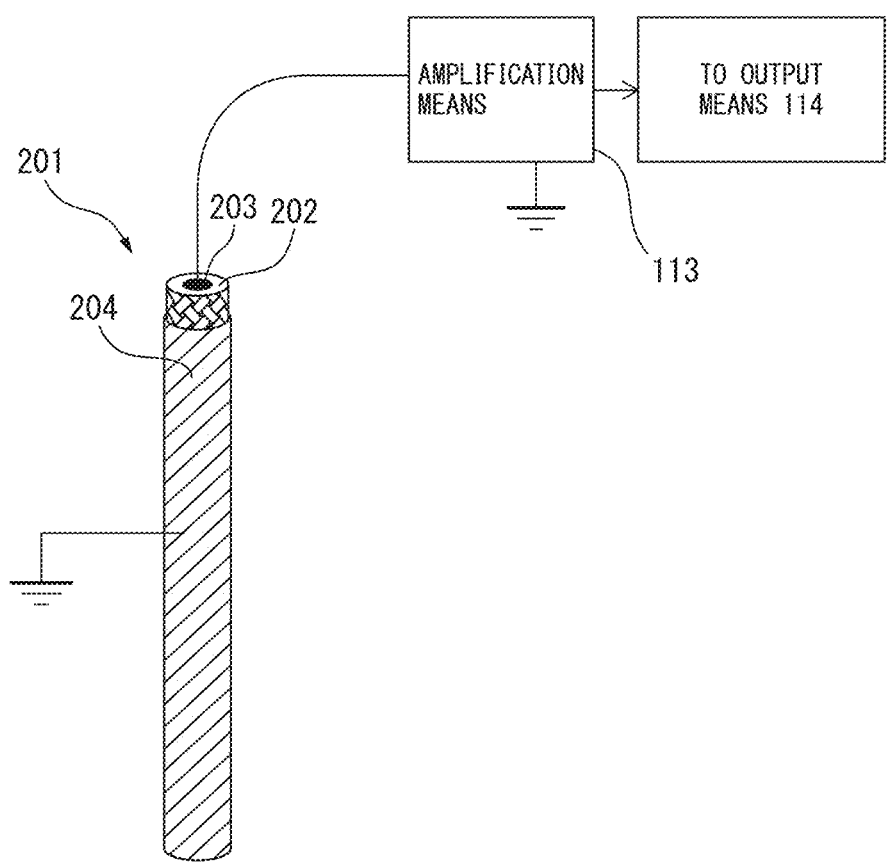
FIG. 13 is a schematic diagram showing an example of the construction of a device comprising a braided piezoelectric element according to an embodiment of the second invention.

FIG. 13 is a schematic diagram showing an example of the construction of a device comprising a braided piezoelectric element according to an embodiment. The amplification means 113 of FIG. 13 corresponds to the one explained with reference to FIG. 6, although the illustration in FIG. 13 omits the output means 114 and transmission means 115 shown in FIG. 6. When a device is constructed comprising a braided piezoelectric element 201, a lead wire may be connected from the core 203 of the braided piezoelectric element 201 to an input terminal of the amplification means 113, while the conductive layer 204 of the braided piezoelectric element 201 is connected to a ground (earth) terminal. For example, as shown in FIG. 13, in the braided piezoelectric element 201, a lead wire from the core 203 of the braided piezoelectric element 201 is connected to the input terminal of the amplification means 113, and the conductive layer 204 of the braided piezoelectric element 201 is grounded (earthed).

Figure 14:
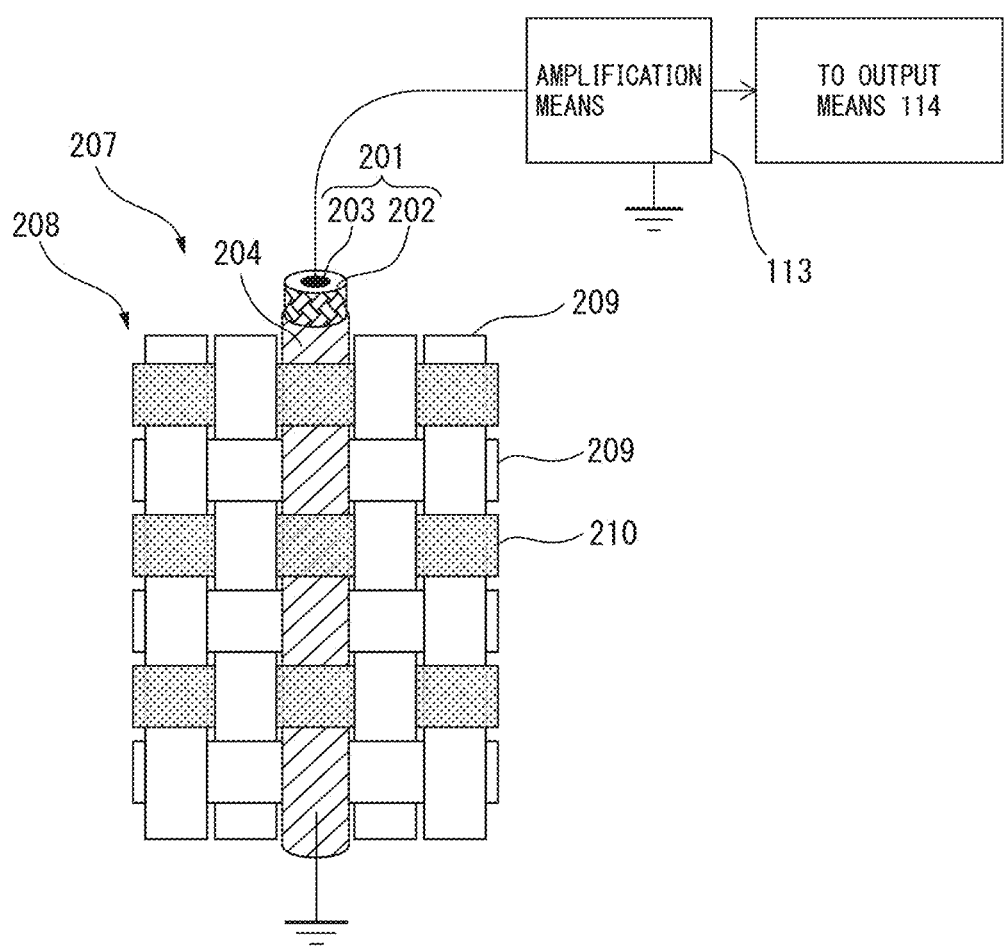
FIG. 14 is a schematic diagram showing an example of the construction of a device comprising a fabric-like piezoelectric element according to an embodiment of the second invention.
Figure 15:
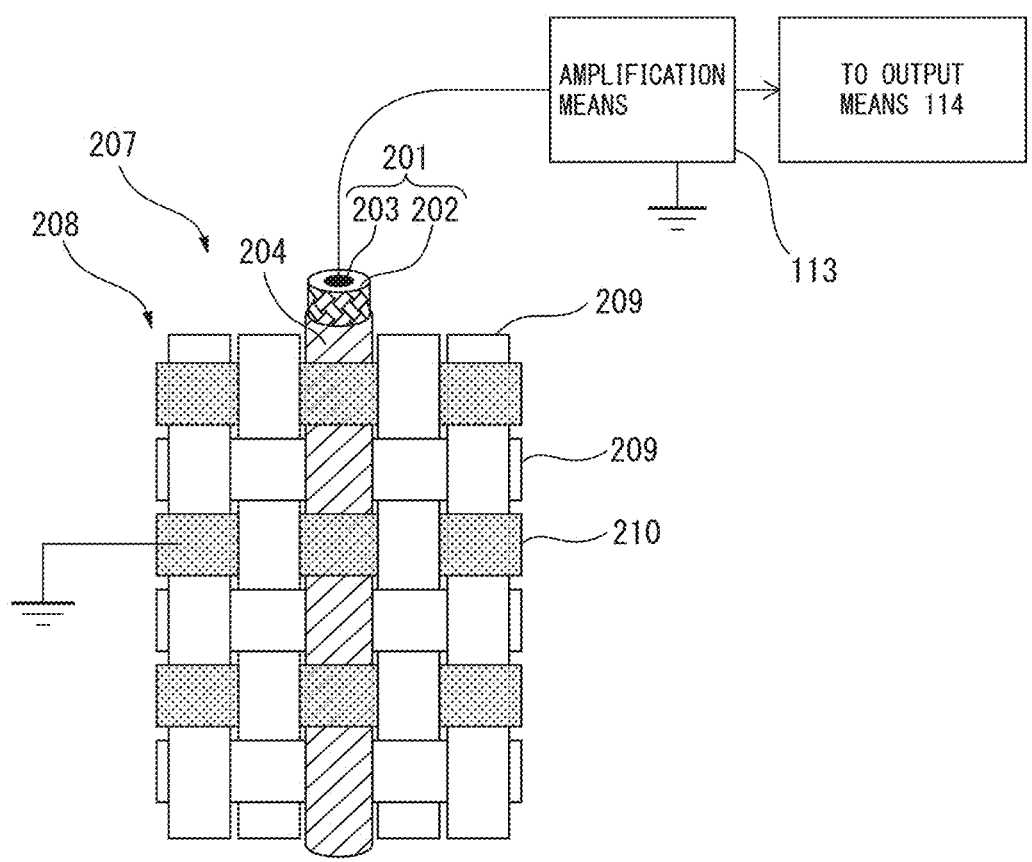
FIG. 15 is a schematic diagram showing another example of the construction of a device comprising a fabric-like piezoelectric element according to an embodiment of the second invention.
Figure 16:
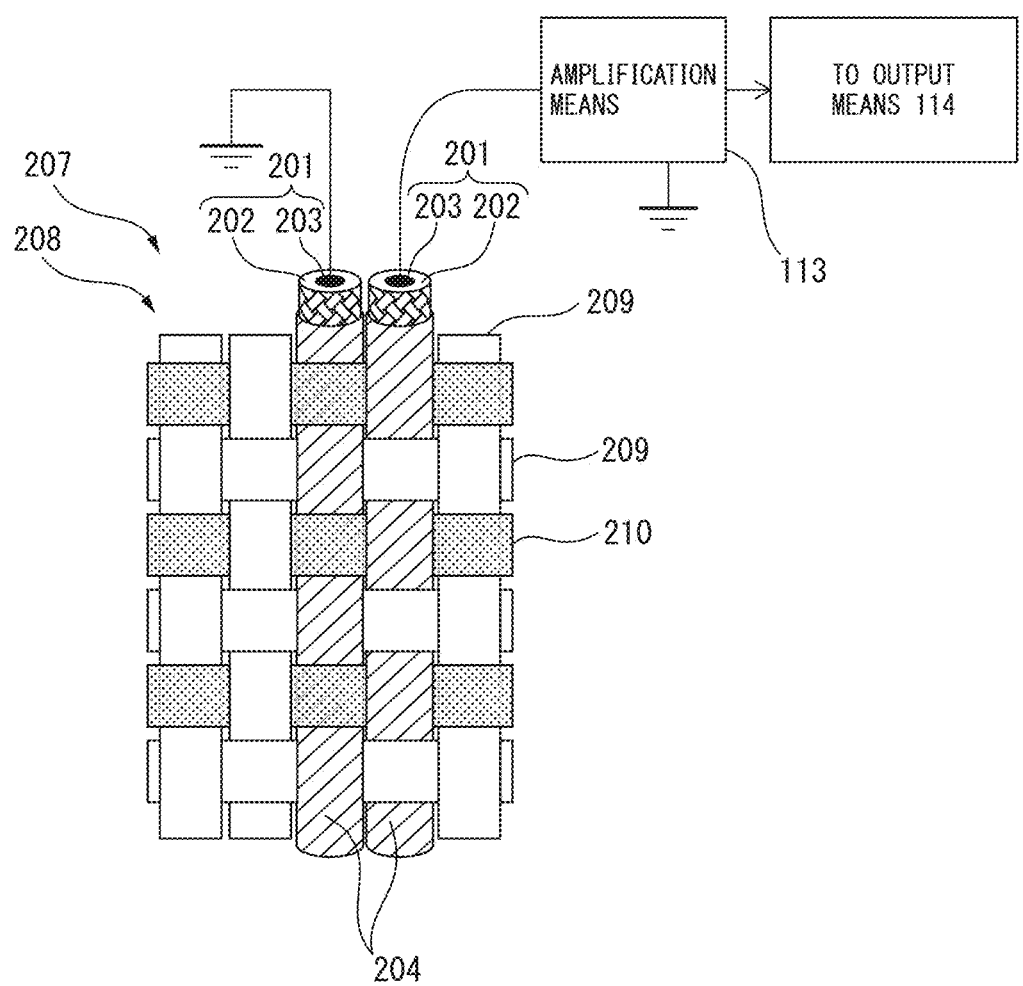
FIG. 16 is a schematic diagram showing another example of the construction of a device comprising a fabric-like piezoelectric element according to an embodiment of the second invention.

FIGS. 14 to 16 are schematic diagrams showing examples of the construction of a device comprising a braided fabric-like piezoelectric element according to an embodiment. The amplification means 113 in each of FIGS. 14 to 16 corresponds to the one explained with reference to FIG. 6, although the illustrations in FIGS. 14 to 16 omit the output means 114 and transmission means 115 shown in FIG. 6. When a device is constructed comprising the fabric-like piezoelectric element 207, a lead wire may be connected from the core 203 of the braided piezoelectric element 201 (formed of the conductive fiber B) to an input terminal of the amplification means 113, while the conductive layer 204 of the braided piezoelectric element 201, or the conductive fiber 210 of the fabric-like piezoelectric element 207, or a braided piezoelectric element that is separate from the braided piezoelectric element 201 connected to the input terminal of the amplification means 113, is connected to a ground (earth) terminal. For example, as shown in FIG. 14, in the fabric-like piezoelectric element 207, a lead wire from the core 203 of the braided piezoelectric element 201 is connected to the input terminal of the amplification means 113, and the conductive layer 204 of the braided piezoelectric element 201 is grounded (earthed). Moreover, in the fabric-like piezoelectric element 207 shown in FIG. 15, for example, a lead wire from the core 203 of the braided piezoelectric element 201 is connected to the input terminal of the amplification means 113, and the conductive fibers 210 contacting with the braided piezoelectric element 201 in a crossing manner are grounded (earthed). Alternatively, when multiple braided piezoelectric elements 201 are arranged in the fabric-like piezoelectric element 207 as shown in FIG. 16, for example, a lead wire from the core 203 of one braided piezoelectric element 201 is connected to the input terminal of the amplification means 113, while a lead wire from the core 203 of another braided piezoelectric element 201 alongside the braided piezoelectric element 201 is grounded (earthed).

When deformation is produced in the central axis direction of the braided piezoelectric element 201, the piezoelectric fibers A deform, generating polarization. As the positive and negative electrical charges generated by polarization of the piezoelectric fibers A become aligned, electrical charge migration takes place on the lead wire from the conductive fiber B that forms the core 203 of the braided piezoelectric element 201. The electrical charge migration on the lead wire from the conductive fiber B appears as the flow of a minute electrical signal (i.e., current). The amplification means 113 amplifies the electrical signal, the output means 114 outputs the electrical signal amplified by the amplification means 113, and the transmission means 115 transmits the electrical signal outputted from the output means 114 to an external device (not shown).

Since the device 111 of the invention is flexible and may be used in any form such as braided or fabric-like, it has a very wide range of potential uses. Specific examples for the device 111 of the invention may be clothing that includes caps, gloves and socks, touch panels in the form of supporters or handkerchiefs, and surface pressure-sensitive sensors for humans or animals, such as sensors that detect bending, twisting or stretching of the joint sections of gloves or bands or supporters, for example. When used for a human, for example, it may be used as an interface for detection of contact or movement and collection of data regarding movement of a joint being used for medical purposes, or for amusement, or for movement of lost tissue or a robot. In addition, it may be used as a surface pressure-sensitive sensor in a stuffed doll simulating an animal or human form, or a robot, or as a sensor for sensing of bending, twisting or stretching of joints. It may still further be used as a surface pressure-sensitive sensor or shape deformation sensor in beddings such as sheets or pillows, shoe soles, gloves, chairs, mats, bags, flags or the like.

In addition, since the device 111 of the invention is in braided or fabric form and is flexible, it may be used as a surface pressure-sensitive sensor or shape deformation sensor by attachment or covering on the surface of all or portions of various structures.

Furthermore, since the device 111 of the invention can generate a sufficient electrical signal simply by rubbing the surface of the braided piezoelectric element 201, it can be used in touch input devices such as touch sensors, or in pointing devices. Moreover, since positional information and shape information in the height direction of an object to be measured can be obtained by rubbing the surface of the object to be measured with the braided piezoelectric element 201, it can be used in surface form measurement and the like.

The third invention will now be explained in detail.

(Braided Piezoelectric Element)

In the braided piezoelectric element of the third invention, the piezoelectric polymer in the structure of the first invention is arranged in a circular tubular manner, and is used as an element wherein a conductor composed of conductive fiber is disposed at a location on the central axis of the circular tubular shape, with the piezoelectric polymer being arranged in a manner braided around the conductive fiber, as piezoelectric fibers. The braided piezoelectric element of the third invention will now be described in detail.

FIG. 10 is a schematic diagram showing an example of the construction of a braided piezoelectric element according to an embodiment.

The braided piezoelectric element 201 comprises a core 203 formed of a conductive fiber B, a sheath 202 formed of braided piezoelectric fibers A covering the core 203, and a conductive layer 204 covering the sheath 202. The conductive layer 204 simultaneously has a function as an electrode serving as the counter electrode for the conductive fiber of the core 203, and a function as a shield to block the conductive fiber of the core 203 from external electromagnetic waves and minimize noise signals generated in the conductive fiber of the core 203.

The coverage factor of the sheath 202 by the conductive layer 204 is preferably 25% or greater. The coverage factor referred to here is the ratio of the area of the conductive substance 205 in the conductive layer 204 when the conductive layer 204 is projected onto the sheath 202, and the surface area of the sheath 202, the value being preferably 25% or greater, more preferably 50% or greater and even more preferably 75% or greater. If the coverage factor of the conductive layer 204 is less than 25%, the noise signal reducing effect may not be adequately exhibited. When the conductive substance 205 is not exposed on the surface of the conductive layer 204, such as when fibers encapsulating the conductive substance 205 are used as the conductive layer 204 to cover the sheath 202, the ratio of the area of the fibers projected onto the sheath 202 and the surface area of the sheath 202 may be used as the coverage factor.

The conductive substance 205 is the conductive substance in the conductive layer 204, and any publicly known conductive substance qualifies.

In the braided piezoelectric element 201, a plurality of piezoelectric fibers A are closely coiled around the outer peripheral surface of at least one conductive fiber B. It is surmised that when deformation is produced in the braided piezoelectric element 201, stress is produced in each of the piezoelectric fibers A by the deformation, producing an electric field in each of the piezoelectric fibers A (piezoelectric effect), and as a result a voltage change takes place in the conductive fiber B, superimposed on the electric field of the plurality of piezoelectric fibers A coiled around the conductive fiber B. That is, the electrical signal from the conductive fiber B is augmented compared to when the braided sheath 202 of piezoelectric fibers A is not used. This allows a large electrical signal to be extracted with the braided piezoelectric element 201, even by stress produced by relatively small deformation. Incidentally, the conductive fiber B may also consist of a plurality of fibers.

From the viewpoint of achieving the object of the third invention, the braided piezoelectric element 201 is not particularly restricted so long as it has the construction shown in FIG. 10, but it preferably has the following construction from the viewpoint of selectively outputting a large electrical signal in response to stretching deformation in the direction of the central axis (CL in FIG. 1).

(Braided Piezoelectric Element Selectively Outputting Large Electrical Signal in Response to Stretching Deformation)

The braided piezoelectric element 201 that selectively outputs a large electrical signal in response to stretching deformation in the central axis direction may be one wherein the piezoelectric fibers A used are molded from a uniaxially oriented polymer, which is a piezoelectric polymer including, as a main component, a crystalline polymer having an absolute value of between 0.1 pC/N and 1000 pC/N for the piezoelectric constant d14 when the orientation axis is the third axis. According to the invention, "including . . . as the main component" means that the constituent component constitutes 50 mass % or greater. For the purpose of the invention, a crystalline polymer is a polymer comprising a crystalline portion at 1 mass % greater, and also comprising an amorphous portion in addition to the crystalline portion, where the mass of the crystalline polymer is its total mass including the crystalline portion and the amorphous portion. Incidentally, while different values are obtained for d14 depending on the molding conditions, purity and measuring atmosphere, according to the present invention it is sufficient if, based on measurement of the degree of crystallinity and crystal orientation of the crystalline polymer measured for the piezoelectric polymer that is actually used, the absolute value of d14 for the film is between 0.1 pC/N and 1000 pC/N at the temperature of actual use, when a uniaxially stretched film having the same degree of crystallinity and crystal orientation is fabricated using the crystalline polymer, and the crystalline polymer in the piezoelectric polymer of this embodiment is not limited to specific crystalline polymers such as those mentioned below. Measurement of d14 for a film sample may be made by a publicly known method, and for example, a sample having metal vapor deposited electrodes on both sides of the film sample may be cut out into a 4-sided rectangular shape in a direction inclined 45° from the stretching direction, and the electrical charge generated at the electrodes on both sides may be measured under a tensile load in the longitudinal direction, to measure the d14 value.

In the braided piezoelectric element 201 that selectively outputs a large electrical signal in response to stretching deformation in the central axis direction, the angle formed between the central axis direction and the direction of orientation of the piezoelectric polymer (the orientation angle θ) is between 15° and 75°. When this condition is satisfied, application of stretching deformation (tensile stress and compression stress) in the central axis direction with respect to the braided piezoelectric element 201 allows efficient utilization of the piezoelectric effect corresponding to the piezoelectric constant d14 of the crystalline polymer in the piezoelectric polymer, and allows electrical charges of opposite polarity (reverse signs) to be efficiently generated on the central axis side and the outside of the braided piezoelectric element 201. From this viewpoint, the orientation angle θ is preferably between 25° and 65°, more preferably between 35° and 55° and even more preferably between 40° and 50°. Such an arrangement of the piezoelectric polymer will cause the orientation direction of the piezoelectric polymer to manifest as a helix.

Such an arrangement of the piezoelectric polymer will also allow a braided piezoelectric element 201 to be obtained that avoids generating large electrical charge on the central axis side and the outside of the braided piezoelectric element 201 in response to shear deformation which rubs against the surface of the braided piezoelectric element 201, or to bending deformation which bends the central axis, or to twisting deformation around the central axis, or in other words, that selectively generates a large electrical charge in response to stretching in the central axis direction.

The orientation angle θ is measured by the following method when possible. A side photograph of the braided piezoelectric element 201 (corresponding to the piezoelectric structure 1 of FIG. 3) is taken, and the helical pitch HP of the piezoelectric polymer 2 is measured. As shown in FIG. 3, the helical pitch HP is the linear distance in the central axis direction that is required for one piezoelectric polymer 2 to extend from the front side around the back side and returning again to the front side. After the structure is anchored with an adhesive if necessary, a cross-section is cut out perpendicular to the central axis of the braided piezoelectric element 201 and photographed, and the outer radius Ro and inner radius Ri are measured at the portion occupied by the sheath 202. When the outer edge and inner edge of the cross-section are elliptical or flattened circular, the Ro and Ri are the average values of the long diameter and short diameter. The orientation angle θ of the piezoelectric polymer with respect to the direction of the central axis is calculated by the following formula.

$$\theta = \arctan(2\pi Rm/HP)\,(0°\leq\theta\leq90°)$$

Here, $Rm=2(Ro^3-Ri^3)/3(Ro^2-Ri^2)$, i.e., the radius of the braided piezoelectric element 201 as the weighted average based on the cross-sectional area.

When the piezoelectric polymer has a uniform surface in a side photograph of the braided piezoelectric element 201, such that the helical pitch of the piezoelectric polymer cannot be distinguished, the braided piezoelectric element 201 anchored with the adhesive is cross-cut on a plane running through the central axis, and wide-angle X-ray diffraction analysis is performed with X-ray transmission in the direction perpendicular to the cross-cut surface, in a sufficiently narrow range running through the central axis, determining the orientation direction and measuring its angle with the central axis as θ.

In the case of the braided piezoelectric element 201 of the invention, the helix manifesting along the direction of orientation of the piezoelectric polymer will sometimes consist of two or more simultaneously present helices with different helical directions (S-twisting direction or Z-twisting direction) or helical pitches, in which case each piezoelectric polymer having a different helical direction and helical pitch is measured, and the piezoelectric polymer of one helical direction and helical pitch must satisfy the aforementioned condition.

The charge polarity generated on the central axis side and the outside in response to stretching deformation in the central axis direction is mutually opposite when the direction of orientation of the piezoelectric polymer is situated along an S-twisted helix and when the direction of orientation of the piezoelectric polymer is situated along a Z-twisted helix. Therefore, if the direction of orientation of the piezoelectric polymer is situated along an S-twisted helix while also being situated along a Z-twisted helix, the charges generated in response to stretching deformation will cancel each other out in the S-twisting direction and the Z-twisting direction, which is undesirable as it will prevent efficient utilization. Therefore, the piezoelectric polymer described above includes a P-body containing a crystalline polymer with a positive piezoelectric constant d14 value as the main component and an N-body containing a crystalline polymer with a negative value as the main component, wherein for the portion of the central axis of the braided piezoelectric element 201 having a length of 1 cm, the value of T1/T2 is between 0 and 0.8 and preferably 0 to 0.5, T1 being the smaller and T2 being the larger of (ZP+SN) and (SP+ZN), where ZP is the mass of the P-body having the orientation axis wrapped in a helical fashion around the Z-twisting direction, SP is the mass of the P-body having the orientation axis wrapped in a helical fashion around the S-twisting direction, ZN is the mass of the N-body having the orientation axis wrapped in a helical fashion around the Z-twisting direction, and SN is the mass of the N-body having the orientation axis wrapped in a helical fashion around the S-twisting direction.

(Braided Piezoelectric Element Selectively Outputting Large Electrical Signal in Response to Twisting Deformation)

In the fabric-like piezoelectric element described below, it is possible to use the braided piezoelectric element that selectively outputs a large electrical signal in response to stretching deformation in the central axis direction, together with a braided piezoelectric element that selectively outputs a large electrical signal in response to twisting deformation with the central axis as the axis. The braided piezoelectric element that selectively outputs a large electrical signal in response to twisting deformation with the central axis as the axis may be one, for example, wherein the piezoelectric fibers A used are molded from a uniaxially oriented polymer, which is a piezoelectric polymer including, as a main component, a crystalline polymer having an absolute value of between 0.1 pC/N and 1000 pC/N for the piezoelectric constant d14 when the orientation axis is the third axis, similar to the case described above. In the braided piezoelectric element 201 that selectively outputs a large electrical signal in response to twisting deformation with the central axis as the axis, the angle θ formed between the central axis direction and the direction of orientation of the piezoelectric polymer (the orientation angle θ) is preferably between 0° and 40° or between 50° and 90°. When this condition is satisfied, application of twisting deformation with the central axis as the axis (torsional stress) on the braided piezoelectric element 201 allows efficient utilization of the piezoelectric effect corresponding to the piezoelectric constant d14 of the crystalline polymer in the piezoelectric polymer, and allows electrical charges of opposite polarity to be efficiently generated on the central axis side and the outside of the braided piezoelectric element 201. From this viewpoint, the orientation angle θ of the piezoelectric polymer with respect to the direction of the central axis is preferably between 0° and 35° or between 55° and 90°, more preferably between 0° and 30° or between 60° and 90°, and even more preferably between 0° and 25° or between 65° and 90°. If the orientation angle θ of the piezoelectric polymer with respect to the direction of the central axis is greater than 0° and less than 90°, the direction of orientation of the piezoelectric polymer will manifest as a helix.

Such an arrangement of the piezoelectric polymer will also allow a braided piezoelectric element 201 to be obtained that avoids generating large electrical charge on the central axis side and the outside of the braided piezoelectric element 201 in response to shear deformation which rubs against the surface of the braided piezoelectric element 201, or to bending deformation which bends the central axis, or to stretching deformation in the central axis direction, or in other words, that selectively generates a large electrical charge in response to twisting deformation around the central axis.

When the direction of orientation of the piezoelectric polymer is a helix, the helical direction (S-twisting direction or Z-twisting direction) will affect the charge polarity generated by the twisting deformation. However, the charge polarity generated in response to twisting deformation will be reversed depending on whether the orientation angle θ of the piezoelectric polymer with respect to the direction of the central axis is between 0° and 40°, or between 50° and 90°. A piezoelectric polymer including crystalline polymers with mutually different signs for d14, such as poly-L-lactic acid and poly-D-lactic acid, will also have reversed charge polarity generated in response to twisting deformation. Therefore, in order to efficiently generate electrical charges of opposite polarity on the central axis side and the outside of the braided piezoelectric element 201 in response to twisting deformation, preferably a piezoelectric polymer including only crystalline polymers with the same sign for d14 as the main component is used, so that the orientation angle θ of the piezoelectric polymer with respect to the direction of the central axis of the braided piezoelectric element 201 is limited to being only between 0° and 40° or between 50° and 90°.

From the viewpoint of avoiding generation of large electrical charge on the central axis side and the outside of the braided piezoelectric element 201 in response to stretching deformation, the piezoelectric polymer includes a P-body containing a crystalline polymer with a positive piezoelectric constant d14 value as the main component and an N-body containing a crystalline polymer with a negative value as the main component, wherein for the portion of the central axis of the braided piezoelectric element 201 having a length of 1 cm, the value of T1/T2 is greater than 0.8, more preferably greater than 0.8 and no greater than 1.0, and even more preferably greater than 0.9, T1 being the smaller and T2 being the larger of (ZP+SN) and (SP+ZN), where ZP is the mass of the P-body having the orientation axis wrapped in a helical fashion around the Z-twisting direction, SP is the mass of the P-body having the orientation axis wrapped in a helical fashion around the S-twisting direction, ZN is the mass of the N-body having the orientation axis wrapped in a helical fashion around the Z-twisting direction, and SN is the mass of the N-body having the orientation axis wrapped in a helical fashion around the S-twisting direction. Even if the value of T1/T2 is not satisfied, the orientation angle θ of the piezoelectric polymer with respect to the direction of the central axis is preferably between 0° and 10° or between 80° and 90°, since the charge generated in response to stretching deformation will be smaller than when it is greater than 10° and less than 80°, and an electrical signal can be selectively generated in response to twisting deformation.

When fibers including polylactic acid are used as the main component for the piezoelectric fibers of the invention, the polylactic acid contains the lactic acid unit in a proportion of preferably at least 90 mol %, more preferably at least 95 mol % and even more preferably at least 98 mol %.

As long as the object of the invention is achieved by the braided piezoelectric element 201, combined filaments may be prepared in combination with fibers other than the piezoelectric fibers A for the sheath 202, and combined filaments may be prepared in combination with fibers other than the conductive fiber B for the core 203.

There are no particular restrictions on the length of the braided piezoelectric element composed of the core 203 of the conductive fiber B, the sheath 202 of the braided piezoelectric fibers A, and the conductive layer 204 covering the sheath 202. For example, the braided piezoelectric element may be produced in a continuous manner during production, and cut to the necessary length afterwards for use. The length of the braided piezoelectric element is 1 mm to 10 m, preferably 5 mm to 2 m and more preferably 1 cm to 1 m. If the length is too short the convenience of the fiber shape may be lost, and if the length is too long it may become necessary to consider the resistance value of the conductive fiber B. Each of the structural aspects will now be explained in greater detail.

(Conductive Fiber)

The conductive fiber B used may be any publicly known one that exhibits conductivity. Examples for the conductive fiber B include metal fibers, fibers made of conductive polymers, carbon fibers, fibers made of polymers dispersing fibrous or granular conductive fillers, or fibers forming a layer with conductivity on the surface of a fibrous substance. The method of forming a layer with conductivity on the surface of a fibrous substance may be metal coating, conductive polymer coating or conductive fiber coiling. Metal coating is preferred among these from the viewpoint of conductivity, durability, flexibility and the like. The specific method of coating a metal may be vapor deposition, sputtering, electrolytic plating, electroless plating or the like, with plating being preferred from the viewpoint of productivity. Fibers metal-plated in this manner may be considered to be metal-plated fibers.

The base fiber coated with a metal may be a publicly known fiber, regardless of whether it has or lacks conductivity, examples of which include synthetic fibers such as polyester fiber, nylon fiber, acrylic fiber, polyethylene fiber, polypropylene fiber, vinyl chloride fiber, aramid fiber, polysulfone fiber, polyether fiber and polyurethane fiber, as well as natural fibers such as cotton, hemp and silk, semisynthetic fibers such as acetate, and regenerated fibers such as rayon and cupra. The base fiber is not limited to these, and any publicly known fiber may be used, or combinations of these fibers may be used.

The metal to be coated onto the base fiber may be any type that exhibits conductivity and exhibits the effect of the invention. Examples to be used include gold, silver, platinum, copper, nickel, tin, zinc, palladium, indium tin oxide, copper sulfide and the like, as well as their mixtures and alloys.

When an organic fiber coated with a metal with bending resistance is used as the conductive fiber B, the conductive fiber will be very highly unlikely to break and the durability and safety of a sensor using the piezoelectric element will be excellent.

The conductive fiber B may be a multifilament consisting of a bundle of multiple filaments, or a monofilament consisting of a single filament. A multifilament is preferred from the viewpoint of long-term stability of the electrical characteristics. In the case of a monofilament (including spun yarn), the monofilament diameter is 1 μm to 5000 μm and preferably 2 μm to 100 μm. It is more preferably 3 μm to 50 μm. In the case of a multifilament, the number of filaments is preferably from 1 to 100,000, more preferably 5 to 500 and even more preferably 10 to 100. The fineness and number of conductive fibers B is the fineness and number of cores 203 used to prepare the braid, and a multifilament formed of a plurality of single threads (monofilaments) is counted as one conductive fiber B. The core 203 is the overall amount, including fibers other than conductive fibers when they are used.

If the diameter of the fiber is small the strength will be reduced and handling may become difficult, while if the diameter is large there may be some sacrifice of flexibility. The cross-sectional shape of the conductive fiber B is preferably circular or elliptical from the viewpoint of design and production of the piezoelectric element, but this is not limitative.

A lower electrical resistance is preferred for efficient extraction of electrical output from the piezoelectric polymer, the volume resistivity being preferably no greater than $10^{-1}$ Ω·cm, more preferably no greater than $10^{-3}$ Ω·cm and even more preferably no greater than $10^{-7}$·cm. However, the resistivity of the conductive fiber B is not limited to this range so long as sufficient strength can be obtained for detection of the electrical signal.

For use according to the present invention, the conductive fiber B must be resistant to movements such as repeated bending and twisting. As one indicator of such a property, a larger knot tenacity is preferred. The knot tenacity can be measured by the method of JIS L1013 8.6. The degree of knot tenacity suitable for the invention is preferably 0.5 cN/dtex or greater, more preferably 1.0 cN/dtex or greater, even more preferably 1.5 cN/dtex or greater and most preferably 2.0 cN/dtex or greater. As another indicator, low flexural rigidity is preferred. Flexural rigidity is generally measured with a measuring apparatus such as a KES-FB2 Pure Bending Tester by Kato Tech Corp. The degree of flexural rigidity suitable for the invention is preferably lower than that of the carbon fibers TENAX® HTS40-3K by Toho Tenax Co., Ltd. Specifically, the flexural rigidity of the conductive fiber is preferably no greater than $0.05 \times 10^{-4}$ N·m²/m, more preferably no greater than $0.02 \times 10^{-4}$ N·m²/m and even more preferably no greater than $0.01 \times 10^{-4}$ N·m²/m.

(Piezoelectric Fibers)

The piezoelectric polymer used as the material for the piezoelectric fibers A may be a polymer exhibiting piezoelectricity such as polyvinylidene fluoride or polylactic acid, but the piezoelectric fibers A described above for this embodiment preferably include a crystalline polymer with a high absolute value for the piezoelectric constant d14 when the orientation axis is the third axis, and especially polylactic acid, as the main component. Polylactic acid is readily oriented and exhibits piezoelectricity by stretching after melt spinning, for example, and has excellent productivity since it does not require electric field orientation treatment as is necessary with polyvinylidene fluoride and the like. However, this is not intended to exclude the use of polyvinylidene fluoride and other piezoelectric materials for carrying out the present invention.

Polylactic acid includes poly-L-lactic acid obtained by polymerization of L-lactic acid and L-lactide, poly-D-lactic acid obtained by polymerization of D-lactic acid and D-lactide, and stereocomplex polylactic acid comprising a hybrid structure of these, depending on the crystal structure, and any of these may be used so long as they exhibit piezoelectricity. Poly-L-lactic acid and poly-D-lactic acid are preferred from the viewpoint of a high piezoelectric modulus. Since poly-L-lactic acid and poly-D-lactic acid exhibit opposite polarization in response to the same stress, they may be used in combination according to the purpose.

The optical purity of the polylactic acid is preferably 99% or greater, more preferably 99.3% or higher and even more preferably 99.5% or higher. If the optical purity is less than 99% the piezoelectric modulus may be significantly lowered, potentially making it difficult to obtain a sufficient electrical signal by shape deformation of the piezoelectric fibers A. Most preferably, the piezoelectric fibers A include poly-L-lactic acid or poly-D-lactic acid as the main component, with an optical purity of 99% or greater.

Piezoelectric fibers A composed mainly of polylactic acid are stretched during production, and are uniaxially oriented in the fiber axis direction. Furthermore, preferably the piezoelectric fibers A are not only uniaxially oriented in the fiber axis direction but also include polylactic acid crystals, and more preferably they include uniaxially oriented polylactic acid crystals. This is because polylactic acid exhibits higher piezoelectricity and has a higher absolute value for d14 by having high crystallinity and being uniaxially oriented.

The crystallinity and uniaxial orientation are determined by the homo PLA crystallinity $X_{homo}$ (%) and crystal orientation Ao (%). The piezoelectric fibers A of the invention preferably have a homo PLA crystallinity $X_{homo}$ (%) and crystal orientation Ao (%) satisfying the following inequality (1).

$$X_{homo} \times Ao \times Ao \div 10^6 \geq 0.26 \quad (1)$$

If inequality (1) is not satisfied, the crystallinity and/or uniaxial orientation will be insufficient, the output value of the electrical signal for operation may be reduced and the sensitivity of the signal for operation in a specific direction may be reduced. The value of the left side of inequality (1) is more preferably 0.28 or greater, and even more preferably 0.3 or greater. Each of the values is determined in the following manner.

Homopolylactic Acid Crystallinity $X_{homo}$:

The homopolylactic acid crystallinity $X_{homo}$ is determined from crystal structure analysis by wide-angle X-ray diffraction (WAXD). In wide-angle X-ray diffraction (WAXD), an Ultrax18 X-ray diffraction apparatus by Rigaku Corp. is used in a transmission method, and the X-ray diffraction pattern of a sample is recorded on an imaging plate under the following conditions.

X-ray source: Cu-Kα rays (confocal mirror)
Output: 45 kV×60 mA
Slits: 1st: 1 mmΦ, 2nd: 0.8 mmΦ
Camera length: 120 mm
Elapsed time: 10 minutes
Sample: 35 mg of polylactic acid fibers are aligned to form a 3 cm fiber bundle.

The total scattering intensity $I_{total}$ over the declination in the obtained X-ray diffraction pattern is determined, and the sum $\Sigma I_{HMi}$ of the integrated intensity for each diffraction peak attributed to homopolylactic acid crystals, appearing near 2θ=16.5°, 18.50 and 24.3°, is calculated. Based on these values, the homopolylactic acid crystallinity $X_{homo}$ is calculated by the following formula (2).

$$\text{Homopolylactic acid crystallinity } X_{homo}(\%) = \Sigma I_{HMi} / I_{total} \times 100 \quad (2)$$

The value of $\Sigma I_{HMi}$ is calculated by subtracting the background and amorphous diffuse scattering from the total scattering intensity.

(2) Crystal Orientation Ao:

In the X-ray diffraction pattern obtained by the aforementioned wide-angle X-ray diffraction (WAXD), the crystal orientation Ao has an intensity distribution with respect to the declination (°) for the diffraction peaks attributable to homopolylactic acid crystals, appearing near 2θ=16.5° in the radius vector direction, and it is calculated from the sum $\Sigma Wi$ (°) of the half-widths in the obtained distribution profile, using the following formula (3).

$$\text{Crystal orientation } Ao(\%) = (360 - \Sigma W_i) \div 360 \times 100 \quad (3)$$

Incidentally, since polylactic acid is a polyester with relatively rapid hydrolysis, a publicly known hydrolysis preventer such as an isocyanate compound, oxazoline compound, epoxy compound or carbodiimide compound may be added when resistance to moist heat is an issue. Also, if necessary, an antioxidant, plasticizer, photodegradation inhibitor or the like such as a phosphoric acid-based compound may be added to modify the physical properties.

The piezoelectric fibers A may be multifilaments consisting of bundles of multiple filaments, or a monofilament consisting of a single filament. In the case of monofilaments (including spun yarn), the monofilament diameter is 1 μm to 5 mm, preferably 5 μm to 2 mm and even more preferably 10 μm to 1 mm. In the case of multifilaments, the monofilament diameter is 0.1 μm to 5 mm, preferably 2 μm to 100 μm and even more preferably 3 μm to 50 μm. The number of filaments for a multifilament is preferably from 1 to 100,000, more preferably 50 to 50,000 and even more preferably 100 to 20,000. The fineness and number of piezoelectric fibers A is the fineness and number per carrier when preparing the braid, and a multifilament formed of a plurality of single threads (monofilaments) is counted as one piezoelectric fiber A. One carrier includes the overall amount, including fibers other than piezoelectric fibers when they are used.

In order to obtain piezoelectric fibers A from such a piezoelectric polymer, any publicly known method for forming fibers from a polymer may be employed so long as the effect of the invention is exhibited. For example, a method of forming fibers by extrusion molding of the piezoelectric polymer, a method of forming fibers by melt spinning of the piezoelectric polymer, a method of forming fibers by dry or wet spinning of the piezoelectric polymer, a method of forming fibers by electrostatic spinning of the piezoelectric polymer, or a method of forming a film and then finely cutting it, may be employed. The spinning conditions employed may be according to a publicly known process suitable for the piezoelectric polymer used, and for most cases a melt spinning process may be employed, which facilitates industrial production. After formation of the fibers, the formed fibers may also be stretched. This will form piezoelectric fibers A that are uniaxially stretched and oriented, include crystals, and exhibit high piezoelectricity.

In addition, the piezoelectric fibers A may be treated by dyeing, twisting, doubling, heat treatment or the like, before braiding of the fibers prepared as described above.

In addition, since the piezoelectric fibers A will sometimes become twisted together or broken, or produce fluff, during formation of the braid, their strength and abrasion resistance is preferably high, the strength being preferably 1.5 cN/dtex or greater, more preferably 2.0 cN/dtex or greater, even more preferably 2.5 cN/dtex or greater and most preferably 3.0 cN/dtex or greater. The abrasion resistance can be evaluated by JIS L1095 9.10.2, Method B, with an abrasion pass count of preferably 100 or greater, more preferably 1000 or greater, even more preferably 5000 or greater and most preferably 10.000 or greater. The method of increasing the abrasion resistance is not particularly restricted, and any publicly known method may be used, such as increasing the degree of crystallinity, adding fine particles, or surface processing. Abrasion can also be reduced by coating the fibers with a lubricating agent during processing of the braid.

The difference in the shrinkage factor of the piezoelectric fibers is preferably small compared to the shrinkage factor of the conductive fiber mentioned above. If the difference in shrinkage factors is large, the braid may bend or the fabric may lose flatness in the post-treatment steps after formation of the braid or after formation of the fabric, or when subjected to heat or with passage of time during actual use, often resulting in a weaker piezoelectric signal. When the shrinkage factor is quantified by the boiling water shrinkage ratio as described below, the boiling water shrinkage ratio of the piezoelectric fibers S(p) and the boiling water shrinkage ratio of the conductive fiber S(c) preferably satisfy the following inequality (4).

$$|S(p)-S(c)| \leq 10 \quad (4)$$

The left side of inequality (4) is more preferably ≤5 and even more preferably ≤3.

The difference in the shrinkage factor of the piezoelectric fibers is also preferably small compared to the shrinkage factor of fibers other than the conductive fiber, such as insulating fibers. If the difference in shrinkage factors is large, the braid may bend or the fabric may lose flatness in the post-treatment steps after formation of the braid or after formation of the fabric, or when subjected to heat or with passage of time during actual use, often resulting in a weaker piezoelectric signal. When the shrinkage factor is quantified by the boiling water shrinkage ratio, the boiling water shrinkage ratio of the piezoelectric fibers S(p) and the boiling water shrinkage ratio of the insulating fibers S(i) preferably satisfy the following inequality (5).

$$|S(p)-S(i)| \leq 10 \quad (5)$$

The left side of inequality (5) is more preferably ≤5 and even more preferably ≤3.

The shrinkage factor of the piezoelectric fibers is also preferably small. For example, when the shrinkage factor is quantified by the boiling water shrinkage ratio, the shrinkage factor of the piezoelectric fibers is preferably no greater than 15%, more preferably no greater than 10%, even more preferably no greater than 5% and most preferably no greater than 3%. The means used to lower the shrinkage factor may be any publicly known method, and for example, the shrinkage factor can be lowered by heat treatment to relax the orientation of the amorphous sections or to increase the degree of crystallinity, without any particular restrictions on the timing of heat treatment, which may be after stretching, after twisting, after braiding or after fabric formation. The boiling water shrinkage ratio described above was measured by the following method. A reel with 20 coils was prepared using a sizing reel having a frame circumference of 1.125 m, a 0.022 cN/dtex load was applied, it was suspended from a scale board, and the initial reel length L0 was measured. The reel was then treated for 30 minutes in a boiling water bath at 100° C. and allowed to cool, a load was again applied, it was suspended from the scale board, and the contracted reel length L was measured. The measured L0 and L values were used to calculate the boiling water shrinkage ratio by the following formula (6).

$$\text{Boiling water shrinkage ratio} = (L0-L)/L0 \times 100(\%) \quad (6)$$

(Covering)

The conductive fiber B, i.e., the core 203, has its surface covered by the piezoelectric fibers A, i.e., the braided sheath 202. The thickness of the sheath 202 covering the conductive fiber B is preferably 1 μm to 10 mm, more preferably 5 μm to 5 mm, even more preferably 10 μm to 3 mm and most preferably 20 μm to 1 mm. If it is too thin, problems may result in terms of strength, and if it is too thick, the braided piezoelectric element 201 may become hard and more resistant to deformation. The "sheath 202" referred to here is the layer adjacent to the core 203.

In the braided piezoelectric element 201, the total fineness of the piezoelectric fibers A of the sheath 202 is preferably at least ½ and no greater than 20 times, more preferably at least 1 and no greater than 15 times, and even more preferably at least 2 and no greater than 10 times, the total fineness of the conductive fiber B of the core 203. If the total fineness of the piezoelectric fibers A is too small with respect to the total fineness of the conductive fiber B, there will be too few piezoelectric fibers A surrounding the conductive fiber B and the conductive fiber B will not be able to sufficiently output an electrical signal, while the conductive fiber B may potentially contact with other adjacent conductive fibers. If the total fineness of the piezoelectric fibers A is too large with respect to the total fineness of the conductive fiber B, there will be too many piezoelectric fibers A surrounding the conductive fiber B, and the braided piezoelectric element 201 will become too hard and resistant to deformation. In other words, the braided piezoelectric element 201 will fail to adequately function as a sensor in both cases.

The total fineness referred to here is the sum of all of the finenesses of the piezoelectric fibers A composing the sheath 202, and in the case of a common 8-strand braid, for example, it is the sum of the finenesses of the 8 strands.

Also, in the braided piezoelectric element 201, the fineness per piezoelectric fiber A of the sheath 202 is preferably at least 1/20 times and no greater than 2 times, more preferably at least 1/15 and no greater than 1.5 times, and even more preferably at least 1/10 and no greater than 1 time, the total fineness of the conductive fiber B. If the fineness per piezoelectric fiber A is too small with respect to the total fineness of the conductive fiber B, there will be too few piezoelectric fibers A and the conductive fiber B will not be able to sufficiently output an electrical signal, while the piezoelectric fibers A may potentially undergo breakage. If the fineness per the piezoelectric fiber A is too large with respect to the total fineness of the conductive fiber B, the piezoelectric fibers A will be too thick and the braided piezoelectric element 201 will become too hard and resistant to deformation. In other words, the braided piezoelectric element 201 will fail to adequately function as a sensor in both cases.

Incidentally, when metal fiber is used for the conductive fiber B or when metal fiber is combined with the conductive fiber B or piezoelectric fibers A, the fineness proportion is not limited to that mentioned above. This is because according to the invention, the proportion is important from the standpoint of the contact area and coverage factor, i.e., the area and volume. For example, if the specific gravity of each of the fibers exceeds 2, the proportion of the mean cross-sectional area of the fibers is preferably the same as the fineness proportion.

It is preferred for the piezoelectric fibers A and the conductive fiber B to be as closely bonded as possible, but for improved adhesiveness, an anchor layer or adhesive layer may be provided between the conductive fiber B and the piezoelectric fibers A.

The covering method employed is a method of using the conductive fiber B as the core thread and coiling the piezoelectric fibers A in a braided fashion around it. The form of the braid of the piezoelectric fibers A, however, is not particularly restricted so long as an electrical signal can be outputted in response to stress produced by an applied load, but it is preferably an 8-strand braid or a 16-strand braid with the core 203.

The form of the conductive fiber B and the piezoelectric fibers A is not particularly restricted, but they are preferably as nearly concentric as possible. When a multifilament is used as the conductive fiber B, the piezoelectric fibers A need only be covering in a manner so that at least a portion of the surface of the multifilament of the conductive fiber B (the peripheral surface of the fiber) is contacting, and the piezoelectric fibers A may cover either all, or less than all, of the filament surfaces (peripheral surfaces of the fibers) of the multifilament. The covering state of the piezoelectric fibers A on each filament in the interior forming the multifilament of the conductive fiber B may be set as appropriate, in consideration of performance and handleability of the piezoelectric element.

(Conductive Layer)

The conductive layer 204 can simultaneously exhibit a function as an electrode serving as the counter electrode for the conductive fiber of the core 203, and a function as a shield to block the conductive fiber of the core 203 from external electromagnetic waves and minimize noise signals generated in the conductive fiber of the core 203. Since the conductive layer 204 is to function as a shield, it is preferably grounded (connected to the earth or a grounded electronic circuit). Thus, it is possible to significantly increase the S/N ratio (signal-to-noise ratio) of the fabric-like piezoelectric element 207 even without layering a conductive fabric as an electromagnetic shield above and below the fabric-like piezoelectric element 207, for example. The state of the conductive layer 204 may be a coating, or a film, fabric or fiber coil, or even a combination of these.

A coating used to form the conductive layer 204 need only include a substance that exhibits conductivity, and various publicly known substances may be used. Examples include metals, conductive polymers or polymers dispersing conductive fillers.

When the conductive layer 204 is to be formed by coiling a film, the film used is obtained by forming a film of a conductive polymer and a polymer dispersing a conductive filler, or the film used may have a conductive layer formed on the surface.

When the conductive layer 204 is to be formed by coiling a fabric, the fabric used has the conductive fiber 206 described below as the constituent component.

When the conductive layer 204 is to be formed by coiling a fiber, the method of coiling may be as a cover ring, knitted fabric, braid or the like. The fiber used is a conductive fiber 206, and the conductive fiber 206 may be of the same type as the conductive fiber B mentioned above or a different type of conductive fiber. Examples for the conductive fiber 206 include metal fibers, fibers made of conductive polymers, carbon fibers, fibers made of polymers dispersing fibrous or granular conductive fillers, or fibers forming a layer with conductivity on the surface of a fibrous substance. The method of forming a layer with conductivity on the surface of a fibrous substance may be metal coating, conductive polymer coating or conductive fiber coiling. Metal coating is preferred among these from the viewpoint of conductivity, durability, flexibility and the like. The specific method of coating a metal may be vapor deposition, sputtering, electrolytic plating, electroless plating or the like, with plating being preferred from the viewpoint of productivity. Fibers metal-plated in this manner may be considered to be metal-plated fibers.

The base fiber coated with a metal may be a publicly known fiber, regardless of whether it has or lacks conductivity, examples of which include synthetic fibers such as polyester fiber, nylon fiber, acrylic fiber, polyethylene fiber, polypropylene fiber, vinyl chloride fiber, aramid fiber, polysulfone fiber, polyether fiber and polyurethane fiber, as well as natural fibers such as cotton, hemp and silk, semisynthetic fibers such as acetate, and regenerated fibers such as rayon and cupra. The base fiber is not limited to these, and any publicly known fiber may be used, or combinations of these fibers may be used.

The metal to be coated onto the base fiber may be any type that exhibits conductivity and exhibits the effect of the invention. Examples to be used include gold, silver, platinum, copper, nickel, tin, zinc, palladium, indium tin oxide, copper sulfide and the like, as well as their mixtures and alloys.

When an organic fiber coated with a metal with bending resistance is used as the conductive fiber 206, the conductive fiber is very highly unlikely to break, and the durability and safety of a sensor using the piezoelectric element will be excellent.

The conductive fiber 206 may be a multifilament consisting of a bundle of multiple filaments, or a monofilament consisting of a single filament. A multifilament is preferred from the viewpoint of long-term stability of the electrical characteristics. In the case of a monofilament (including spun yarn), the monofilament diameter is 1 μm to 5000 μm and preferably 2 μm to 100 μm. It is more preferably 3 μm to 50 μm. In the case of a multifilament, the number of filaments is preferably from 1 to 100,000, more preferably 5 to 500 and even more preferably 10 to 100.

If the diameter of the fiber is small the strength will be reduced and handling may become difficult, while if the diameter is large there may be some sacrifice of flexibility. The cross-sectional shape of the conductive fiber 206 is preferably circular or elliptical from the viewpoint of design and production of the piezoelectric element, but this is not limitative.

Moreover, lower electrical resistance is preferred for an increased effect of suppressing noise signals, the volume resistivity being preferably no greater than $10^{-1}$ f·cm, more preferably no greater than $10^{-2}$ Ω·cm and even more preferably no greater than $10^{-3}$ Ω·cm. However, the resistivity is not limited to this range so long as the effect of suppressing noise signals can be obtained.

For use according to the present invention, the conductive fiber 206 must be resistant to movements such as repeated bending and twisting. As one indicator of such a property, a larger knot tenacity is preferred. The knot tenacity can be measured by the method of JIS L1013 8.6. The degree of knot tenacity suitable for the invention is preferably 0.5 cN/dtex or greater, more preferably 1.0 cN/dtex or greater, even more preferably 1.5 cN/dtex or greater and most preferably 2.0 cN/dtex or greater. As another indicator, low flexural rigidity is preferred. Flexural rigidity is generally measured with a measuring apparatus such as a KES-FB2 Pure Bending Tester by Kato Tech Corp. The degree of flexural rigidity suitable for the invention is preferably lower than that of the carbon fibers TENAX® HTS40-3K by Toho Tenax Co., Ltd. Specifically, the flexural rigidity of the conductive fiber is preferably no greater than $0.05 \times 10^{-4}$ N·m²/m, more preferably no greater than $0.02 \times 10^{-4}$ N·m²/m and even more preferably no greater than $0.01 \times 10^{-4}$ N·m²/m.

(Protective Layer)

A protective layer may also be provided on the outer surface of the braided piezoelectric element 201 of the invention. The protective layer preferably has an insulating property, and from the viewpoint of flexibility it is more preferably composed of a polymer. When the protective layer is given an insulating property, naturally the protective layer will also be deformed and the protective layer will be rubbed, but there are no particular restrictions so long as the external force reaches the piezoelectric fibers A and can induce polarization. The protective layer is not limited to being formed by coating of the polymer or the like, and it may instead be a coiled film, fabric, fiber or the like, or a combination of these. The fabric of the invention may also be used as a protective layer as described below, and this is preferred from the viewpoint of a simpler construction.

The thickness of the protective layer is as small as possible to facilitate transmission of shearing stress to the piezoelectric fibers A, but if it is too small, problems may be caused such as breakdown of the protective layer itself, and it is therefore preferably 10 nm to 200 μm, more preferably 50 nm to 50 μm, even more preferably 70 nm to 30 μm and most preferably 100 nm to 10 μm. The shape of the piezoelectric element may also be created by the protective layer.

In addition, a plurality of layers made of piezoelectric fibers may be provided, or a plurality of layers made of conductive fibers for signal extraction may be provided. Naturally, the number and order of the protective layer, the layer made of piezoelectric fibers and the layer made of conductive fibers may be determined as appropriate according to the purpose. The coiling method may be a method of additionally forming a braid structure over the outer layer of the sheath 202, or a method of forming a cover ring.

The braided piezoelectric element 201 of the invention can detect deformation or stress utilizing the electrical signal output based on the piezoelectric effect described above, and by calculating the change in electrostatic capacitance between the conductive fiber B of the core of the braided piezoelectric element 201, and the conductive layer 204, it can detect deformation caused by pressure applied to the braided piezoelectric element 201. Furthermore, when multiple braided piezoelectric elements 201 are used in combination, the change in electrostatic capacitance between the conductive layers 204 of each of the braided piezoelectric elements 201 may be calculated to detect deformation caused by pressure applied to the braided piezoelectric element 201.

(Fabric-Like Piezoelectric Element)

Figure 17:
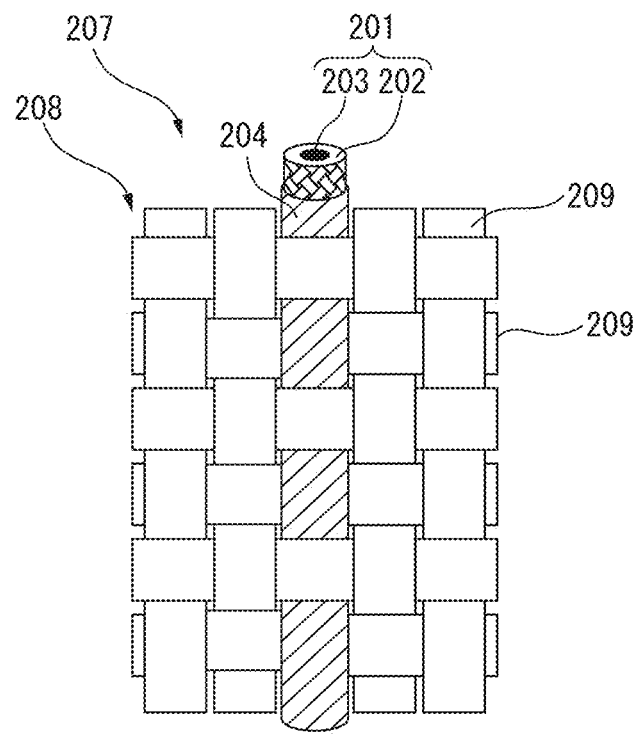
FIG. 17 is a schematic diagram showing an example of the construction of a fabric-like piezoelectric element according to an embodiment of the third invention.

The fabric-like piezoelectric element of the invention has at least one braided piezoelectric element anchored to a fabric. This will not only allow the fabric itself to be processed into a desired form such as clothing for use as a device, but will also allow it to be installed by any of various methods such as sewing or bonding onto a base material lacking a sensor function, such as an existing article of clothing or structure, to conveniently provide it with a sensor function. FIG. 17 is a schematic diagram showing an example of the construction of a fabric-like piezoelectric element using a braided piezoelectric element according to an embodiment.

In the example shown in FIG. 17, the fabric-like piezoelectric element 207 has at least one braided piezoelectric element 201 anchored to a fabric 208. The fabric 208 may be any type of woven or knitted fabric wherein at least one of the fibers (including braids) composing the fabric is a braided piezoelectric element 201, with no particular limitation so long as the braided piezoelectric element 201 can exhibit the function of a piezoelectric element. For a fabric, union weaving, mixed knitting or the like may be carried out with other fibers (including braids), so long as the object of the invention is achieved. Naturally, the braided piezoelectric element 201 may be used as a portion of fibers composing a fabric (for example, warp thread or weft thread), or the braided piezoelectric element 201 may be embroidered or bonded with a fabric. In the example shown in FIG. 17, the fabric-like piezoelectric element 207 is a plain weave fabric having at least one braided piezoelectric element 201 and insulating fibers 209 arranged as warp thread and the insulating fibers 209 as weft thread. The insulating fibers 209 will be explained below. All or some of the insulating fibers 209 may also be in braided form.

In this case, when the fabric-like piezoelectric element 207 has deformed by bending or the like, the braided piezoelectric element 201 also deforms in a manner following that deformation, and the deformation of the fabric-like piezoelectric element 207 can be detected by the electrical signal outputted from the braided piezoelectric element 201. Furthermore, since the fabric-like piezoelectric element 207 can be used as a fabric (woven or knitted fabric), it can be applied as a wearable sensor in the form of clothing, for example.

Figure 18:
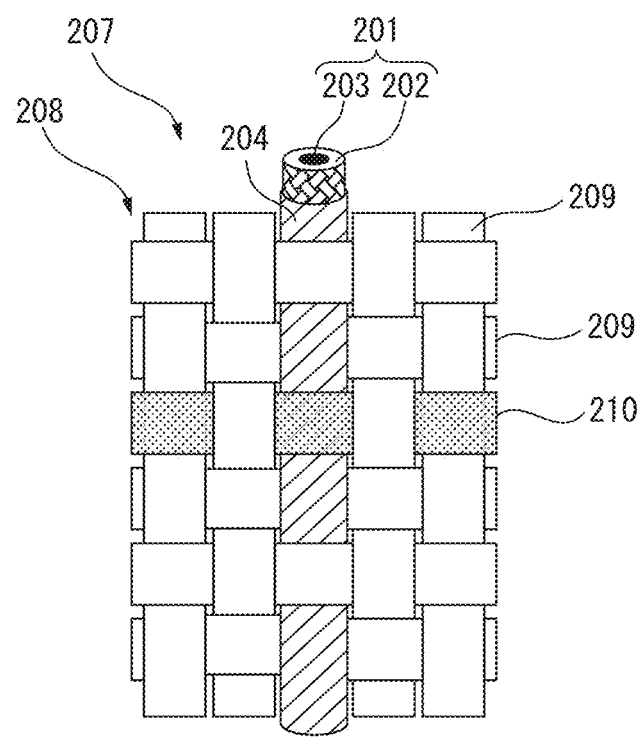
FIG. 18 is a schematic diagram showing another example of the construction of a fabric-like piezoelectric element according to an embodiment of the third invention.

Moreover, in a construction in which the insulating fibers as the weft thread of the fabric-like piezoelectric element 207 shown in FIG. 17 are partially replaced by conductive fibers 210 (FIG. 18), the conductive fibers 210 are in crossing contact with the braided piezoelectric element 201. Therefore, the conductive fibers 210 are in crossing contact with at least a portion of the conductive layer 204 of the braided piezoelectric element 201, allowing the conductive fibers 210 to be connected to an electronic circuit instead of the conductive layer 204. The conductive fibers 210 may be conductive fibers of the same type or a different type from the conductive fiber B, and all or some of them may be in braided form.

The fabric-like piezoelectric element of the invention has a pull-out strength of 0.1N or greater per 5 cm of braided piezoelectric element, with respect to the fabric. This will minimize the difference between deformation of the fabric and deformation of the braided piezoelectric element, allowing the amount of deformation of the braided piezoelectric element detected by the electrical signal of the braided piezoelectric element to be used to minimize error when estimating deformation of the fabric, and to thus improve reproducibility. When the pull-out strength per 5 cm of braided piezoelectric element with respect to the fabric is less than 0.1 N, then even with stretching deformation of the fabric, sliding will take place between the braided piezoelectric element and the fabric, preventing the braided piezoelectric element from adequately undergoing stretching deformation, and the degree of stretching detected by the electrical signal of the braided piezoelectric element will be significantly less than the amount of stretching of the fabric, while the reproducibility will also be low. From this viewpoint, the pull-out strength per 5 cm of the braided piezoelectric element with respect to the fabric is preferably 0.2 N or greater, more preferably 0.3 N or greater and even more preferably 0.4 N or greater. The pull-out strength is most preferably equal to or greater than the strength of the braided piezoelectric element.

The "pull-out strength per 5 cm of the braided piezoelectric element with respect to the fabric", according to the invention, is determined in the following manner. First, when the braided piezoelectric element has a portion exposed through the fabric-like piezoelectric element, the exposed braided piezoelectric element is held by one gripping jig of a tensile tester, and the braided piezoelectric element and fabric-like piezoelectric element are cut at a section 5 cm from the end where the braided piezoelectric element is anchored, on the gripped side. The portions on both flanks of the 5 cm portion where the braided piezoelectric element is anchored to the fabric, excluding a region within 1 mm from the braided piezoelectric element, are gripped with a U-shaped gripping jig over a length of 5 cm in the lengthwise direction of the braided piezoelectric element, and connected to the other gripping jig of the tensile tester. In this state, a tensile test is conducted at a speed of 10 mm/min, and the maximum strength is measured and recorded as the pull-out strength. When the braided piezoelectric element does not have an adequate region exposed from the fabric-like piezoelectric element, a portion of the fabric (a portion other than the braided piezoelectric element) is cut to expose the braided piezoelectric element prior to the measurement described above. When it is difficult to ensure a length of 5 cm at the portion where the braided piezoelectric element is anchored to the fabric, the pull-out strength of an anchored part of an arbitrary length is measured and converted to a strength per 5 cm.

In the fabric-like piezoelectric element of the invention, preferably the coverage factor of the braided piezoelectric element by the fibers composing the fabric is greater than 30% on both sides of the fabric. This will increase the pull-out strength of the braided piezoelectric element with respect to the fabric, not only minimizing the difference between deformation of the fabric and deformation of the braided piezoelectric element, but also making it less susceptible to damage by external rubbing, heat and light. From this viewpoint, the coverage factor of the braided piezoelectric element by the fibers composing the fabric is preferably greater than 50%, more preferably greater than 70% and most preferably 100%, on the both sides of the fabric.

The coverage factor of the braided piezoelectric element by the fibers composing the fabric is calculated as the area ratio of the portion of the braided piezoelectric element hidden by the fibers composing the fabric with respect to the projected area of the braided piezoelectric element, in an image as observed perpendicular to one side of the fabric-like piezoelectric element. An observation image of the other side is evaluated in the same manner, and the coverage factor is calculated for each of both sides of the fabric. When calculated in this manner, it is difficult to exceed a coverage factor of 50% on both sides of a common woven fabric texture (plain weave, twill weave or satin weave), but by using spun yarn or multifilaments for weaving of a plain weave or twill weave texture, by increasing the density of intersecting yarn in the braided piezoelectric element, or by relatively lowering the density of parallel yarn in the braided piezoelectric element, it is possible to obtain a coverage factor exceeding 50% on both sides of the fabric. However, when the tensile force of the intersecting yarn of the braided piezoelectric element is excessively lowered in order to increase the density of the intersecting yarn in the braided piezoelectric element, the force constraining the braided piezoelectric element is weakened, which is undesirable as it makes it impossible to achieve the desired pull-out strength. Moreover, by producing a fabric in such a manner that the braided piezoelectric element is sandwiched between the layers of a double-woven fabric or double-knitted fabric, it is possible to vastly increase the coverage factor on both sides of the fabric to 100% or nearly 100%. When the coverage factor is 30% or lower, there will be numerous locations where the braided piezoelectric element is exposed through the fibers of the fabric, resulting in inadequate protection. Coverage is considered coverage even if the fibers composing the fabric are transparent. When the braided piezoelectric element comprises a protective layer on the outer layer of the conductive layer 204, the protective layer is also considered to be part of the braided piezoelectric element.

(Multiple Piezoelectric Elements)

Multiple braided piezoelectric elements 201 may also be used in an arrangement in the fabric-like piezoelectric element 207. The manner of arrangement may be, for example, using the braided piezoelectric element 201 for all of the warp thread or weft thread, or the braided piezoelectric elements 201 may be used for several groups or sections thereof. Braided piezoelectric elements 201 may also be used as warp threads at certain sections and braided piezoelectric elements 201 used as weft threads at other sections.

Figure 19:
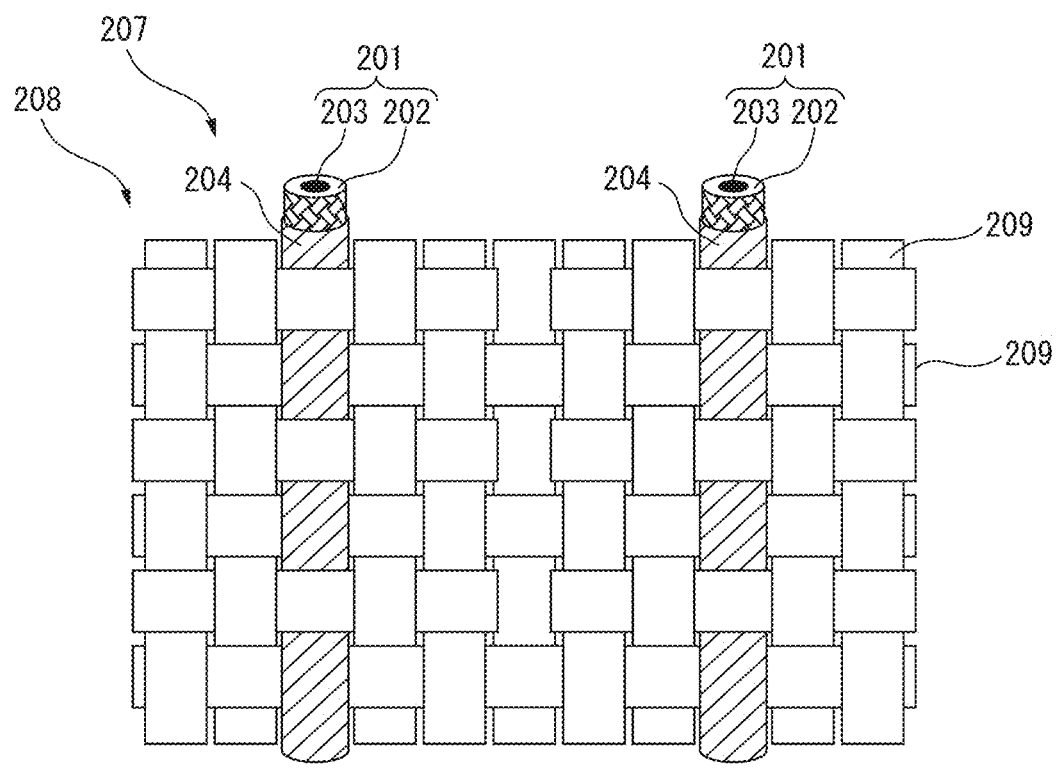
FIG. 19 is a schematic diagram showing another example of the construction of a fabric-like piezoelectric element according to an embodiment of the third invention.

FIG. 19 is a schematic diagram showing another example of the construction of a fabric-like piezoelectric element using a braided piezoelectric element according to an embodiment. The fabric-like piezoelectric element 207 comprises a fabric 208 including two or more braided piezoelectric elements 201, the braided piezoelectric elements 201 being arranged essentially in a parallel fashion. The fabric 208 may be any type of woven or knitted fabric wherein at least one of the fibers (including braids) composing the fabric is a braided piezoelectric element 201, with no particular limitation so long as the braided piezoelectric element 201 can exhibit the function of a piezoelectric element. In the example shown in FIG. 19, the fabric-like piezoelectric element 207 is a plain weave fabric having at least one braided piezoelectric element 201 and insulating fibers 209 arranged as warp thread and the insulating fibers 209 as weft thread. The insulating fibers 209 will be explained below. All or some of the insulating fibers 209 may also be in braided form. The insulating fibers of the weft thread of the fabric-like piezoelectric element 207 shown in FIG. 19 may be partially replaced with conductive fibers, similar to FIG. 18.

The braided piezoelectric elements 201 emit a piezoelectric signal when deformed, the signal varying in size and shape depending on the manner of deformation. In the case of the fabric-like piezoelectric element 207 shown in FIG. 19, when the fabric-like piezoelectric element 207 has undergone bending deformation of a line perpendicular to the two braided piezoelectric elements 201 as the bending section, the two braided piezoelectric elements 201 undergo the same deformation. Thus, the same signal is detected from the two braided piezoelectric elements 201. In the case of complex deformation such as twisting, on the other hand, different deformation will be induced in the two braided piezoelectric elements 201, and the signal generated by each braided piezoelectric element 201 will differ. Based on this principle, it is possible to combine multiple braided piezoelectric elements 201 and comparatively compute the signal generated at each braided piezoelectric element 201, to analyze complex deformation of the braided piezoelectric elements 201. For example, it is possible to detect complex deformation such as twisting based on results obtained by comparing the polarity, amplitude and phase of the signal generated at each braided piezoelectric element 201.

For example, a preferred mode is a fabric-like piezoelectric element 207 wherein the two braided piezoelectric elements used each output an electrical signal by stretching, and the two braided piezoelectric elements 201 are disposed at different locations in the top view of the fabric as shown in FIG. 19. According to this mode, the lower side of the fabric-like piezoelectric element 207 of FIG. 19 is anchored, and in response to bending deformation such that the left edge of the upper side is lifted while the right edge is lowered, the stretching deformations experienced by the two braided piezoelectric elements 201 differ from each other, or in other words, the left braided piezoelectric element 201 elongates while the right braided piezoelectric element 201 contracts, and therefore the signals generated by each braided piezoelectric element 201 can be compared to detect the bending. In this case, the stretching deformation experienced by the two braided piezoelectric elements 201 by stretching in one direction of the fabric are similar, and therefore the bending deformation can be detected in a distinguishing manner.

Figure 20:
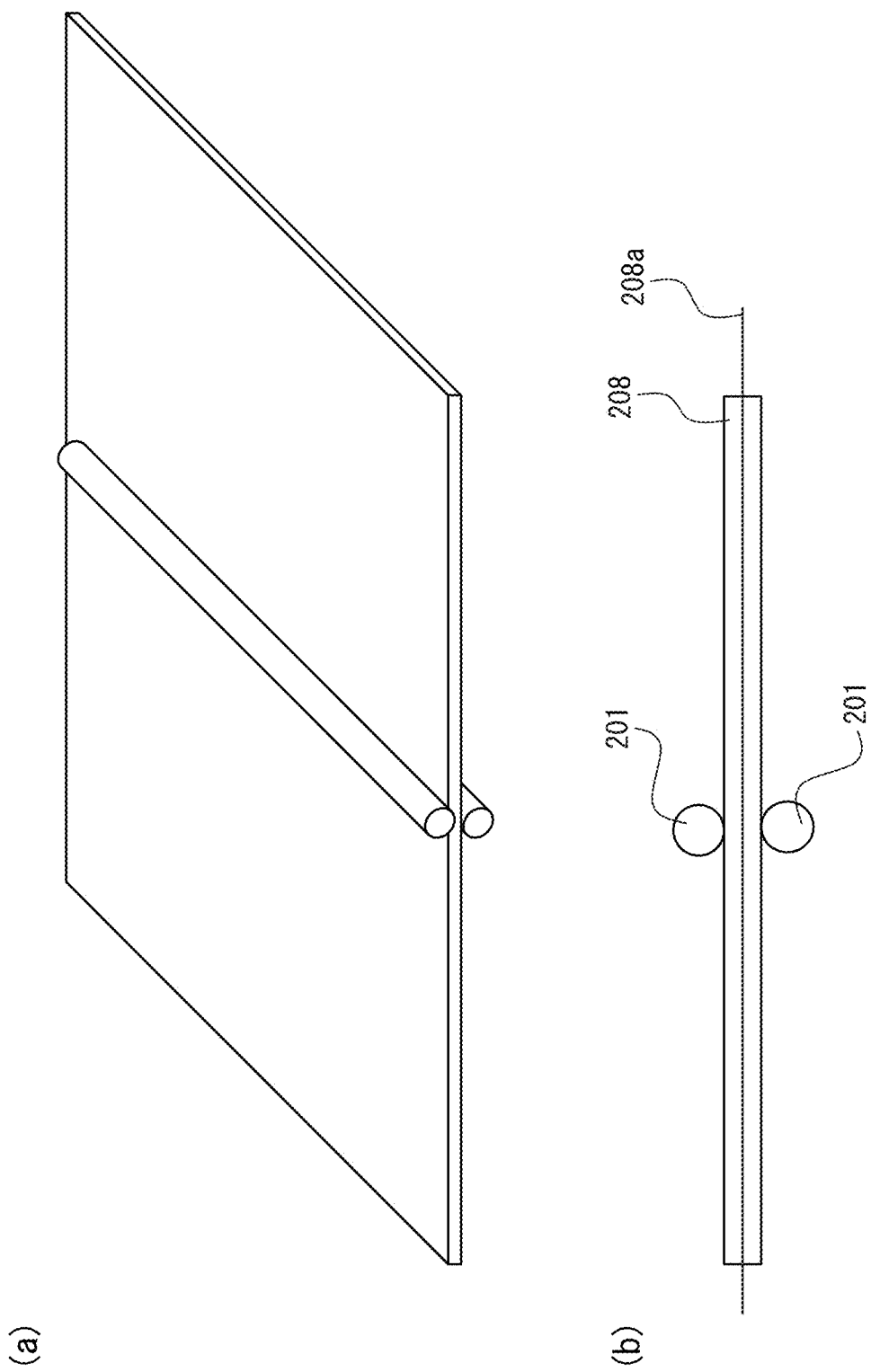
FIG. 20 is a schematic diagram showing another example of the construction of a fabric-like piezoelectric element according to an embodiment of the third invention, where (a) is a perspective view and (b) is a side view.

Another preferred mode of the fabric-like piezoelectric element 207 is shown as an example in FIG. 20, wherein the two braided piezoelectric elements 201 that each output an electrical signal by stretching are anchored to the fabric in such a manner that their relative positions differ based on the center plane 208a of the fabric 208, so that bending in the direction perpendicular to the fabric 208 causes compressive deformation to be applied to one braided piezoelectric element 201 while elongating deformation is applied to the other braided piezoelectric element 201, whereby the electrical signals outputted from the two braided piezoelectric elements 201, and more specifically from the conductive fibers B in the two braided piezoelectric elements 201, can be used to detect bending of the fabric in the direction perpendicular to the fabric 208. According to this mode, if elements with equivalent performance are used as the two braided piezoelectric elements 201, then equivalent outputs are obtained from the two braided piezoelectric elements 201 during stretching deformation of the fabric-like piezoelectric element 207 in the axial directions of the braided piezoelectric elements 201, and it can therefore be detected in a manner distinguishable from bending deformation of the fabric. In FIG. 20, the two braided piezoelectric elements 201 are disposed at locations with plane symmetry with the center plane 208a of the fabric 208 as the plane of symmetry, but it is sufficient if they are anchored in the fabric in such a manner that their relative positions are different with respect to the center plane 208a of the fabric 208, and the two braided piezoelectric elements 201 may even be anchored at different distances from the center plane 208a of the fabric 208, on the same side of the fabric 208.

Another preferred mode is one in which, when the two braided piezoelectric elements used output electrical signals of mutually opposite polarity (that is, electrical signals of opposite signs) by stretching of each braided piezoelectric element, a large output is generated in response to bending of the fabric by the sum of the signals, while a small output is generated in response to stretching of the fabric. A braided piezoelectric element that outputs electrical signals of mutually opposite polarity can be obtained by using poly-L-lactic acid and poly-D-lactic acid as the main components of the piezoelectric polymer used, as explained above, or by using the same piezoelectric polymer and arranging it with an orientation in the S-twisting direction and the Z-twisting direction. The method of obtaining the sum of the signals of the two braided piezoelectric elements may be a method of short circuiting the core of the two braided piezoelectric elements, or a method of determining the sum using an electronic circuit and software.

From the viewpoint of causing the two braided piezoelectric elements 201 to undergo different deformation in response to bending of the fabric in the mode described above, the two braided piezoelectric elements 201 are placed with spacing between them, and specifically the distance between the nearest portions of the piezoelectric fibers is preferably a separation of 0.05 mm to 500 mm, more preferably a separation of 0.1 mm to 200 mm and even more preferably a separation of 0.5 mm to 100 mm. When braided piezoelectric elements that are not to be used for signal detection are included in a fabric, the distance between a braided piezoelectric element and another braided piezoelectric element may be less than 0.05 mm.

As yet another example, at least one of the braided piezoelectric elements used for the braided piezoelectric elements in the fabric-like piezoelectric element is one that outputs an electrical signal in response to stretching while the other braided piezoelectric element used is one that outputs an electrical signal in response to twisting, and stretching or bending deformation of the fabric is detected by the electrical signal outputted from at least one braided piezoelectric element, while twisting deformation of the fabric is detected by the electrical signal outputted from at least the other braided piezoelectric element. According to this mode, the braided piezoelectric element that detects stretching deformation or bending deformation of the fabric is one that selectively outputs an electrical signal in response to stretching deformation as described above, and the braided piezoelectric element that detects twisting deformation of the fabric is one that selectively outputs an electrical signal in response to twisting deformation as described above. For this example, the distance between the braided piezoelectric elements is not specified.

By combining a plurality of braided piezoelectric elements 201 and comparatively computing the signal generated by each braided piezoelectric element 201 as explained above, it is possible to analyze complex deformation such as bending or twisting, thereby allowing application in a wearable sensor in the form of clothing, for example. In this case, when the fabric-like piezoelectric element 207 has deformed by bending or the like, the braided piezoelectric element 201 also deforms in a manner following that deformation, and the deformation of the fabric-like piezoelectric element 207 can be detected based on the electrical signal outputted from the braided piezoelectric element 201. Furthermore, since the fabric-like piezoelectric element 207 can be used as a fabric (woven or knitted fabric), it can be applied as a wearable sensor in the form of clothing, for example.

(Insulating Fibers)

In the fabric-like piezoelectric element 207, insulating fibers may also be used at sections other than the braided piezoelectric element 201 (and conductive fibers 210). In this case, the insulating fibers used may be fibers of a material and shape that are stretchable, in order to improve the flexibility of the fabric-like piezoelectric element 207.

By situating insulating fibers in this manner at sections other than the braided piezoelectric element 201 (and conductive fibers 210), it is possible to increase the operativity of the fabric-like piezoelectric element 207 (for example, the ease of movement for a wearable sensor).

Such insulating fibers that are used need only have a volume resistivity of $10^6$ Ω·cm or greater, but it is more preferably $10^8$ Ω·cm or greater and even more preferably $10^{10}$ Ω·cm or greater.

Examples of insulating fibers to be used include synthetic fibers such as polyester fiber, nylon fiber, acrylic fiber, polyethylene fiber, polypropylene fiber, vinyl chloride fiber, aramid fiber, polysulfone fiber, polyether fiber and polyurethane fiber, as well as natural fibers such as cotton, hemp and silk, semisynthetic fibers such as acetate, and regenerated fibers such as rayon and cupra. There is no restriction to these, however, and any publicly known insulating fibers may be used as desired. These insulating fibers may also be used in combination, or combined with fibers having no insulating property to form fibers with an overall insulating property.

Fibers with various publicly known cross-sectional shapes may also be used.

(Production Method)

The braided piezoelectric element 201 of the invention has the surface of at least one conductive fiber B covered by the braided piezoelectric fibers A, and the method for its production may be the following, for example. That is, it may be a method of preparing the conductive fiber B and the piezoelectric fibers A in separate steps, and coiling the piezoelectric fibers A in braided form around the conductive fiber B to cover it. In this case, the covering is preferably carried out as nearly concentrically as possible.

The preferred spinning and stretching conditions, when using polylactic acid as the piezoelectric polymer forming the piezoelectric fibers A, is a melt spinning temperature of preferably 150° C. to 250° C., a stretching temperature of preferably 40° C. to 150° C., a draw ratio of preferably 1.1 to 5.0 and a crystallization temperature of preferably 80° C. to 170° C.

The piezoelectric fibers A to be used by coiling around the conductive fiber B may be multifilaments consisting of bundles of multiple filaments, or monofilaments (including spun yarn). The conductive fiber B around which the piezoelectric fibers A are to be coiled may also be a multifilament consisting of bundles of multiple filaments, or a monofilament (including spun yarn).

The preferred manner of covering is to use the conductive fiber B as the core thread and braid the piezoelectric fibers A around its periphery in a braided form to prepare a tubular braid to cover it. More specifically, this may be an 8-strand braid or 16-strand braid with the core 203. However, the piezoelectric fibers A may be in the form of a braided tube, for example, with the conductive fiber B as the core inserted in the braided tube to cover it.

The conductive layer 204 is produced by coating or fiber coiling, but fiber coiling is preferred from the viewpoint of facilitating production. The method of fiber coiling may be a cover ring, knitted fabric or braid, and the production may employ any method.

By the production method described above it is possible to obtain a braided piezoelectric element 201 having the surface of the conductive fiber B covered with the braided piezoelectric fibers A, and further having the conductive layer 204 around its periphery.

The fabric-like piezoelectric element 207 of the invention is produced by weaving or knitting. Union weaving, mixed knitting or mixed braiding with other fibers (including braids) may also be carried out, as long as the object of the invention is achieved. Naturally, the braided piezoelectric element 201 may be used as a portion of fibers composing a fabric (for example, warp thread or weft thread), or the braided piezoelectric element 201 may be embroidered or bonded with a fabric, optionally combining such methods. A tape-type fabric-like piezoelectric element with the fabric present only near the braided piezoelectric element 201 is preferred, as it can be easily incorporated by sewing or attachment to another fabric. In this case, the distance between the edges of the tape and the braided piezoelectric element (the distance in the widthwise direction of the tape) is preferably between 1 mm and 100 mm, more preferably between 3 mm and 50 mm and even more preferably between 5 mm and 20 mm. When a tape-type fabric-like piezoelectric element is to be used, it may be produced by cutting a wide fabric-like piezoelectric element parallel to the braided piezoelectric element 201, but union weaving, mixed knitting or mixed braiding during weaving or knitting of the fabric tape, or embroidery or bonding of the braided piezoelectric element 201 to the fabric tape, is preferred from the viewpoint of simplifying the production steps.

Examples for the woven texture of the woven fabric include the three foundational types of weaves: plain weave, twill weave and satin weave, half-double weaves such as derivative weave, warp backed weave and weft backed weave, and warp velvet weaves. The type of knitted fabric may be a circular knit fabric (weft knitted fabric) or a warp knitted fabric. Examples of preferred textures of circular knit fabrics (weft knitted fabrics) include plain stitch, rib stitch, interlock stitch, purl stitch, tuck stitch, float stitch, rib-and-tuck stitch, lace stitch and plating stitch. Examples of warp braid stitches include single denbigh stitch, single atlas stitch, double cord stitch, half-tricot stitch, lined stitch and jacquard stitch. It may consist of a single layer, or a multilayer with two or more layers. Alternatively, it may be a plush weave or plush stitch, composed of nap sections and ground weave sections comprising cut piles and/or loop piles.

From the viewpoint of simplifying the production steps and increasing the pull-out strength and coverage factor, the braided piezoelectric element is preferably anchored to the fabric in a woven state or in a knitted state, and more preferably the braided piezoelectric element is inserted between layers of multiple woven fabrics or multiple knitted fabrics. The term "multiple" means two or more layers.

(Technology for Use of Piezoelectric Element)

The piezoelectric element of the invention in any desired form, such as the braided piezoelectric element 201 or fabric-like piezoelectric element 207, can output contact, pressure and shape deformation on the surface as an electrical signal, and therefore it can be utilized as a sensor (device) that detects the size of stress and/or the location of stress applied to the piezoelectric element. In addition, the electrical signal can be used as a power generating element, to serve as an electric power source to drive another device, or for storage. Specifically, this may include electric power generation by use at movable parts that autonomously move, such as those of a human, animal, robot or machine, electric power generation on the surface of a structure subjected to pressure from a shoe sole, mat or exterior, and electric power generation by shape deformation in a fluid. For generation of an electrical signal by shape deformation in a fluid, an electrostatic substance in a fluid may be adsorbed, or its adhesion inhibited.

FIG. 6 is a block diagram showing a device 111 comprising a piezoelectric element 112 of the invention. The device 111 comprises a piezoelectric element 112 (fabric-like piezoelectric element 207), and optionally also an electrical circuit having amplification means 113 that amplifies an electrical signal outputted from the output terminal of the piezoelectric element 112 in response to applied pressure, output means 114 that outputs the electrical signal amplified at the optional amplification means 113, and transmission means 115 that transmits the electrical signal outputted from the output means 114 to an external device (not shown). By using the device 111, it is possible to detect the size and/or applied location of stress applied to a piezoelectric element, by computation processing at an external device (not shown), based on an electrical signal outputted by contact, pressure or shape deformation on the surface of a piezoelectric element 112.

The optional amplification means 113, output means 114 and transmission means 115 may consist of a software program, for example, or they may consist of a combination of different electronic circuits and a software program. For example, a software program may be installed in a computation processing device (not shown), and the computation processing device operated according to the software program to carry out the various functions. Alternatively, the optional amplification means 113, output means 114 and transmission means 115 may be semiconductor integrated circuits having software programs written in them for the various functions. Incidentally, the transmission system using transmission means 115 may be either wireless or wired, determined as appropriate depending on the sensor to be constructed. Alternatively, computing means (not shown) may be provided in the device 111, that computes the size and/or applied location of stress applied to the piezoelectric element 112, based on the electrical signal outputted from the output means 114. Instead of the amplification means alone, it may also be used in combination with publicly known signal processing means, such as noise-canceling means or means for combined processing with other signals. The order of connection of such means may be modified as appropriate depending on the purpose. Naturally, the electrical signal outputted from the piezoelectric element 112 may be subjected to signal processing after being directly transmitted to an external device.

Figure 21:
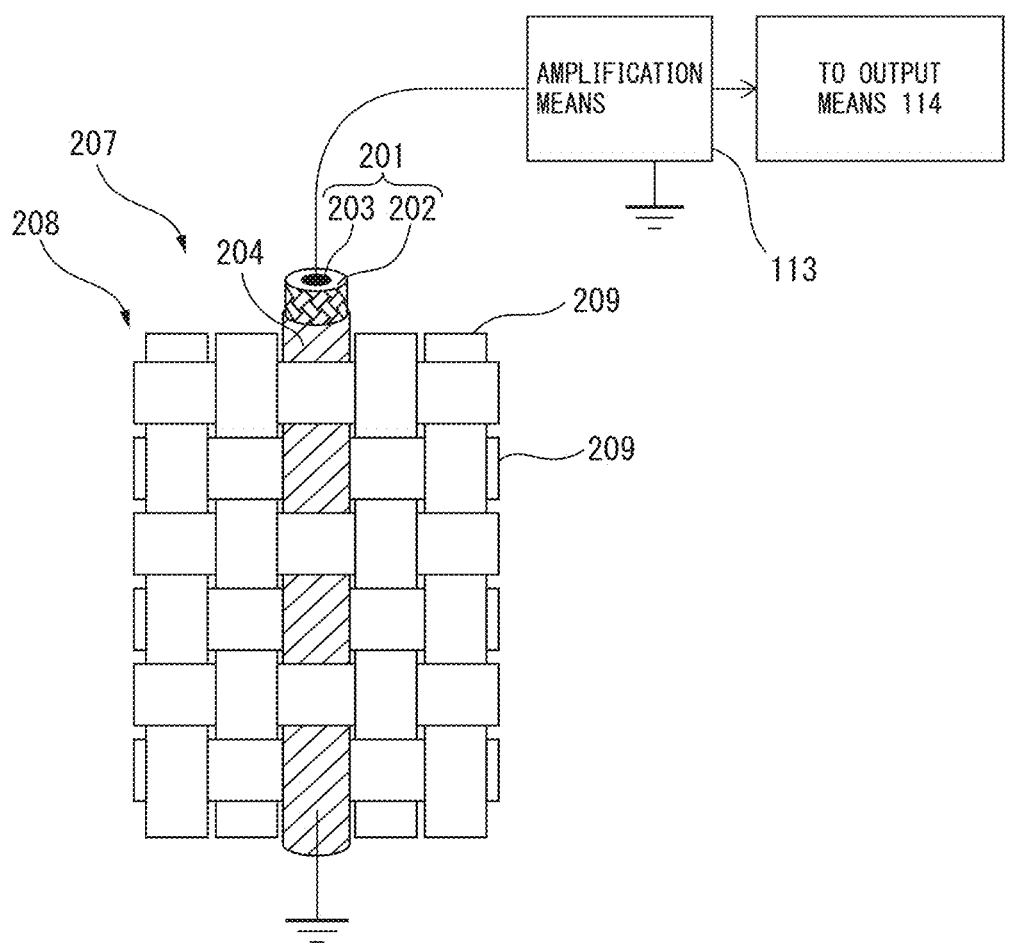
FIG. 21 is a schematic diagram showing an example of the construction of a device comprising a fabric-like piezoelectric element according to an embodiment of the third invention.
Figure 22:
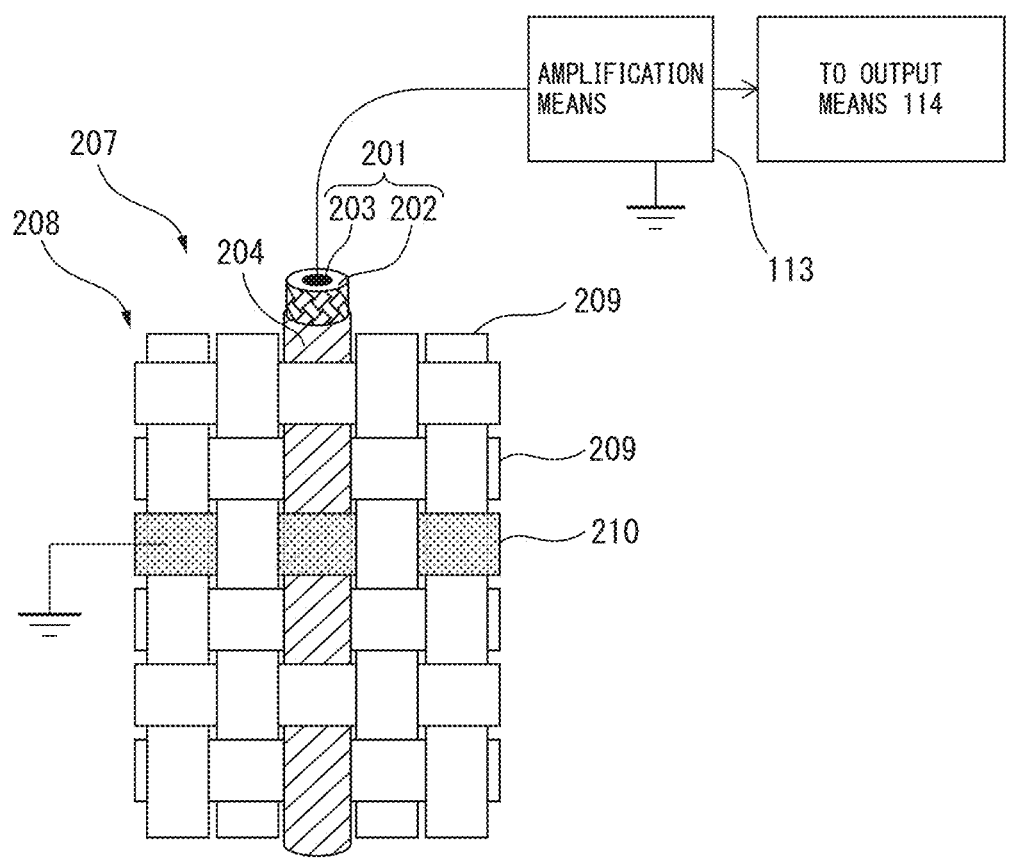
FIG. 22 is a schematic diagram showing another example of the construction of a device comprising a fabric-like piezoelectric element according to an embodiment of the third invention.
Figure 23:
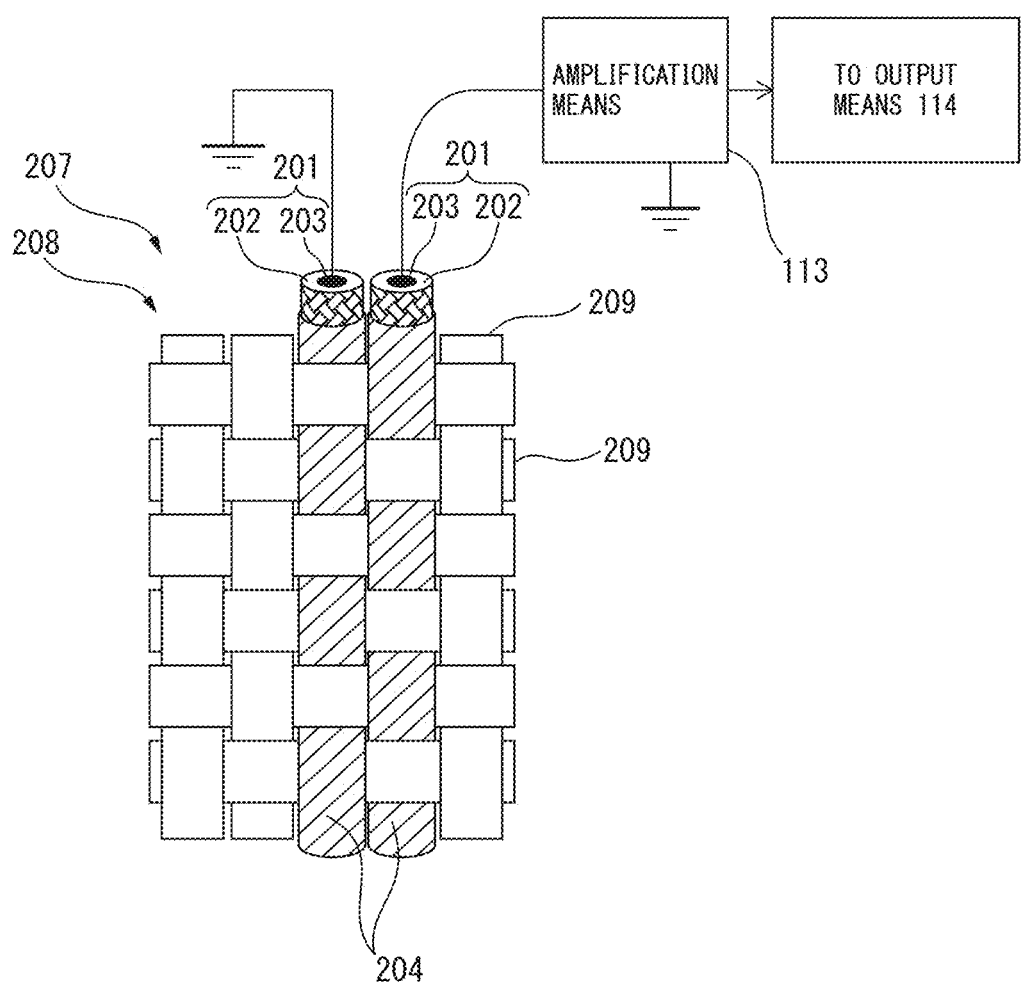
FIG. 23 is a schematic diagram showing another example of the construction of a device comprising a fabric-like piezoelectric element according to an embodiment of the third invention.

FIGS. 21 to 23 are schematic diagrams showing examples of the construction of a device comprising a braided fabric-like piezoelectric element according to an embodiment. The amplification means 113 in each of FIGS. 21 to 23 corresponds to the one explained with reference to FIG. 6, although the illustrations in FIGS. 21 to 23 omit the output means 114 and transmission means 115 shown in FIG. 6. When a device is constructed comprising the fabric-like piezoelectric element 207, a lead wire is connected from the output terminal of the core 203 of the braided piezoelectric element 201 (formed of the conductive fiber B) to an input terminal of the amplification means 113, while the conductive layer 204 of the braided piezoelectric element 201, or the conductive fiber 210 of the fabric-like piezoelectric element 207, or a braided piezoelectric element that is separate from the braided piezoelectric element 201 connected to the input terminal of the amplification means 113, is connected to a ground (earth) terminal. For example, as shown in FIG. 21, in the fabric-like piezoelectric element 207, a lead wire from the output terminal of the core 203 of the braided piezoelectric element 201 is connected to the input terminal of the amplification means 113, and the conductive layer 204 of the braided piezoelectric element 201 is grounded (earthed). In the fabric-like piezoelectric element 207 shown in FIG. 22, for example, a lead wire from the core 203 of the braided piezoelectric element 201 is connected to the input terminal of the amplification means 113, and the conductive fibers 210 contacting with the braided piezoelectric element 201 in a crossing manner are grounded (earthed). Alternatively, when multiple braided piezoelectric elements 201 are arranged in the fabric-like piezoelectric element 207 as shown in FIG. 23, for example, a lead wire from the output terminal of the core 203 of one braided piezoelectric element 201 is connected to the input terminal of the amplification means 113, while a lead wire from the core 203 of another braided piezoelectric element 201 alongside the braided piezoelectric element 201 is grounded (earthed).

When deformation is produced in the central axis direction of the braided piezoelectric element 201, the piezoelectric fibers A deform, generating polarization. As the positive and negative electrical charges generated by polarization of the piezoelectric fibers A become aligned, electrical charge migration takes place on the lead wire from the output terminal of the conductive fiber B that forms the core 203 of the braided piezoelectric element 201. The electrical charge migration on the lead wire from the conductive fiber B appears as a minute electrical signal (current or difference in potential). In other words, the amplification means 113 to which the electrical signal is outputted from the output terminal in response to the electrical charge generated when deformation is applied to the braided piezoelectric element 201, amplifies the electrical signal, while the output means 114 outputs the electrical signal amplified at the amplification means 113. Since the polarity, amplitude and phase of the electrical signal outputted from the output means 114 will differ depending on the type of deformation of the braided piezoelectric element 201, the mode of complex deformation such as twisting can be discriminated based on the results obtained by comparison of the polarity, amplitude and phase of the electrical signals outputted from the output means 114.

Electrical connection between the braided piezoelectric element and other members (connectors or conductor wires) for connection of the braided piezoelectric element with electronic circuits of the amplification means 113 and other components in FIG. 21 to 23, is difficult when the braided piezoelectric element is covered with the fabric. Therefore, preferably the braided piezoelectric element is partially exposed through the fabric, and the conductive fibers and/or conductive layer of the braided piezoelectric element are electrically connected with the other members at the exposed sections. From the viewpoint of balance between connection ease and performance, the sizes of the exposed sections are preferably between 2 mm and 100 mm, more preferably between 5 mm and 50 mm and even more preferably between 10 mm and 30 mm.

In order to provide the fabric-like piezoelectric element with the exposed sections it is necessary to perform subsequent processing such as partial excision of the fabric, which is undesirable as it poses the risk of impairing the physical properties of the fabric, and therefore preferably during production of the fabric-like piezoelectric element, it is woven or knitted with a texture so as to expose the braided piezoelectric element at the sites of connection with the other members.

Since the device 111 of the invention is a fabric that is flexible, it has a very wide range of potential uses. Specific examples for the device 111 of the invention may be clothing that includes caps, gloves and socks, touch panels in the form of supporters or handkerchiefs, and surface pressure-sensitive sensors for humans or animals, such as sensors that detect bending, twisting or stretching of the joint sections of gloves or bands or supporters, for example. When used for a human, for example, it may be used as an interface for detection of contact or movement and collection of data regarding movement of a joint being used for medical purposes, or for amusement, or for movement of lost tissue or a robot. In addition, it may be used as a surface pressure-sensitive sensor in a stuffed doll simulating an animal or human form, or a robot, or as a sensor for sensing of bending, twisting or stretching of joints. It may still further be used as a surface pressure-sensitive sensor or shape deformation sensor in beddings such as sheets or pillows, shoe soles, gloves, chairs, mats, bags, flags or the like.

In addition, since the device 111 of the invention is in braided or fabric form and is flexible, it may be used as a surface pressure-sensitive sensor or shape deformation sensor by attachment or covering on the surface of all or portions of various structures.

Furthermore, since the device 111 of the invention can generate a sufficient electrical signal simply by rubbing the surface of the braided piezoelectric element 201, it can be used in touch input devices such as touch sensors, or in pointing devices. Moreover, since positional information and shape information in the height direction of an object to be measured can be obtained by rubbing the surface of the object to be measured with the braided piezoelectric element 201, it can be used in surface form measurement and the like.

EXAMPLES

The present invention will now be described in greater detail by examples, with the understanding that the invention is not in any way restricted by the examples.

The properties of the piezoelectric fibers (piezoelectric structures), braided piezoelectric elements and fabric-like piezoelectric elements described in the Examples were determined by the following methods.

[Piezoelectric Fibers]
(1) Poly-L-Lactic Acid Crystallinity $X_{homo}$:

The poly-L-lactic acid crystallinity $X_{homo}$ was determined from crystal structure analysis by wide-angle X-ray diffraction (WAXD). In the wide-angle X-ray diffraction (WAXD), an Ultrax18 X-ray diffraction apparatus by Rigaku Corp. was used in a transmission method, and the X-ray diffraction pattern of a sample was recorded on an imaging plate under the following conditions.

X-ray source: Cu-Kα rays (confocal mirror)
Output: 45 kV×60 mA
Slits: 1st: 1 mmΦ, 2nd: 0.8 mmΦ
Camera length: 120 mm
Elapsed time: 10 minutes
Sample: 35 mg of polylactic acid fibers aligned to form a 3 cm fiber bundle.

The total scattering intensity $I_{total}$ over the declination in the obtained X-ray diffraction pattern was determined, and the sum $\Sigma I_{HMi}$ of the integrated intensity for each diffraction peak attributed to poly-L-lactic acid crystals, appearing near 2θ=16.5°, 18.5° and 24.3°, was calculated. Based on these values, the poly-L-lactic acid crystallinity $X_{homo}$ was calculated by the following formula (3).

[Mathematical Formula 3]

$$\text{Poly-}L\text{-lactic acid crystallinity } X_{homo}(\%) = \Sigma I_{HMi}/I_{total} \times 100 \quad (3)$$

The value of $\Sigma I_{HMi}$ was calculated by subtracting the background and amorphous diffuse scattering from the total scattering intensity.

(2) Poly-L-Lactic Acid Crystal Orientation A:

In the X-ray diffraction pattern obtained by the aforementioned wide-angle X-ray diffraction (WAXD), the poly-L-lactic acid crystal orientation A had an intensity distribution with respect to the declination (°) for the diffraction peaks attributable to poly-L-lactic acid crystals, appearing near 2θ=16.5° in the radius vector direction, and it was calculated from the sum $\Sigma W_i$ (°) of the half-widths in the obtained distribution profile, using the following formula (4).

[Mathematical Formula 4]

$$\text{Poly-}L\text{-lactic acid crystal orientation } A(\%) = (360 - \Sigma W_i) \div 360 \times 100 \quad (4)$$

(3) Optical Purity of Polylactic Acid:

After sampling 0.1 g of a single polylactic acid fiber composing the fabric (one bundle in the case of a multifilament), 1.0 mL aqueous sodium hydroxide at 5 mol/liter concentration and 1.0 mL methanol were added, the mixture was set in a water bath shaker adjusted to 65° C., hydrolysis was performed for about 30 minutes until the polylactic acid became a homogeneous solution, the completely hydrolyzed solution was neutralized to pH 7 by addition of 0.25 mol/liter sulfuric acid, and 0.1 mL of the hydrolyzed solution was sampled and diluted with 3 mL of a high-performance liquid chromatography (HPLC) mobile phase solution, and filtered with a membrane filter (0.45 μm). The modified solution was measured by HPLC to quantify the proportion of L-lactic acid monomer and D-lactic acid monomer. When one polylactic acid fiber did not fully supply 0.1 g, the amount of the other solution was adjusted to match the sampleable amount, and the polylactic acid concentration of the sample solution provided for HPLC measurement was adjusted in a range from an amount equal to the above, to ¹⁄₁₀₀.

<HPLC Measuring Conditions>
Column: "SUMICHIRAL®" OA-5000 (4.6 mmφ×150 mm) by Sumika Chemical Analysis Service, Ltd.
Mobile phase: 1.0 millimole/liter aqueous copper sulfate solution
Mobile phase flow rate: 1.0 milliliter/min
Detector: UV detector (wavelength of 254 nm)
Injection rate: 100 microliters With the peak area attributed to L-lactic acid monomer as $S_{LLA}$ and the peak area attributed to D-lactic acid monomer as $S_{DLA}$, since $S_{LLA}$ and $S_{DLA}$ are proportional to the molar concentration of L-lactic acid monomer $M_{LLA}$ and the molar concentration $M_{DLA}$ of D-lactic acid monomer, respectively, the larger value of $S_{LLA}$ and $S_{DLA}$ was used as $S_{MLA}$ to calculate the optical purity by the following formula (5).

[Mathematical Formula 5]

$$\text{Optical purity}(\%) = S_{MLA} \div (S_{LLA} + S_{DLA}) \times 100 \quad (5)$$

[Fabric-Like Piezoelectric Element]
(4) Pull-Out Strength

When the braided piezoelectric element had a portion exposed through the fabric-like piezoelectric element, the exposed braided piezoelectric element was held by one gripping jig of a tensile tester ("TENSILON RTC-1225A" universal testing machine by Orientech Co., Ltd.), and the braided piezoelectric element and fabric-like piezoelectric element were cut at a section 5 cm from the end where the braided piezoelectric element was anchored, on the gripped side. The portions on both flanks of the 5 cm portion where the braided piezoelectric element was anchored to the fabric, excluding a region within 1 mm from the braided piezoelectric element, were gripped with an U-shaped gripping jig over a length of 5 cm in the lengthwise direction of the braided piezoelectric element, and connected to the other gripping jig of the tensile tester. In this state, a tensile test was conducted at a speed of 10 mm/min, and the maximum strength was measured and recorded as the pull-out strength. When the braided piezoelectric element did not have an adequate region exposed from the fabric-like piezoelectric element, a portion of the fabric (a portion other than the braided piezoelectric element) was cut to expose the braided piezoelectric element prior to the measurement described above. When it was difficult to ensure a length of 5 cm at the portion where the braided piezoelectric element was anchored to the fabric, the pull-out strength of an anchored part of an arbitrary length was measured and converted to a strength per 5 cm.

(5) Coverage Factor

Using 6 microscope photographs taken at three arbitrary points of the braided piezoelectric element in the fabric-like piezoelectric element, from both the front and back sides, the proportion of area of the exposed section that was visible through the braid surface, with respect to the area calculated as the product of the braid width and the length of the observed section, was calculated for a section spanning a length of at least 10 times the width of the braided piezoelectric element, recording the value of the proportion subtracted from 100% as the coverage factor, and the average value for 3 photographs of the front side was recorded as the coverage factor (front), while the average value for 3 photographs of the back side was recorded as the coverage factor (back).

(6) Electrical Signal Measurement

With an Electrometer (B2987A by Keysight) connected to the conductor of the piezoelectric element via a coaxial cable (core: Hi electrode, shield: Lo electrode), the piezoelectric element was subjected to the following bending motion while measuring the current value at 50 msec intervals.

(6-1) Bending Test

The test apparatus used comprised two chucks (upper and lower chucks), the lower chuck being fixed onto a rail moving only in the vertical direction and having a constant downward load of 0.5 N applied, and the upper chuck being situated 72 mm above the lower chuck, with the upper chuck moving on an imaginary circumference with the line segment connecting the two chucks as the diameter, having fixed two circular columns with 15 mm-diameter circular cross-sections and centers at locations 16 mm left and right from the center of the imaginary circle (plain woven fabrics composed of cotton yarn at a yarn count of 50 being attached to the sides) and with the fabric-like piezoelectric element fixed between the two circular columns so as to allow bending deformation to be applied with the two circular columns as fulcrums, and after the fabric-like piezoelectric element was gripped with the upper and lower chucks to fix it while the braided piezoelectric element was gripped by the upper and lower chucks, the upper chuck was situated at the 12-o'clock position while the lower chuck was situated at the 6-o'clock position on the imaginary circumference, and reciprocal bending motion was repeated 10 times, in which the upper chuck was moved from the 12-o'clock position through the 1-o'clock and 2-o'clock positions on the imaginary circumference to the 3-o'clock position over a period of 0.9 second at a constant speed, and then moved through the 12-o'clock position to the 9-o'clock position over a period of 1.8 seconds and returned again to the 12-o'clock position over a period of 0.9 second, during which time the current value was measured, and the average peak value of the current value during the period of being moved from the 12-o'clock position to the 3-o'clock position, for the 10 reciprocal movements, was measured and recorded as the signal value.

(7) Outer Appearance of Braided Piezoelectric Element

After 1000 passes of the bending test of (6-1), the braided piezoelectric element in the fabric-like piezoelectric element was removed and the state of detachment of the silver plating on the outer conductive layer surface was observed with a microscope. Samples with absolutely no detachment were evaluated as highly acceptable, those with slight visible detachment were evaluated as acceptable, and those with frequent visible detachment were evaluated as unacceptable.

[Braided Piezoelectric Element]

(8) Orientation Angle θ of Piezoelectric Polymer with Respect to Direction of Central Axis The orientation angle θ of the piezoelectric polymer with respect to the direction of the central axis was calculated by the following formula.

$$\theta = \arctan(2\pi Rm/HP)(0° \leq \theta \leq 90°)$$

Here, $Rm=2(Ro^3-Ri^3)/3(Ro^2-Ri^2)$, i.e., the radius of the braided piezoelectric element (or other structure) as a weighted average based on the cross-sectional area. The helical pitch HP and the outer radius Ro and inner radius Ri of the portions constituted by the braided piezoelectric element (or other structure) were measured in the following manner.

(8-1) For a braided piezoelectric element, the side was photographed (or in the case of covering other than by the piezoelectric polymer of the braided piezoelectric element, the covering was first removed as necessary to form a condition allowing the piezoelectric polymer to be observed from the side), and the helical pitch HP (μm) of the piezoelectric polymer was measured at 5 arbitrary locations as shown in FIG. 3, recording the average value. The braided piezoelectric element was impregnated with the low-viscosity rapid bonding adhesive "AronAlpha EXTRA2000" (Toa-Gosei Co., Ltd.) which was allowed to solidify, after which a cross-section was cut out perpendicular to the long axis of the braid, a cross-sectional photograph was taken, and for each cross-sectional photograph, the outer radius Ro (μm) and inner radius Ri (μm) were measured at sections occupied by the braided piezoelectric element, with the same measurement being conducted at 5 other arbitrary cross-section locations and the average value being recorded. When a piezoelectric polymer and insulating polymer were both incorporated, such as when using doubled piezoelectric fibers and insulating fibers, or when 4 fibers of an 8-strand braid were of the piezoelectric polymer and the remaining 4 fibers were of the insulating polymer, since the regions where the piezoelectric polymer was present and the regions where the insulating polymer was present were interchanging when taking cross-sections at different locations, the regions where the piezoelectric polymer was present and the regions where the insulating polymer was present were collectively considered to be the portion occupied by the braided piezoelectric element. However, sections where the insulating polymer and piezoelectric polymer were not both incorporated were not considered to be a part of the braided piezoelectric element.

Figure 9A:
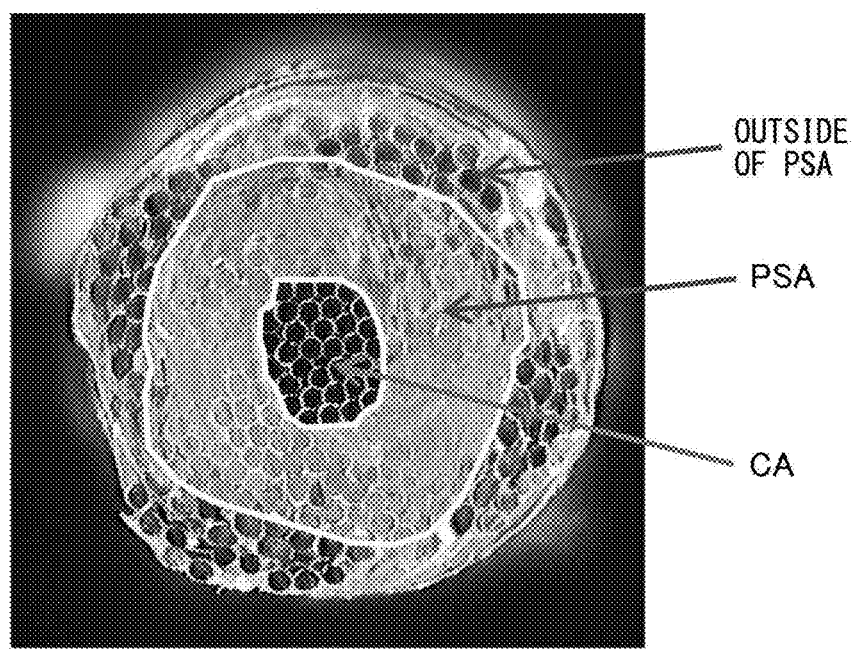
FIG. 9A is a photomicrograph of a cross-section of a braided piezoelectric element according to the Examples.
Figure 9B:
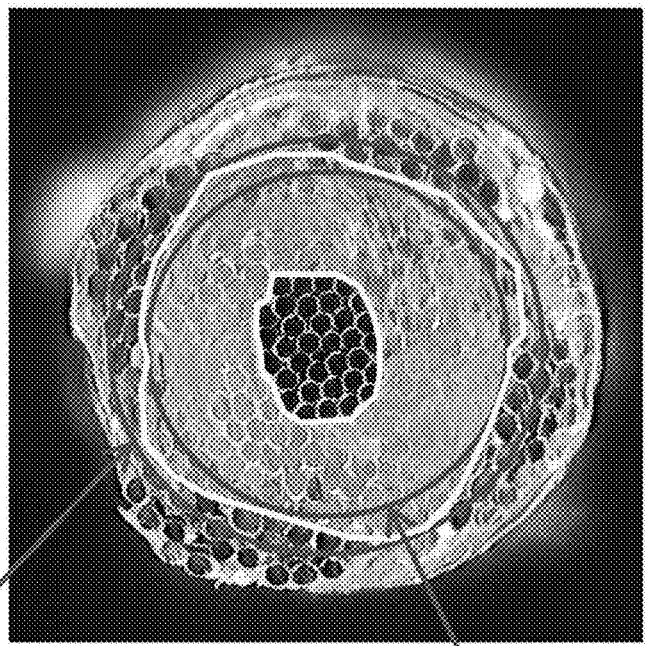
FIG. 9B is a photomicrograph of a cross-section of a braided piezoelectric element according to the Examples.
Figure 9C:
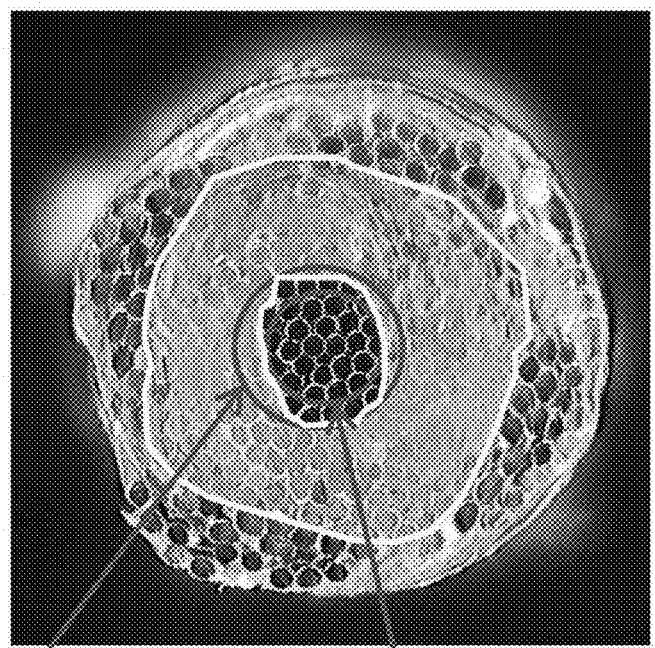
FIG. 9C is a photomicrograph of a cross-section of a braided piezoelectric element according to the Examples.

The outer radius Ro and inner radius Ri were measured in the following manner. As shown in the cross-sectional photograph of FIG. 9A, two regions were defined: the region occupied by the piezoelectric structure (the sheath 2 formed by piezoelectric fibers A) (this region will hereunder be referred to as "PSA"), and the region at the center portion of PSA that was not PSA (this region will hereunder be referred to as "CA"). The average value between the diameter of the minimum circle not overlapping with PSA, on the outside of PSA, and the diameter of the maximum circle not falling outside of PSA (but possibly falling within CA) was recorded as Ro (FIG. 9B). Also, the average value between the diameter of the minimum circle not overlapping with CA, on the outside of CA, and the diameter of the maximum circle not falling outside of CA was recorded as Ri (FIG. 9C).

(8-2) For a covering thread-like piezoelectric element, the helical pitch HP (μm) was 1,000.000/T, for a winding speed of T times/m during covering of the piezoelectric polymer (the rotational speed of the piezoelectric polymer per length of the covering thread). The covering thread-like piezoelectric element was impregnated with the low-viscosity rapid bonding adhesive "AronAlpha EXTRA2000" (ToaGosei Co., Ltd.) which was allowed to solidify, after which a cross-section was cut out perpendicular to the long axis of the braid, a cross-sectional photograph was taken, and for each cross-sectional photograph, the outer radius Ro (μm) and inner radius Ri (μm) were measured at sections occupied by the covering thread-like piezoelectric element, similar to the braided piezoelectric element, with the same measurement being conducted at 5 other arbitrary locations of the cross-section and the average value being recorded. When a piezoelectric polymer and insulating polymer were both covered, such as when doubled piezoelectric fibers and insulating fibers were covered, or when piezoelectric fibers and insulating fibers were simultaneously covered in a non-overlapping manner, since the regions where the piezoelectric polymer was present and the regions where the insulating polymer was present were interchanging when taking cross-sections at different locations, the regions where the piezoelectric polymer was present and the regions where the insulating polymer was present were collectively considered to be the portion occupied by the covering thread-like piezoelectric element. However, sections where the insulating polymer and piezoelectric polymer were not simultaneously covered, i.e., sections in which the insulating polymer was always on the inside or outside of the piezoelectric polymer in any cross-section, were not considered to be a part of the covering thread-like piezoelectric element.

(9) Electrical Signal Measurement

With an Electrometer (B2987A by Keysight) connected to the conductor of the piezoelectric element via a coaxial cable (core: Hi electrode, shield: Lo electrode), the piezoelectric element was subjected to one of the motion tests of 9-1 to 9-5 below, while measuring the current value at 50 msec intervals.

(9-1) Tensile Test

Using a "TENSILON RTC-1225A" universal testing machine by Orientech Co., Ltd., the piezoelectric element was gripped by a chuck across a spacing of 12 cm in the longitudinal direction of the piezoelectric element, and with 0.0 N as the force on the element in the relaxed state and 0 mm as the displacement when stretching to a tensile force of 0.5 N, an operation of pulling to 1.2 mm at an operating speed of 100 mm/min followed by restoration to 0 mm at an operating speed of −100 mm/min, was repeated 10 times.

(9-2) Torsional Test

Using a torsional test device designed having one of two chucks gripping the piezoelectric element set on a rail able to move freely in the long axis direction of the piezoelectric element without twisting movement, with constant application of 0.5 N tensile force on the piezoelectric element, and the other chuck able to perform twisting movement without movement in the long axis direction of the piezoelectric element, the piezoelectric element was gripped with the chucks across a spacing of 72 mm in the longitudinal direction of the piezoelectric element, and a reciprocal twisting operation of rotating from 0° to 45° at a speed of 100°/s followed by rotating from 45° to 0° at a speed of −100/s was repeated 10 times, the twisting being in the clockwise direction when viewing the chucks from the center of the element.

(9-3) Bending Test

Using a test apparatus comprising two chucks, an upper and a lower chuck, with the lower chuck fixed and the upper chuck positioned 72 mm above the lower chuck, the upper chuck being movable over an imaginary circumference having a line segment connecting the two chucks as the diameter, the piezoelectric element was anchored by being gripped by the chucks, and after slightly warping the piezoelectric element in a convex manner in the 9-o'clock direction with the upper chuck at the 12-o'clock position and the lower chuck at the 6-o'clock position on the circumference, reciprocal bending motion in which the upper chuck was moved from the 12-o'clock position through the 1-o'clock and 2-o'clock positions on the circumference to the 3-o'clock position over a period of 0.9 second at a constant speed, and then moved to the 12-o'clock position over a period of 0.9 second, was repeated 10 times.

(9-4) Shearing Test

A section of the piezoelectric element with a length of 64 mm at the center portion was horizontally sandwiched from above and below by two rigid metal sheets having a plain woven fabric woven with cotton yarn at a yarn count of 50 attached to their surfaces (the lower metal sheet being fixed to a base), and a perpendicular load of 3.2 N was applied from above with the cotton cloth and piezoelectric element unable to slide between the metal sheet surfaces, and then shearing motion, in which the upper metal sheet was pulled in the longitudinal direction of the piezoelectric element over a period of 1 second from a load of 0 N to 1 N and then the tensile load was restored to 0 N over a period of 1 second, was repeated 10 times.

(9-5) Compression Test

Using a "TENSILON RTC-1225A" universal testing machine by Orientech Co., Ltd., a section of the piezoelectric element with a length of 64 mm at the center portion, set still on a horizontal rigid metal base, was gripped horizontally by the rigid metal sheet set on the upper cross head, and motion in which the upper cross head was lowered and pressed on the metal sheet from above the piezoelectric element from a reaction force of 0.01 N to 20 N over a period of 0.6 second and then the pressure was released to 0.01 N over a period of 0.6 second, was repeated 10 times.

The piezoelectric element fabric was produced by the following method.

(Production of Polylactic Acid)

The polylactic acid used in the examples was produced by the following method.

After adding 0.005 part by mass of tin octylate to 100 parts by mass of L-lactide (product of Musashino Chemical Laboratory. Co. Ltd., 100% optical purity), the mixture was reacted at 180° C. for 2 hours in a stirring blade-equipped reactor under a nitrogen atmosphere, and phosphoric acid was added at 1.2 equivalents with respect to the tin octylate, after which the remaining lactide was removed under reduced pressure at 13.3 Pa, and chips were formed to obtain poly-L-lactic acid (PLLA1). The weight-average molecular weight of the obtained PLLA1 was 152,000, the glass transition point (Tg) was 55° C. and the melting point was 175° C.

(Piezoelectric Fibers)

PLLA1 melted at 240° C. was discharged from a 24-hole cap at 20 g/min, and drawn out at 887 m/min. The unstretched multifilament thread was stretched to a factor of 2.3 at 80° C. and heat set at 100° C., to obtain an 84 dTex/24 filament multifilament uniaxial stretched thread PF1. PLLA1 melted at 240° C. was discharged from a 12-hole cap at 8 g/min, and drawn out at 1050 min. The unstretched multifilament thread was stretched to a factor of 2.3 at 80° C. and heat set at 150° C., to obtain an 33 dtex 12 filament multifilament uniaxial stretched thread PF2. The piezoelectric fibers PF1 and PF2 were used as piezoelectric polymers. The poly-L-lactic acid crystallinity, poly-L-lactic acid crystal orientation and optical purity of PF1 and PF2 were measured by the methods described above, giving the results listed in Table 1.

TABLE 1

Table 1

| Piezoelectric fibers | Poly-L-lactic acid crystallinity $X_{homo}$ [%] | Poly-L-lactic acid crystal orientation A [%] | Poly-lactic acid optical purity [%] |
|---|---|---|---|
| PF1 | 35.9 | 95.6 | 99.7 |
| PF2 | 36.8 | 94.8 | 99.9 |

(Conductive Fiber)

Silver plated nylon "AGposs" 100d34f (CF1) by Mitsufuji Corp. was used as the conductive fiber B. The resistivity of the CF1 was 250 Ω/m.

Also, silver plated nylon "AGposs" 30d10f (CF2) by Mitsufuji Corp. was used as the conductive fiber B and conductive fiber 206. The conductivity of the CF2 was 950 Ω/m.

(Insulating Fibers)

Stretched yarn IF1 (84 dTex/24 filament) produced by melt spinning and then stretching of polyethylene terephthalate, and stretched yarn IF2 (33 dTex/12 filament), were used as insulating fibers.

Example 1

In this example, the effect of the orientation angle θ and T1/T2 value of piezoelectric polymers on electrical signals in response to stretching deformation was examined, for piezoelectric elements to be used for the first invention to third invention.

Example A

As the sample for Example A, a braided piezoelectric element 1-A was fabricated having conductive fiber CF1 as the core thread and with piezoelectric fibers PF1 wound in a helical manner in the Z-twisting direction around the core thread, as shown in FIG. 10, by setting the piezoelectric fibers PF1 on 4 carriers in the Z-twisting direction and setting insulating fibers IF1 on 4 carriers in the S-twisting direction, of the 8 carriers of an 8-strand round braid braiding machine.

Example B

Using the braided piezoelectric element 1-A as core thread, braided piezoelectric element 1-B, having the braided piezoelectric element 1-A covered by conductive fibers, was fabricated by setting the conductive fibers CF2 on all of the 4 carriers in the Z-twisting direction and 4 carriers in the S-twisting direction, of the 8 carriers of the braider.

Examples C and D

In the same manner as braided piezoelectric element 1-A, except for changing the coiling speed for PF1, two braided piezoelectric elements were formed and the braided piezoelectric elements were used as core threads and covered with conductive fibers in the same manner as braided piezoelectric element 1-B, to fabricate braided piezoelectric elements 1-C and 1-D.

Examples E to H

Braided piezoelectric elements were fabricated having piezoelectric fibers PF1 wound in a helical fashion at prescribed proportions in the Z-twisting direction and the S-twisting direction around the core thread, by setting PF1 or IF1 on carriers in the Z-twisting direction and S-twisting direction of the 8 carriers of the braider as shown in Table 2, and braided piezoelectric elements 1-E to 1-H were fabricated having the braided piezoelectric elements as core threads and covered with conductive fibers in the same manner as braided piezoelectric element 1-B.

Example I

A braided piezoelectric element was fabricated in the same manner as braided piezoelectric element 1-A, except for using PF2 instead of PF1 and IF2 instead of IF1, and adjusting the coiling speed, and the braided piezoelectric element was used as core thread and covered with conductive fibers in the same manner as braided piezoelectric element 1-B, to fabricate braided piezoelectric element 1-I.

Example J

A braided piezoelectric element was fabricated in the same manner as braided piezoelectric element 1-A, except for using IF2 instead of PF2 and PF2 instead of IF2, and the braided piezoelectric element was used as core thread and covered with conductive fibers in the same manner as braided piezoelectric element 1-B, to fabricate braided piezoelectric element 1-J.

Example K

Covering thread-like piezoelectric element 1-K was fabricated having piezoelectric fibers PF1 wrapped in a helical manner around a core thread in the S-twisting direction and having the outside covered by conductive fibers, by using CF1 as the core thread and PF1 wrapped around to cover the core thread 3000 times/m in the S-twisting direction, further wrapping the outside with IF1 to cover it 3000 times/m in the Z-twisting direction, in turn wrapping that outside with CF2 to cover it 3000 times/m in the S-twisting direction, and still further wrapping that outside with CF2 to cover it 3000 times/m in the Z-twisting direction.

Example L

A braided piezoelectric element was fabricated in the same manner as braided piezoelectric element 1-A, except for using IF1 instead of PF1, and the braided element was used as core thread to fabricate a braided element 1-L covered with conductive fibers in the same manner as braided piezoelectric element 1-B.

Example M

A covering thread-like element was fabricated in the same manner as covering thread-like piezoelectric element 1-K, except for using IF1 instead of PF1, to obtain covering thread-like element 1-M.

Example N

Braided piezoelectric element 1-N was fabricated in the same manner as braided piezoelectric element 1-B, except for using PF1 instead of IF1.

Example O

Braided piezoelectric element 1-O was fabricated in the same manner as braided piezoelectric element 1-I, except for using PF2 instead of IF2.

Example P

A braided piezoelectric element was fabricated having conductive fiber CF1 as the core thread and piezoelectric fibers PF1 wrapped in a helical fashion around a core thread in the Z-twisting direction, by setting the piezoelectric fibers PF1 on 8 carriers in the Z-twisting direction and setting insulating fibers IF1 on 8 carriers in the S-twisting direction, of the 16 carriers of an 16-strand round braid braiding machine, and a braided piezoelectric element 1-P was fabricated having this braided piezoelectric element as the core thread and covered with conductive fiber in the same manner as braided piezoelectric element 1-B.

Example Q

Covering thread-like piezoelectric element 1-Q was fabricated having piezoelectric fibers PF1 wrapped in a helical manner around a core thread in the S-twisting direction and having the outside further covered by conductive fibers, by using CF1 as the core thread and PF1 wrapped around to cover the core thread 6000 times/m in the S-twisting direction, further wrapping the outside with IF1 to cover it 6000 times/m in the Z-twisting direction, in turn wrapping that outside with CF2 to cover it 3000 times/m in the S-twisting direction, and still further wrapping that outside with CF2 to cover it 3000 times/m in the Z-twisting direction.

The Ri, Ro and HP values of each piezoelectric element were measured, and the calculated values of the orientation angle θ of the piezoelectric polymer with respect to the direction of the central axis and the T1/T2 are shown in Table 2. Ri and Ro for each braided piezoelectric element were measured in a region occupied by the piezoelectric element which was a combination of cross-sectional regions containing piezoelectric fibers and insulating fibers. Ri and Ro for each covering thread-like piezoelectric element were also measured in a region occupied by the piezoelectric element which was a cross-sectional region containing piezoelectric fibers. Each piezoelectric element was also cut to a 15 cm length and connected to an Electrometer (B2987A by Keysight) with conductive fiber of the core as the Hi electrode and conductive fibers of the wire mesh or sheath shielding the periphery as the Lo electrode, to monitor the current value. Table 2 shows the current values during the tensile test, torsional test, bending test, shearing test and compression test. Examples L and M did not include a piezoelectric polymer, and therefore the θ and T1/T2 values could not be measured.

TABLE 2

| | | | Piezoelectric fibers | | | | | |
| --- | --- | --- | --- | --- | --- | --- | --- | --- |
| Ex. | Element | Conductive fiber of core | Z-twisting direction | | S-twisting direction | | θ [°] | T1/T2 |
| A | Braided piezoelectric element 1-A | CF1 | PF1 | 4 strands | IF1 | 4 strands | 38 | 0 |
| B | Braided piezoelectric element 1-B | CF1 | PF1 | 4 strands | IF1 | 4 strands | 38 | 0 |
| C | Braided piezoelectric element 1-C | CF1 | PF1 | 4 strands | IF1 | 4 strands | 44 | 0 |
| D | Braided piezoelectric element 1-D | CF1 | PF1 | 4 strands | IF1 | 4 strands | 29 | 0 |
| E | Braided piezoelectric element 1-E | CF1 | PF1 | 4 strands | PF1 IF1 | 1 strand 3 strands | 44 | 0.25 |
| F | Braided piezoelectric element 1-F | CF1 | PF1 | 4 strands | PF1 IF1 | 2 strands 2 strands | 43 | 0.5 |
| G | Braided piezoelectric element 1-G | CF1 | PF1 | 4 strands | PF1 IF1 | 3 strands 1 strand | 45 | 0.75 |
| H | Braided piezoelectric element 1-H | CF1 | PF1 IF1 | 1 strand 3 strands | IF1 | 4 strands | 43 | 0 |
| I | Braided piezoelectric element 1-I | CF1 | PF2 | 4 strands | IF2 | 4 strands | 44 | 0 |
| J | Braided piezoelectric element 1-J | CF1 | IF2 | 4 strands | PF2 | 4 strands | 42 | 0 |
| K | Covering thread-like piezoelectric element 1-K | CF1 | IF1 | 1 strand | PF1 | 1 strand | 60 | 0 |
| L | Braided element 1-L | CF1 | IF1 | 4 strands | IF1 | 4 strands | — | — |

TABLE 2-continued

| Ex. | | | | | | | | | |
|---|---|---|---|---|---|---|---|---|---|
| M | Covering thread-like element 1-M | CF1 | IF1 | 1 strand | IF1 | 1 strand | — | — |
| N | Braided piezoelectric element 1-N | CF1 | PF1 | 4 strands | PF1 | 4 strands | 35 | 1 |
| O | Braided piezoelectric element 1-O | CF1 | PF2 | 4 strands | PF2 | 4 strands | 43 | 1 |
| P | Braided piezoelectric element 1-P | CF1 | PF1 | 8 strands | IF1 | 8 strands | 3.5 | 0 |
| Q | Covering thread-like piezoelectric element 1-Q | CF1 | PF1 | 1 strand | IF1 | 1 strand | 80 | 0 |

| | Conductive fibers of sheath | | Current signal [pA] | | | | |
|---|---|---|---|---|---|---|---|
| Ex. | Z-twisting direction | S-twisting direction | Tensile test | Twisting test | Bending test | Shear test | Compression test |
| A | None | None | −992 | 49 | 3 | −11 | 9 |
| B | CF2 4 strands | CF2 4 strands | −1262 | 58 | −1 | 13 | −18 |
| C | CF2 4 strands | CF2 4 strands | −1718 | −15 | −1 | 0 | 9 |
| D | CF2 4 strands | CF2 4 strands | −1060 | 45 | −8 | −1 | −2 |
| E | CF2 4 strands | CF2 4 strands | −1443 | −19 | −7 | 8 | 4 |
| F | CF2 4 strands | CF2 4 strands | −1115 | −16 | 8 | 3 | −3 |
| G | CF2 4 strands | CF2 4 strands | −872 | −10 | −3 | 2 | 0 |
| H | CF2 4 strands | CF2 4 strands | −355 | −4 | −11 | 0 | 13 |
| I | CF2 4 strands | CF2 4 strands | −3165 | −13 | −5 | −7 | 42 |
| J | CF2 4 strands | CF2 4 strands | 3347 | 24 | 10 | 1.2 | 41 |
| K | CF2 1 strand | CF2 1 strand | 650 | −41 | 19 | 4 | 21 |
| L | CF2 4 strands | CF2 4 strands | 12 | −9 | 5 | 7 | 45 |
| M | CF2 1 strand | CF2 1 strand | 11 | 0.9 | 1 | 1 | 5 |
| N | CF2 4 strands | CF2 4 strands | 85 | 80 | 3 | −5 | 5 |
| O | CF2 4 strands | CF2 4 strands | −33 | −10.0 | 5 | 10 | 50 |
| P | CF2 4 strands | CF2 4 strands | 29 | 183 | −6 | 1 | 8 |
| Q | CF2 4 strands | CF2 4 strands | −220 | −257 | 5 | −3 | −12 |

Based on the results in Table 2, when the orientation angle θ of the piezoelectric polymer with respect to the direction of the central axis is between 15° and 75° and the value of T1/T2 is between 0 and 0.8, a large signal is generated in response to tensile motion (stretching deformation) while a large signal is not generated with motion other than tensile motion, indicating that the element selectively responds to tensile motion. When Examples I and J are compared, for comparison between a case where most of the piezoelectric fibers are wrapped in the Z-twisting direction and where most of the piezoelectric fibers are wrapped in the S-twisting direction, the polarities of the signals in the tensile test were opposite, indicating that the direction of coiling corresponds to the polarity of the signal.

Also, while not shown in the table, comparing the signal under a tensile load and the signal without a tensile load with the elements of Examples A to K showed that signals with approximately the same absolute values but with opposite polarities were generated, indicating that the elements are suitable for quantitation of tensile load and displacement. On the other hand, comparing the signal under a tensile load and the signal without a tensile load with the elements of Examples N to O showed that the polarities of the signals were sometimes opposite and sometimes the same, indicating that the elements are not suitable for quantitation of tensile load and displacement. Furthermore, while not shown in the table, the noise level during the tensile test in Example B was lower than the noise level during the tensile test of Example A, indicating that noise can be reduced in an element shielded by situating a conductive layer made of conductive fiber on the outside of a braided piezoelectric element (piezoelectric structure).

Example 2

In this example, the effect of the orientation angle θ and T1/T2 value of piezoelectric polymers on electrical signals in response to twisting deformation was examined, for piezoelectric elements that can be used together with the piezoelectric element of Example 1 according to the second invention and third invention.

Example AA

As the sample for Example 1, a braided piezoelectric element 1-AA was fabricated having conductive fiber CF1 as the core thread and with piezoelectric fibers PF1 wound in a helical manner in the Z-twisting direction and S-twisting direction around the core thread, as shown in FIG. 10, by setting the piezoelectric fibers PF1 on all of 4 carriers in the Z-twisting direction and 4 carriers in the S-twisting direction, of the 8 carriers of an 8-strand round braid braiding machine.

Example AB

Using the braided piezoelectric element 1-AA as core thread, braided piezoelectric element 1-AB, having the braided piezoelectric element 1-AA covered by conductive fibers, was fabricated by setting the conductive fibers CF2 on all of the 4 carriers in the Z-twisting direction and 4 carriers in the S-twisting direction, of the 8 carriers of the braider.

Example AC

A braided piezoelectric element was fabricated in the same manner as braided piezoelectric element 1-AA, except for using PF2 instead of PF1, and adjusting the coiling speed, and the braided piezoelectric element 1-AA was used as core thread and covered with conductive fibers in the same manner as braided piezoelectric element 1-AB, to fabricate braided piezoelectric element 1-AC.

Example AD

A braided piezoelectric element was fabricated in the same manner as braided piezoelectric element 1-AA, except for using CF2 instead of CF1, and adjusting the coiling speed, and the braided piezoelectric element 1-AA was used as core thread and covered with conductive fibers in the same manner as braided piezoelectric element 1-AB, to fabricate braided piezoelectric element 1-AD.

Example AE

A braided piezoelectric element was fabricated having conductive fiber CF 1 as the core thread and piezoelectric fibers PF1 wrapped in a helical fashion around a core thread in the Z-twisting direction and S-twisting direction, by setting the piezoelectric fibers PF1 on all 8 carriers in the Z-twisting direction and 8 carriers in the S-twisting direction, of the 16 carriers of an 16-strand round braid braiding machine, and a braided piezoelectric element 1-AE was fabricated having this braided piezoelectric element as the core thread and covered with conductive fiber in the same manner as braided piezoelectric element 1-AB.

Example AF

Covering thread-like piezoelectric element 1-AF was fabricated having piezoelectric fibers PF1 wrapped in a helical manner around a core thread in the Z-twisting direction and S-twisting direction and having the outside covered by conductive fibers, by using CF1 as the core thread and PF1 wrapped around to cover the core thread 3000 times/m in the S-twisting direction, further wrapping the outside with PF1 to cover it 3000 times/m in the Z-twisting direction, in turn wrapping that outside with CF2 to cover it 3000 times/m in the S-twisting direction, and still further wrapping that outside with CF2 to cover it 3000 times/m in the Z-twisting direction.

Example AG

Covering thread-like piezoelectric element 1-AG was fabricated having piezoelectric fibers PF1 wrapped in a helical manner around a core thread in the Z-twisting direction and S-twisting direction and having the outside covered by conductive fibers, by using CF1 as the core thread and PF1 wrapped around to cover the core thread 6000 times/m in the S-twisting direction, further wrapping the outside with PF1 to cover it 6000 times/m in the Z-twisting direction, in turn wrapping that outside with CF2 to cover it 3000 times/m in the S-twisting direction, and still further wrapping that outside with CF2 to cover it 3000 times/m in the Z-twisting direction.

Example AH

A braided piezoelectric element was fabricated in the same manner as braided piezoelectric element 1-AA, except for using IF1 instead of PF1, and the braided element was used as core thread to fabricate a braided element 1-AH covered with conductive fibers in the same manner as braided piezoelectric element 1-AB.

Example AI

A covering thread-like element was fabricated in the same manner as covering thread-like piezoelectric element 1-AF, except for using IF1 instead of PF1, to obtain covering thread-like element 1-AI.

Examples AJ and AK

Two braided piezoelectric elements were fabricated in the same manner as braided piezoelectric elements 1-AB and 1-AC, except for changing the coiling speed for PF1 or PF2, to obtain braided piezoelectric elements 1-AJ and 1-AK.

Example AL

Braided piezoelectric element 1-AL was fabricated in the same manner as braided piezoelectric element 1-AB, except for using IF instead of PF1 wrapped in the S-twisting direction.

Example AM

Braided piezoelectric element 1-AM was fabricated in the same manner as braided piezoelectric element 1-AC, except for using IF2 instead of PF2 wrapped in the Z-twisting direction.

Example AN

Covering thread-like piezoelectric element 1-AN was fabricated in the same manner as covering thread-like piezoelectric element 1-AF, except for using IF1 instead of PF1 wrapped in the Z-twisting direction.

The Ri, Ro and HP values of each piezoelectric element were measured, and the calculated values of the orientation angle θ of the piezoelectric polymer with respect to the direction of the central axis and the T1/T2 are shown in Table 3. Ri and Ro for each braided piezoelectric element were measured in a region occupied by the piezoelectric element, which was a combination of cross-sectional regions containing piezoelectric fibers and insulating fibers. Ri and Ro for each covering thread-like piezoelectric element were also measured in a region occupied by the piezoelectric element, which was a cross-sectional region containing piezoelectric fibers. Each piezoelectric element was also cut to a 15 cm length and connected to an Electrometer (B2987A by Keysight) with conductive fiber of the core as the Hi electrode and conductive fibers of the wire mesh or sheath shielding the periphery as the Lo electrode, to monitor the current value. Table 3 shows the current values during the tensile test, torsional test, bending test, shearing test and compression test. Examples AH and AI did not include a piezoelectric polymer, and therefore the θ and T1/T2 values could not be measured.

TABLE 3

| | | | Piezoelectric fibers | | | | |
| --- | --- | --- | --- | --- | --- | --- | --- |
| Ex. | Element | Conductive fiber of core | Z-twisting direction | | S-twisting direction | | θ [°] | T1/T2 |
| AA | Braided piezoelectric element 1-AA | CF1 | PF1 | 4 strands | PF1 | 4 strands | 35 | 1 |

TABLE 3-continued

| | | | | | | | | |
|---|---|---|---|---|---|---|---|---|
| AB | Braided piezoelectric element 1-AB | CF1 | PF1 | 4 strands | PF1 | 4 strands | 35 | 1 |
| AC | Braided piezoelectric element 1-AC | CF1 | PF2 | 4 strands | PF2 | 4 strands | 31 | 1 |
| AD | Braided piezoelectric element 1-AD | CF2 | PF1 | 4 strands | PF1 | 4 strands | 33 | 1 |
| AE | Braided piezoelectric element 1-AE | CF1 | PF1 | 8 strands | PF1 | 8 strands | 3.5 | 1 |
| AF | Covering thread-like piezoelectric element 1-AF | CF1 | PF1 | 1 strand | PF1 | 1 strand | 63 | 1 |
| AG | Covering thread-like piezoelectric element 1-AG | CF1 | PF1 | 1 strand | PF1 | 1 strand | 80 | 1 |
| AH | Braided element 1-AH | CF1 | IF1 | 4 strands | IF1 | 4 strands | — | — |
| AI | Covering thread-like element 1-AI | CF1 | IF1 | 1 strand | IF1 | 1 strand | — | — |
| AJ | Braided piezoelectric element 1-AJ | CF1 | PF1 | 4 strands | PF1 | 4 strands | 43 | 1 |
| AK | Braided piezoelectric element 1-AK | CF1 | PF2 | 4 strands | PF2 | 4 strands | 43 | 1 |
| AL | Braided piezoelectric element 1-AL | CF1 | PF1 | 4 strands | IF1 | 4 strands | 38 | 0 |
| AM | Braided piezoelectric element 1-AM | CF1 | IF2 | 4 strands | PF2 | 4 strands | 30 | 0 |
| AN | Covering thread-like piezoelectric element 1-AN | CF1 | IF1 | 1 strand | PF1 | 1 strand | 60 | 0 |

| | Conductive fibers of sheath | | Current signal [pA] | | | | |
|---|---|---|---|---|---|---|---|
| Ex. | Z-twisting direction | S-twisting direction | Tensile test | Twisting test | Bending test | Shear test | Compression test |
| AA | None | None | 20 | 80 | 6 | −1 | −14 |
| AB | CF2 4 strands | CF2 4 strands | −9 | 80 | 3 | −5 | 5 |
| AC | CF2 4 strands | CF2 4 strands | 21 | 89 | −1 | 0 | 3 |
| AD | CF2 4 strands | CF2 4 strands | 9 | 106 | −7 | 1 | −2 |
| AE | CF2 4 strands | CF2 4 strands | −14 | 235 | 5 | 8 | −4 |
| AF | CF2 4 strands | CF2 4 strands | 52 | −123 | −10 | 5 | 9 |
| AG | CF2 4 strands | CF2 4 strands | −16 | −306 | −1 | −9 | −3 |
| AH | CF2 4 strands | CF2 4 strands | 8 | −1 | 2 | 2 | 0 |
| AI | CF2 1 strand | CF2 1 strand | 11 | 0.9 | 1 | 1 | 5 |
| AJ | CF2 4 strands | CF2 4 strands | −31 | −15 | 0 | −11 | 4 |
| AK | CF2 4 strands | CF2 4 strands | −33 | −10 | 5 | 10 | 50 |
| AL | CF2 4 strands | CF2 4 strands | −1262 | 58 | −1 | 13 | −18 |
| AM | CF2 4 strands | CF2 4 strands | 1007 | 95 | 8 | 2 | 15 |
| AN | CF2 1 strand | CF2 1 strand | 650 | −41 | 19 | 4 | 25 |

Based on the results in Table 3, it is seen that when the orientation angle θ of the piezoelectric polymer with respect to the direction of the central axis is between 0° and 40° or between 50° and 90°, a large signal is generated in response to twisting motion (twisting deformation). In addition, when the T1/T2 value is greater than 0.8 and no greater than 1.0, as in Examples AA to AG, a large signal is generated in response to twisting motion (twisting deformation) while a large signal is not generated in response to motion other than twisting, thus indicating that the element selectively responds to twisting motion. Moreover, when Examples AA to AE, AL and AM are compared with Examples AF, AG and AN, it is seen that the polarities of the signals during the torsional test were opposite when θ was between 0° and 40° and when θ was between 50° and 90°, indicating that θ corresponds to the polarity of the signal during torsional testing.

Also, while not shown in the table, comparing the signal under twisting in the S-twisting direction and the signal under twisting in the Z-twisting direction, with the elements of Examples AA to AG and AL to AN, showed that signals with approximately the same absolute values but with opposite polarities were generated, indicating that the elements are suitable for quantitation of twisting load and displacement. On the other hand, comparing the signal under twisting in the S-twisting direction and the signal under twisting in the Z-twisting direction, with the elements of Example AJ and Example AK, showed that the polarities of the signals were sometimes opposite and sometimes the same, indicating that the elements are not suitable for quantitation of twisting load and displacement. Furthermore, while not shown in the table, the noise level during the twisting test in Example AB was lower than the noise level during the twisting test of Example AA, indicating that noise can be reduced in an element shielded by situating a conductive layer made of conductive fiber on the outside of a braided piezoelectric element.

Example 3

A piezoelectric element fabric according to the second invention was produced by the following method.
(Production of Polylactic Acid)

The polylactic acid used in the examples was produced by the following method.

After adding 0.005 part by mass of tin octylate to 100 parts by mass of L-lactide (product of Musashino Chemical Laboratory, Co. Ltd., 100% optical purity), the mixture was reacted at 180° C. for 2 hours in a stirring blade-equipped reactor under a nitrogen atmosphere, and phosphoric acid was added at 1.2 equivalents with respect to the tin octylate, after which the remaining lactide was removed under reduced pressure at 13.3 Pa, and chips were formed to obtain poly-L-lactic acid (PLLA1). The weight-average molecular weight of the obtained PLLA1 was 152,000, the glass transition point (Tg) was 55° C. and the melting point was 175° C.

(Piezoelectric Fibers)

PLLA1 melted at 240° C. was discharged from a 24-hole cap at 22 g/min, and drawn out at 1300 m/min. The unstretched multifilament thread was stretched to a factor of 2.0 at 80° C. and heat set at 150° C., to obtain an 84 dTex/24 filament piezoelectric fiber A1.

PLLA1 melted at 240° C. was discharged from a 12-hole cap at 8 g/min, and drawn out at 1300 m/min. The unstretched multifilament thread was stretched to a factor of 2.0 at 80° C. and heat set at 150° C., to obtain an 33 dTex/12 filament piezoelectric fiber A2.

(Conductive Fiber)

Silver plated nylon "AGposs" 100d34f and 30d1 Of by Mitsufuji Corp. were used as conductive fiber B, conductive fiber 6 and conductive fiber 10. The volume resistivity of the fiber was $1.1 \times 10^{-3}$ 1 cm.

(Braided Piezoelectric Element)

As the sample for Example 3-1, the conductive fiber "AGposs" 100d34f was used as the core thread and the eight piezoelectric fibers A1 were coiled in a braided form around the core thread, to create an 8-plaited braid, and the conductive fiber "AGposs" 30d10f was further coiled around the piezoelectric fibers A1 of the sheath in a braided form to create a shield layer, thus forming a braided piezoelectric element 1A. The coiling angle α of the piezoelectric fibers A1 was 30° with respect to the fiber axis CL of the conductive fiber B. The d/Rc of the braided piezoelectric element 1A was 1.76.

As the sample for Example 3-2, the conductive fiber "AGposs" 100d34f was used as core thread, and eight piezoelectric fibers A2 were coiled in a braided form around the core thread, to create a 8-plaited braid, after which eight piezoelectric fibers 2 were further coiled in a braided form as another layer over the braid. In addition, the conductive fiber "AGposs" 30d10f was coiled around the piezoelectric fibers A2 in a braided form as a shield layer, to form a braided piezoelectric element 1B. The coiling angle α of the piezoelectric fibers A was 30° with respect to the fiber axis CL of the conductive fiber B. The d/Rc of the braided piezoelectric element 1B was 1.52.

As the sample for Comparative Example 3-1, a braided piezoelectric element 1C was formed in the same manner as Example 1, except for using piezoelectric fibers A2 instead of the piezoelectric fibers A1 of Example 3-1. The d/Rc of the braided piezoelectric element 1C was 0.84.

(Knitting)

Braided piezoelectric elements 1A to 1C were each used to fabricate circular knitted fabrics 1 to 3.

(Performance Evaluation and Evaluation Results)

The evaluation results for the braided piezoelectric elements 1A to 1C and circular knitted fabrics 1 to 3 were as follows.

Example 3-1

Using the conductive fiber B in the braided piezoelectric element 1A as a signal wire, an oscilloscope (Digital Oscilloscope DL6000 Series "DL6000", trade name of Yokogawa Electric Corp.) was connected through the wire via a 100-fold amplification circuit, and the conductive layer 204 of the braided piezoelectric element 1A was grounded (earthed). Twisting deformation was applied to the braided piezoelectric element 1A.

As a result, a difference in potential of approximately 10 mV was detected by the oscilloscope as the output from the braided piezoelectric element 1A, confirming that a sufficiently large electrical signal can be detected by deformation of the braided piezoelectric element 1A.

With this circular knitted fabric 1 as well, the core and shield wire did not short circuit, and a signal corresponding to the deformation could be detected.

Example 3-2

Using the conductive fiber B in the braided piezoelectric element 1B as a signal wire, an oscilloscope (Digital Oscilloscope DL6000 Series "DL6000", trade name of Yokogawa Electric Corp.) was connected through the wire via a 100-fold amplification circuit, and the conductive layer 204 of the braided piezoelectric element 1B was grounded (earthed). Twisting deformation was applied to the braided piezoelectric element 1B.

As a result, a difference in potential of approximately 10 mV was detected by the oscilloscope as the output from the braided piezoelectric element 1B, confirming that a sufficiently large electrical signal can be detected by deformation of the braided piezoelectric element 1B.

With this circular knitted fabric 2 as well, the core and shield wire did not short circuit, and a signal corresponding to the deformation could be detected.

Comparative Example 3-1

Using the conductive fiber B in the braided piezoelectric element 1C as a signal wire, an oscilloscope (Digital Oscilloscope DL6000 Series "DL6000", trade name of Yokogawa Electric Corp.) was connected through the wire via a 100-fold amplification circuit, and the conductive layer 204 of the braided piezoelectric element 1C was grounded (earthed). Twisting deformation was applied to the braided piezoelectric element 1C.

As a result, a difference in potential of approximately 10 mV was detected by the oscilloscope as the output from the braided piezoelectric element 1C, confirming that a sufficiently large electrical signal can be detected by deformation of the braided piezoelectric element 1C.

With this circular knitted fabric 3, however, the core and shield wire short circuited, and a signal corresponding to the deformation could not be detected.

Example 4

A fabric-like piezoelectric element according to the third invention was produced by the following method.

(Braided Piezoelectric Element)

A braided piezoelectric element was fabricated having conductive fiber CF1 as the core thread and with piezoelectric fibers PF1 wound in a helical manner in the Z-twisting direction around the core thread, as shown in FIG. 10, by setting the piezoelectric fibers PF1 on 4 carriers in the Z-twisting direction and setting insulating fibers IF1 on 4 carriers in the S-twisting direction, of the 8 carriers of an 8-strand round braid braiding machine. Next, using the braided piezoelectric element as core thread, braided piezoelectric element 201, having the braided piezoelectric element covered by a conductive layer made of conductive fibers, was fabricated by setting the conductive fibers CF2 on all of the 4 carriers in the Z-twisting direction and 4 carriers in the S-twisting direction, of the 8 carriers of the braider.
(Weaving)

Example 4-1

Tubular sections were formed at 5 locations parallel to the warp thread between layers of double-woven tape (16 mm width, 0.3 mm thickness) formed with polyester spun yarn, and a braided piezoelectric element 201 was set and woven into each tube to form a fabric-like piezoelectric element. The tubular sections were constructed with sixteen 84 dTex warp threads (sum of the two layers), and the sections other than the tubular sections were constructed with 167 dTex warp thread. The weft thread used was 84 dTex yarn. Two 167 dTex warp threads (one for each layer) were inserted between five braided piezoelectric elements. The pull-out strength and coverage factor of the center braided piezoelectric element 201 of the fabric-like piezoelectric element were measured, and the signal strength in a bending test and the outer appearance of the outer conductive layer of the braided piezoelectric element after the bending test were confirmed. The results are shown in Table 4.

Example 4-2

A fabric-like piezoelectric element was fabricated, which was woven using braided piezoelectric element 201 for part of the warp thread of a plain woven fabric formed using polyester yarn (330 dTex/72 filament) as the warp thread and weft thread. The plain woven fabric had a higher warp density than weft density, and virtually no gaps between the warp threads. The pull-out strength and coverage factor of the braided piezoelectric element 201 in the fabric-like piezoelectric element were measured, and the signal strength in a bending test and the outer appearance of the outer conductive layer of the braided piezoelectric element after the bending test were confirmed. The results are shown in Table 4.

Example 4-3

A fabric-like piezoelectric element was fabricated, that was woven using braided piezoelectric element 201 as part of the weft thread of a plain woven fabric that was woven using polyester spun yarn for the warp thread and weft thread, similar to Example 4-2. The pull-out strength and coverage factor of the braided piezoelectric element 201 in the fabric-like piezoelectric element were measured, and the signal strength in a bending test and the outer appearance of the outer conductive layer of the braided piezoelectric element after the bending test were confirmed. The results are shown in Table 4.

Example 4-4

A fabric-like piezoelectric element was fabricated by placing the braided piezoelectric element 201 on the plain woven fabric woven in Example 4-2, and forming a zigzag knit (2 mm width, 1 mm pitch) of polyester spun sewing yarn at a yarn count of 60, straddling the braided piezoelectric element 201, to anchor the braided piezoelectric element to the plain woven fabric. The pull-out strength and coverage factor of the braided piezoelectric element 201 in the fabric-like piezoelectric element were measured, and the signal strength in a bending test and the outer appearance of the outer conductive layer of the braided piezoelectric element after the bending test were confirmed. The results are shown in Table 4.

Comparative Example 4-1

A fabric-like piezoelectric element was fabricated in the same manner as Example 4-4, except that the width of the zigzag knit with the polyester spun sewing yarn was changed to 4 mm, and the pitch was changed to 2 mm. The pull-out strength and coverage factor of the braided piezoelectric element 201 in the fabric-like piezoelectric element were measured, and the signal strength in a bending test and the outer appearance of the outer conductive layer of the braided piezoelectric element after the bending test were confirmed. The results are shown in Table 4.

TABLE 4

|  | Element | Anchoring method | Evaluation | | | | |
| --- | --- | --- | --- | --- | --- | --- | --- |
|  |  |  | Pull-out strength [N] | Coverage factor (front) | Coverage factor (back) | Bending test signal strength [pA] | Outer appearance of braided piezoelectric element |
| Example 4-1 | Braided piezoelectric element 201 | Inserted between layers of double-woven fabric | 0.46 | 100% | 100% | 651 | Highly acceptable |
| Example 4-2 | Braided piezoelectric element 201 | Used as warp thread of plain woven fabric | 1.27 | 54% | 52% | 523 | Acceptable |
| Example 4-3 | Braided piezoelectric element 201 | Used as weft thread of plain woven fabric | 1.17 | 77% | 73% | 506 | Highly acceptable |
| Example 4-4 | Braided piezoelectric element 201 | Sewn into plain woven fabric by zigzag stitch (2 mm width, 1 mm pitch) | 0.74 | 52% | 100% | 394 | Acceptable |
| Comp. Example 4-1 | Braided piezoelectric element 201 | Sewn into plain woven fabric by zigzag stitch (4 mm width, 2 mm pitch) | 0.05 | 25% | 100% | 40 | Unacceptable |

Based on the results in Table 4, it is seen that in Examples 4-1 to 4-4, which had pull-out strengths of 0.1 N or greater per 5 cm, a strong signal was observed in the bending test, while in Comparative Example 4-1 which had a pull-out strength of less than 0.1 N, only a weak signal was observed in the bending test, and therefore the fabric-like piezoelectric elements of Examples 4-1 to 4-4 exhibited excellent performance as sensors. In addition, in Examples 4-1 to 4-4 which had coverage factors exceeding 30% on both the front and back sides, degradation of the conductive layers of the braided piezoelectric elements after the bending test was minimal compared to Comparative Example 4-1, indicating that they have superior durability as fabric-type sensors.

REFERENCE SIGNS LIST

1 Piezoelectric structure
1-1 Circular tubular piezoelectric structure
1-2 Circular columnar piezoelectric structure
2 Piezoelectric polymer
OL Orientation direction
HP Helical pitch
A Piezoelectric fiber
B Conductive fiber
101, 201 Braided piezoelectric element
102, 202 Sheath
103, 203 Core
107, 207 Fabric-like piezoelectric element
108, 208 Fabric
109, 209 Insulating fiber
110, 210 Conductive fiber
111 Device
112 Piezoelectric element
113 Amplification means
114 Output means
115 Transmission means
204 Conductive layer
205 Conductive substance
206 Conductive fiber
208a Center plane of fabric
X Maximum circle consisting entirely of core fiber bundles
Y Minimum circle Y fully encompassing core fiber bundles
X' Maximum circle consisting entirely of piezoelectric fiber bundles including core
Y' Minimum circle fully encompassing piezoelectric fiber bundles
CL Central axis or fiber axis
α Coiling angle

The invention claimed is:

1. A structure comprising an oriented piezoelectric polymer arranged in a circular tubular or circular columnar shape, wherein the orientation angle of the piezoelectric polymer with respect to the direction of the central axis of the circular tubular or circular columnar shape in which the piezoelectric polymer is arranged is between 15° and 75°, the piezoelectric polymer includes as the main component a crystalline polymer having an absolute value of between 0.1 pC/N and 1000 pC/N for the piezoelectric constant d14, when the orientation axis is the third axis, and the piezoelectric polymer includes a P-body containing a crystalline polymer with a positive piezoelectric constant d14 value as the main component and an N-body containing a crystalline polymer with a negative value as the main component, wherein for the portion of the central axis of the structure having a length of 1 cm, the value of T1/T2 is between 0 and 0.8, T1 being the smaller and T2 being the larger of (ZP+SN) and (SP+ZN), where ZP is the mass of the P-body having the orientation axis wrapped in a helical fashion around the Z-twisting direction, SP is the mass of the P-body having the orientation axis wrapped in a helical fashion around the S-twisting direction, ZN is the mass of the N-body having the orientation axis wrapped in a helical fashion around the Z-twisting direction, and SN is the mass of the N-body having the orientation axis wrapped in a helical fashion around the S-twisting direction.

2. The structure according to claim 1, wherein the piezoelectric polymer includes poly-L-lactic acid or poly-D-lactic acid as the main component.

3. The structure according to claim 2, wherein the piezoelectric polymer includes a P-body including poly-D-lactic acid as the main component, and an N-body including poly-L-lactic acid as the main component.

4. The structure according to claim 1, wherein when stretching deformation is applied in the direction of the central axis of the circular tubular or circular columnar shape in which the piezoelectric polymer is arranged, electrical charges of opposite polarity are generated on the central axis side and the outside of the circular tubular or circular columnar shape.

5. The structure according to claim 1, wherein the piezoelectric polymer comprises a fiber-like, filament-like or tape-like form composed in a braided, twisted-string, covering-thread or aligned thread-like manner.

6. The structure according to claim 1, wherein the piezoelectric polymer is composed only of a single closed region in the cross-section perpendicular to the central axis of the circular tubular or circular columnar shape.

7. An element comprising a structure according to claim 1, and a conductor disposed adjacent to the structure.

8. The element according to claim 7, wherein the piezoelectric polymer is arranged in a circular tubular shape, and the conductor is disposed at a location on the central axis of the circular tubular shape.

9. The element according to claim 8, wherein the conductor is made of conductive fiber, and the piezoelectric polymer is arranged in a manner braided around the conductive fiber, as piezoelectric fibers.

10. The element according to claim 7, wherein the conductor is disposed on the outside of the circular tubular or circular columnar shape in which the piezoelectric polymer is arranged.

11. The element according to claim 10, wherein the conductor is made of conductive fiber, and the conductive fiber is arranged in a manner braided around the circular tubular or circular columnar shape in which the piezoelectric polymer is arranged.

12. A sensor comprising:
an element according to claim 7,
an output terminal through which an electrical signal generated by the conductor is outputted corresponding to the electrical charge generated when stretching deformation is applied in the direction of the central axis of the circular tubular or circular columnar shape in which the piezoelectric polymer is arranged, and
an electrical circuit that detects the electrical signal outputted through the output terminal.

13. A braided piezoelectric element comprising:
an element according to claim 9 provided with a core formed of a conductive fiber and a sheath formed of braided piezoelectric fibers covering the core, and
a conductive layer provided around the periphery of the sheath, wherein the ratio d/Rc of the thickness d of the layer composed of the piezoelectric fibers with respect to the radius Rc of the core is 1.0 or greater.

14. The braided piezoelectric element according to claim 13, wherein the coverage factor of the sheath by the conductive layer is 25% or greater.

15. The braided piezoelectric element according to claim 13, wherein the conductive layer is formed of fibers.

16. A fabric-like piezoelectric element including a braided piezoelectric element according to claim 13.

17. The fabric-like piezoelectric element according to claim 16, wherein the fabric further includes conductive fibers that cross and contact with at least part of the braided piezoelectric element.

18. The fabric-like piezoelectric element according to claim 17, wherein among the fibers forming the fabric and crossing the braided piezoelectric element, at least 30% are conductive fibers.

19. A device comprising:
a braided piezoelectric element according to claim 13,
amplification means that amplifies an electrical signal outputted from the braided piezoelectric element in response to applied pressure, and
output means that outputs the electrical signal amplified by the amplification means.

20. A device comprising:
a fabric-like piezoelectric element according to claim 17,
amplification means that amplifies an electrical signal outputted from the fabric-like piezoelectric element in response to applied pressure, and
output means that outputs the electrical signal amplified by the amplification means.

21. A fabric-like piezoelectric element comprising a fabric and a braided piezoelectric element anchored to the fabric, wherein the braided piezoelectric element comprises:
an element according to claim 9 provided with a core formed of a conductive fiber and a sheath formed of braided piezoelectric fibers covering the core, and
a conductive layer provided around the periphery of the sheath,
wherein the pull-out strength per 5 cm of the braided piezoelectric element with respect to the fabric is 0.1 N or greater.

22. The fabric-like piezoelectric element according to claim 21, wherein the coverage factor of the braided piezoelectric element by the fibers composing the fabric is greater than 30% on both sides of the fabric.

23. The fabric-like piezoelectric element according to claim 21, wherein the braided piezoelectric element is anchored to the fabric in a woven state or a knitted state.

24. The fabric-like piezoelectric element according to claim 21, wherein the braided piezoelectric element is inserted between the layers of a double-woven fabric or double-knitted fabric.

25. The fabric-like piezoelectric element according to claim 21, wherein the braided piezoelectric element is partially exposed through the fabric, and the conductive fibers and/or conductive layer of the braided piezoelectric element are electrically connected with another member at the exposed sections.

26. The fabric-like piezoelectric element according to claim 21, wherein the coverage factor of the sheath by the conductive layer is 25% or greater.

27. The fabric-like piezoelectric element according to claim 21, wherein the conductive layer is formed of fibers.

28. The fabric-like piezoelectric element according to claim 21, wherein the total fineness of the piezoelectric fibers is at least 1 and no greater than 20 times the total fineness of the conductive fibers.

29. The fabric-like piezoelectric element according to claim 21, wherein the fineness per piezoelectric fiber is at least 1/20 and no greater than 2 times the total fineness of the conductive fibers.

30. The fabric-like piezoelectric element according to claim 21, wherein the fabric further includes conductive fibers that cross and contact with at least part of the braided piezoelectric element.

31. A device comprising:
a fabric-like piezoelectric element according claim 21, and
an electrical circuit that detects the electrical signal outputted from the conductive fibers in the fabric-like piezoelectric element in response to applied pressure.

* * * * *